(12) United States Patent
Koezuka et al.

(10) Patent No.: US 10,008,609 B2
(45) Date of Patent: Jun. 26, 2018

(54) SEMICONDUCTOR DEVICE, METHOD FOR MANUFACTURING THE SAME, OR DISPLAY DEVICE INCLUDING THE SAME

(71) Applicant: SEMICONDUCTOR ENERGY LABORATORY CO., LTD., Atsugi-shi, Kanagawa-ken (JP)

(72) Inventors: Junichi Koezuka, Tochigi (JP); Kenichi Okazaki, Tochigi (JP); Masami Jintyou, Tochigi (JP); Daisuke Kurosaki, Tochigi (JP); Takahiro Iguchi, Tochigi (JP); Naoto Goto, Tochigi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 77 days.

(21) Appl. No.: 15/070,306

(22) Filed: Mar. 15, 2016

(65) Prior Publication Data

US 2016/0276486 A1 Sep. 22, 2016

(30) Foreign Application Priority Data

Mar. 17, 2015 (JP) .................. 2015-052912
Mar. 26, 2015 (JP) .................. 2015-065103

(51) Int. Cl.
*H01L 29/10* (2006.01)
*H01L 29/786* (2006.01)
(Continued)

(52) U.S. Cl.
CPC ........ *H01L 29/7869* (2013.01); *H01L 29/045* (2013.01); *H01L 29/24* (2013.01);
(Continued)

(58) Field of Classification Search
CPC ...................................... H01L 29/10
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.
(Continued)

*Primary Examiner* — Marvin Payen
(74) *Attorney, Agent, or Firm* — Nixon Peabody LLP; Jeffrey L. Costellia

(57) ABSTRACT

To suppress a change in electrical characteristics and improve reliability in a transistor including an oxide semiconductor film. Provided is a semiconductor device including a transistor including a first gate electrode, a first insulating film over the first gate electrode, a first oxide semiconductor film over the first insulating film, a source electrode electrically connected to the first oxide semiconductor film, a drain electrode electrically connected to the first oxide semiconductor film, a second insulating film over the first oxide semiconductor film, a second oxide semiconductor film as a second gate electrode over the second insulating film, and a third insulating film over the second oxide semiconductor film. The second insulating film includes an excess oxygen region having a concentration gradient.

20 Claims, 76 Drawing Sheets

US 10,008,609 B2

Page 2

(51) Int. Cl.
*H01L 29/24* (2006.01)
*H01L 29/49* (2006.01)
*H01L 29/04* (2006.01)

(52) U.S. Cl.
CPC ...... *H01L 29/4908* (2013.01); *H01L 29/4966* (2013.01); *H01L 29/78648* (2013.01); *H01L 29/78696* (2013.01)

(58) Field of Classification Search
USPC ..................................................... 257/40–43
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,551,824 | B2 | 10/2013 | Yamazaki et al. |
| 8,823,092 | B2 | 9/2014 | Yamazaki |
| 8,969,182 | B2 | 3/2015 | Koezuka et al. |
| 9,171,957 | B2 | 10/2015 | Yamazaki et al. |
| 9,202,927 | B2 | 12/2015 | Yamazaki |
| 9,263,589 | B2 | 2/2016 | Endo et al. |
| 9,595,435 | B2 | 3/2017 | Tsubuku et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0320458 | A1 | 12/2010 | Umeda et al. |
| 2010/0320459 | A1 | 12/2010 | Umeda et al. |
| 2011/0193083 | A1 | 8/2011 | Kim et al. |
| 2011/0215328 | A1 | 9/2011 | Morosawa et al. |
| 2011/0284844 | A1 | 11/2011 | Endo et al. |
| 2012/0119205 | A1 | 5/2012 | Taniguchi et al. |
| 2013/0277672 | A1 | 10/2013 | Sano et al. |
| 2013/0334533 | A1* | 12/2013 | Yamazaki ........... H01L 29/7869 257/57 |
| 2014/0004656 | A1* | 1/2014 | Sasagawa ......... H01L 29/66969 438/104 |
| 2014/0038351 | A1 | 2/2014 | Yamazaki et al. |
| 2015/0243738 | A1 | 8/2015 | Shimomura et al. |
| 2015/0303309 | A1 | 10/2015 | Koezuka et al. |
| 2015/0333088 | A1 | 11/2015 | Yamazaki et al. |
| 2016/0013298 | A1 | 1/2016 | Yamazaki et al. |
| 2016/0020329 | A1 | 1/2016 | Koezuka et al. |
| 2016/0260837 | A1 | 9/2016 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-009836 | 1/2012 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 25, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5Δ) Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kyung Min Kim et al., "Roll-to-Roll Processed and Top-Gate-Structured Amorphous InGaZnO TFTs with Large Source/Drain Offsets" SID 2014 Digest, Late-News Paper 13.3L.

Ho-young et al., "Coplanar amorphous—indium—gallium—zinc—oxide thin film transistor with He plasma treated heavily doped layer,", Applied Physics Letters, 104, 022115 (2014).

* cited by examiner

FIG. 25A
FIG. 25B
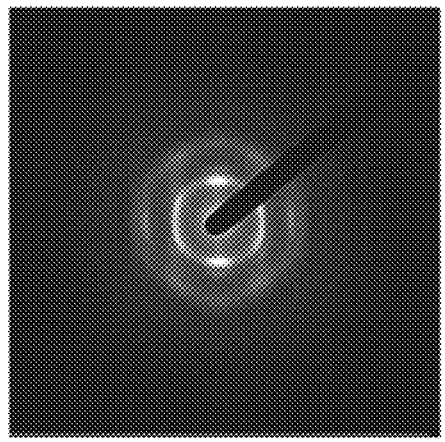
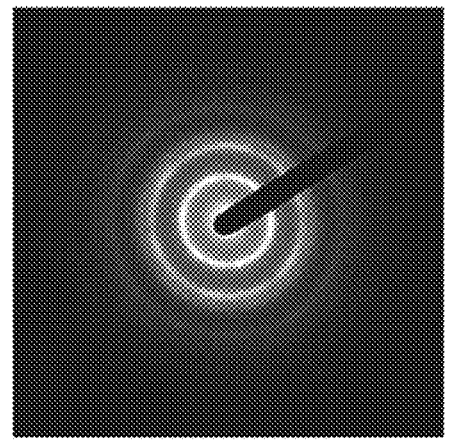

crystal structure of InMZnO$_4$

 In
 Gd
 Zn
 O
 Bonding position

FIG. 63

| CAAC-OS | | LTPS | | a-Si:H | |
|---|---|---|---|---|---|
| | | ⑪ | form a pixel electrode | | |
| | | ⑩ | form an insulating film | | |
| | | ⑨ | form a common electrode | | |
| | | ⑧ | form planarization layer | | |
| | | ⑦ | form S/D electrodes | | |
| | | ⑥ | GI+opening to interlayer insulating film | | |
| | | | form interlayer insulating film | | |
| | | | thermal activation | | |
| ⑧ | form pixel electrode | ⑤ | p+ doping (ID) | | |
| ⑦ | form insulating film | | n− doping of entire surface (ID) | ⑧ | form pixel electrode |
| ⑥ | form common electrode | ④ | n+ doping (ID) | ⑦ | form insulating film |
| ⑤ | contact opening | ③ | form gate electrode | ⑥ | form common electrode |
| | form a passivation film | | form GI | ⑤ | form S/D electrodes |
| ④ | form S/D electrodes | ② | p-Si into an island shape | ④ | form electrode of capacitor |
| ③ | contact opening | | laser crystallization | ③ | contact opening |
| ② | form OS | | form Si | ② | form active layer |
| | form GI | | form base film | | form GI |
| ① | form gate electrode | ① | form light-blocking film | ① | form gate electrode |
| a total of 8 masks | | a total of 11 masks | | a total of 8 masks | |

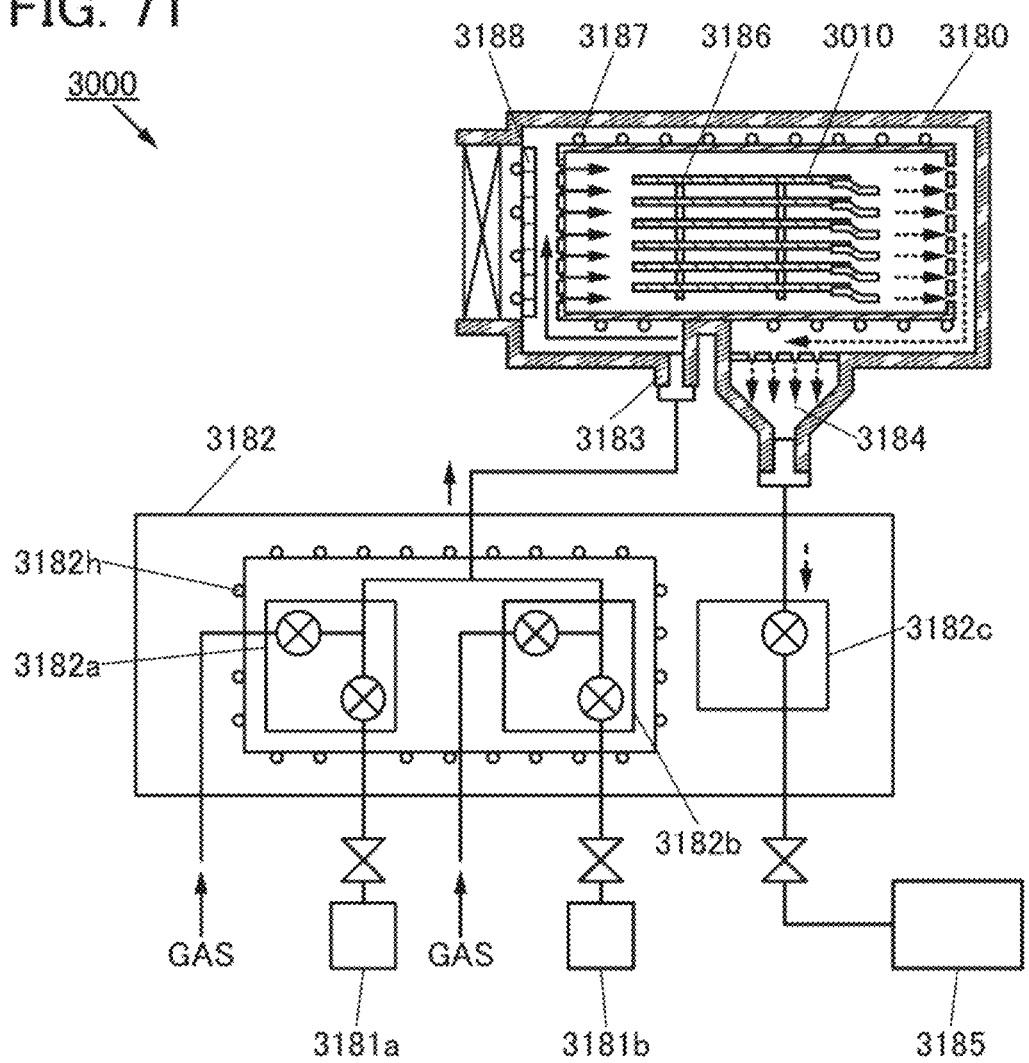

SEMICONDUCTOR DEVICE, METHOD FOR MANUFACTURING THE SAME, OR DISPLAY DEVICE INCLUDING THE SAME

BACKGROUND OF THE INVENTION

1. Field of the Invention

One embodiment of the present invention relates to a semiconductor device including an oxide semiconductor film and a display device including the semiconductor device. Another embodiment of the present invention relates to a manufacturing method of the semiconductor device including an oxide semiconductor film.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A semiconductor device including, as a base insulating film of an oxide semiconductor film where a channel region is formed, an insulating film that releases oxygen by heating to reduce oxygen vacancy in the oxide semiconductor film is disclosed, for example (e.g., Patent Document 1).

REFERENCE

Patent Document

[Patent Document 1] Japanese Published Patent Application No. 2012-9836

SUMMARY OF THE INVENTION

In the case where a transistor is manufactured using an oxide semiconductor film for a channel region, oxygen vacancy formed in the oxide semiconductor film adversely affects the transistor characteristics; therefore, the oxygen vacancy causes a problem. For example, oxygen vacancy formed in the oxide semiconductor film is bonded with hydrogen to serve as a carrier supply source. The carrier supply source generated in the oxide semiconductor film causes a change in the electrical characteristics, typically, shift in the threshold voltage, of the transistor including the oxide semiconductor film. Further, there is a problem in that electrical characteristics fluctuate among the transistors. Therefore, it is preferable that the amount of oxygen vacancy in the channel region of the oxide semiconductor film be as small as possible.

In view of the foregoing problems, an object of one embodiment of the present invention is to suppress a change in electrical characteristics and to improve reliability in a transistor including an oxide semiconductor film. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor including a first gate electrode, a first insulating film over the first gate electrode, a first oxide semiconductor film over the first insulating film, a source electrode electrically connected to the first oxide semiconductor film, a drain electrode electrically connected to the first oxide semiconductor film, a second insulating film over the first oxide semiconductor film, a second oxide semiconductor film as a second gate electrode over the second insulating film, and a third insulating film over the second oxide semiconductor film. The second insulating film includes an excess oxygen region having a concentration gradient.

In the above embodiment, the excess oxygen region preferably has a region in which the oxygen concentration increase toward a surface of the second insulating film.

In the above embodiment, it is preferable that the third insulating film include one of or both nitrogen and hydrogen.

In the above embodiment, it is preferable that the first oxide semiconductor film include In, M (M is Al, Ga, Y, or Sn) and Zn. In the above embodiment, it is preferable that the second oxide semiconductor film include In and M (M is Al, Ga, Y, or Sn). In the above embodiment, it is preferable that the first oxide semiconductor film have a multilayer structure. In the above embodiment, it is preferable that the first oxide semiconductor film include a crystal part and the crystal part have c-axis alignment.

In the above embodiment, it is preferable that the first gate electrode and the second gate electrode be electrically connected to each other.

Another embodiment of the present invention is a display device including the semiconductor device according to any one of the above embodiments, and a display element. Another embodiment of the present invention is a display module including the display device and a touch sensor. Another embodiment of the present invention is an electronic device including the semiconductor device according to any one of the above embodiments, the display device, or the display module; and an operation key or a battery.

With one embodiment of the present invention, a change in electrical characteristics can be suppressed and reliability can be improved in a transistor including an oxide semiconductor film. Alternatively, with one embodiment of the present invention, a semiconductor device with low power consumption can be provided. Alternatively, with one embodiment of the present invention, a novel semiconductor device can be provided. Alternatively, with one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 25A and 25B show electron diffraction patterns of a CAAC-OS.

FIG. 63 illustrates manufacturing processes of display devices using a horizontal electric field mode liquid crystal element.

FIG. 71 illustrates a structure of a deposition apparatus.

DETAILED DESCRIPTION OF THE INVENTION

Figure 1:
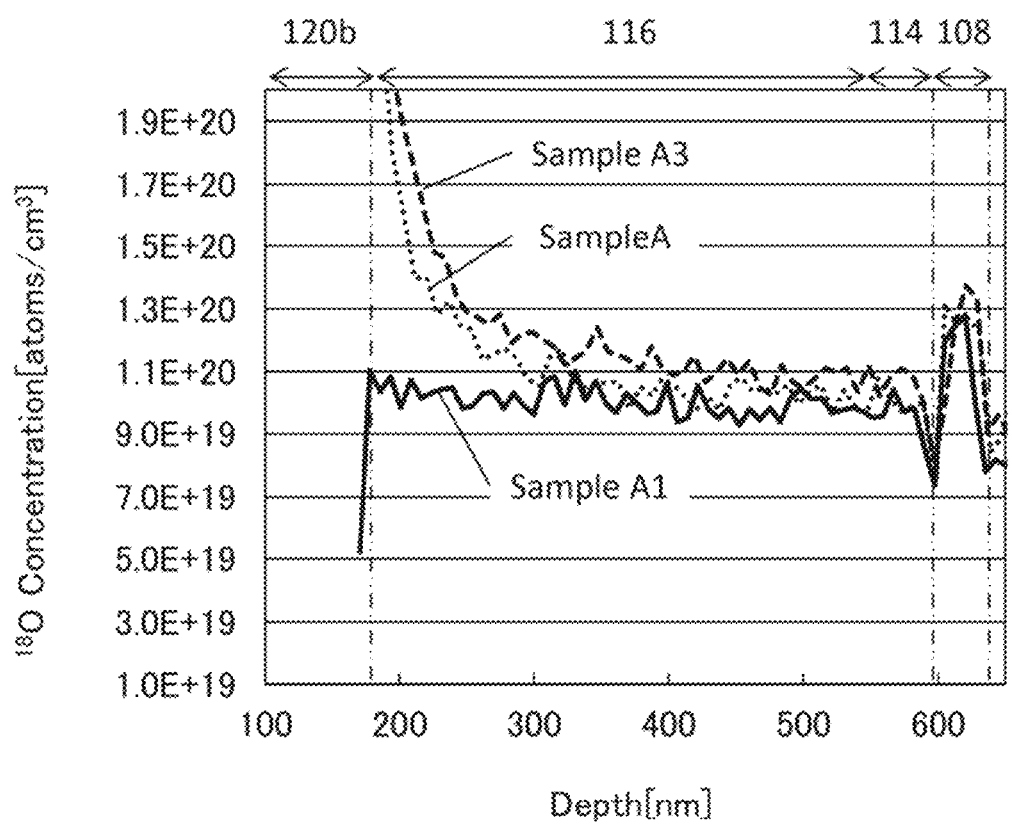
FIG. 1 shows SIMS measurement results.
Figure 2A:
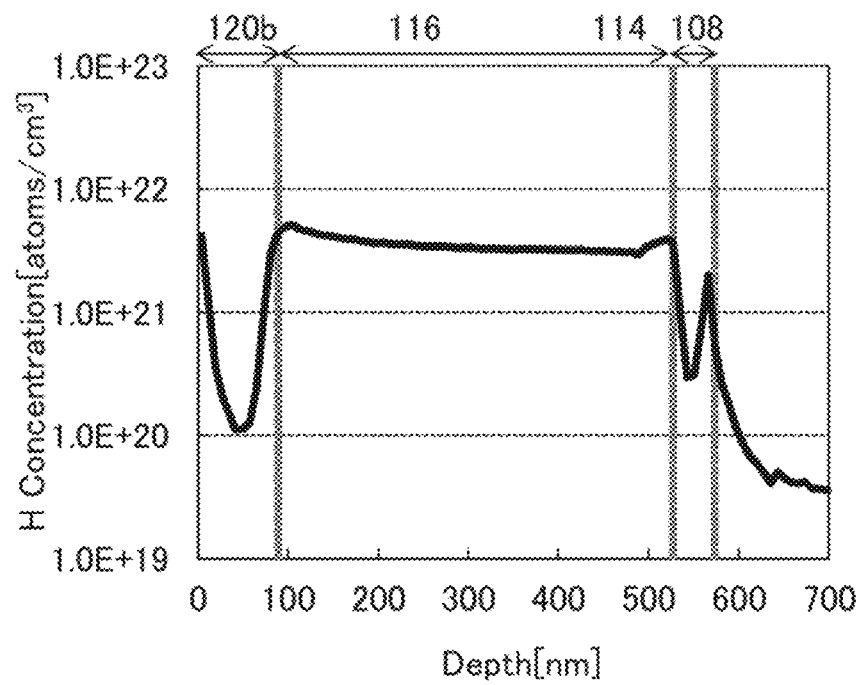
FIGS. 2A and 2B show SIMS measurement results.
Figure 2B:
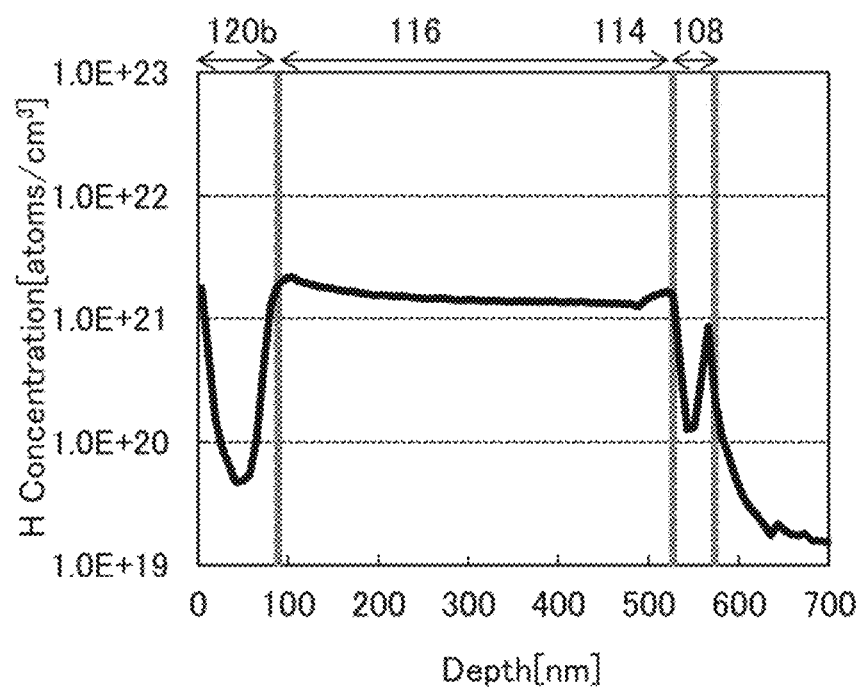
Figure 3A:
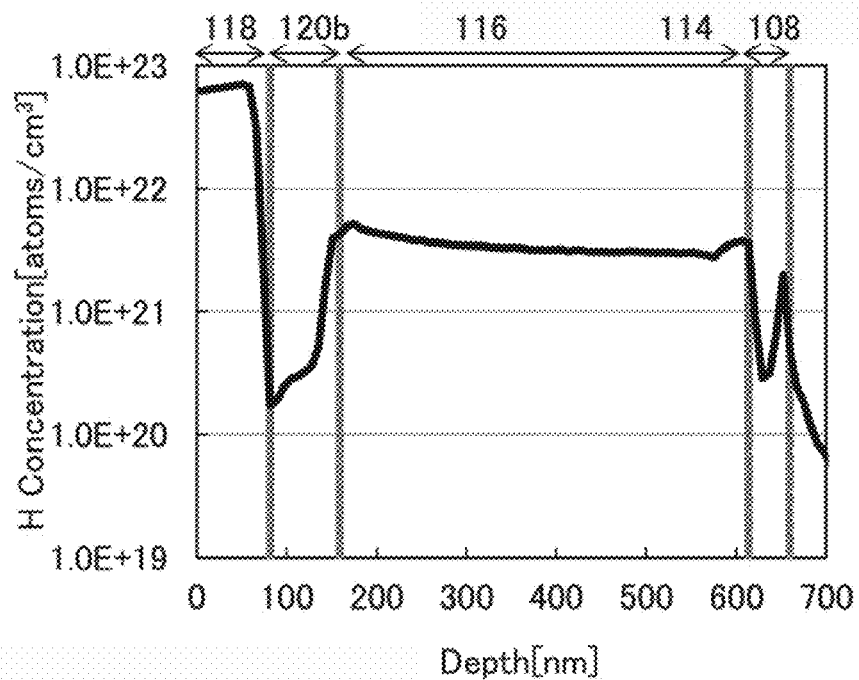
FIGS. 3A and 3B show SIMS measurement results.
Figure 3B:
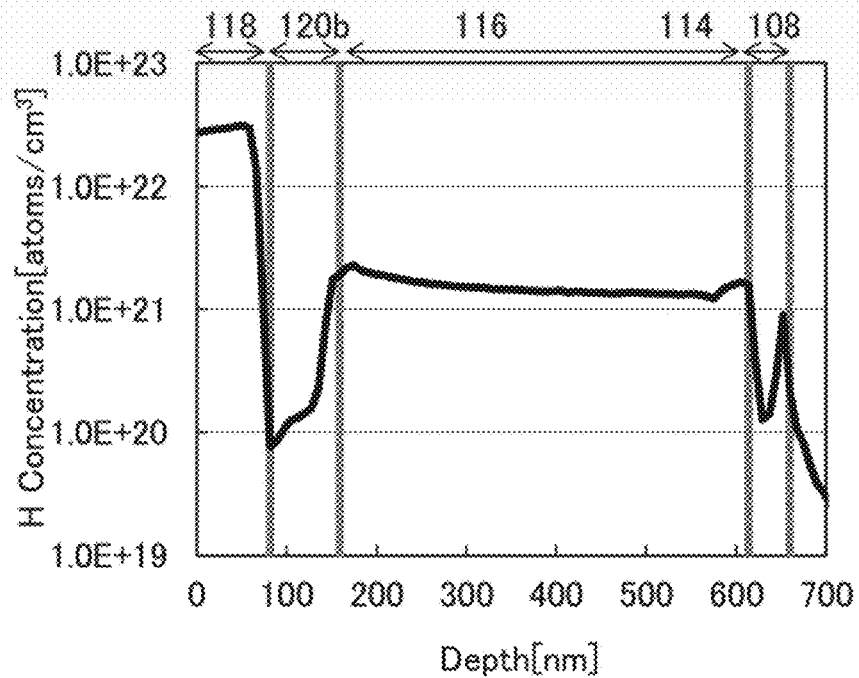

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In describing structures of the invention with reference to the drawings in this specification and the like, common reference numerals are used for the same portions in different drawings.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification and the like, the channel width is any one of values, the maximum value, the minimum value, or the average value in a region where a channel is formed.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

A voltage usually refers to a potential difference between a given potential and a reference potential (e.g., a source potential or a ground potential (GND)). Therefore, a voltage can also be referred to as potential.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. Furthermore, a silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a semiconductor device of one embodiment of the present invention and a method of manufacturing the semiconductor device are described with reference to FIG. 1, FIGS. 2A and 2B, FIGS. 3A and 3B, FIGS. 4A to 4C, FIGS. 5A to 5C, FIG. 6, FIGS. 7A to 7C, FIG. 8, FIGS. 9A to 9C, FIGS. 10A to 10C, FIGS. 11A to 11C, FIGS. 12A to 12D, FIGS. 13A and 13B, FIGS. 14A to 14D, FIGS. 15A to 15F, FIGS. 16A to 16F, FIGS. 17A to 17F, FIGS. 18A to 18F, and FIGS. 19A and 19B.

<1-1. Structural Example 1 of Semiconductor Device>

Figure 5A:
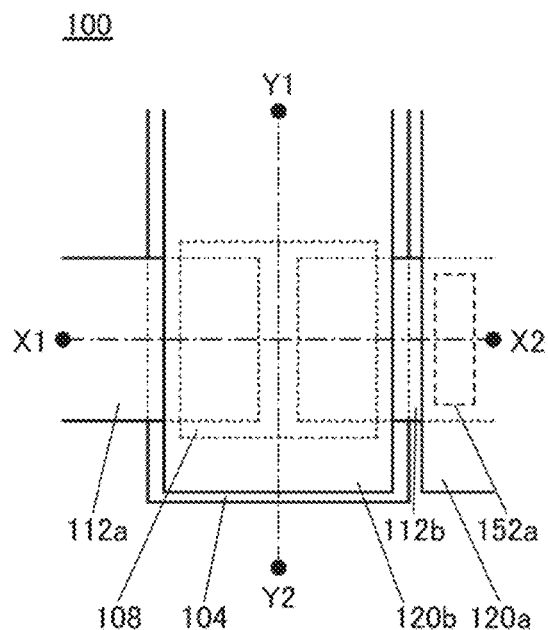
FIGS. 5A to 5C are a top view and cross-sectional views illustrating a semiconductor device.
Figure 5B:
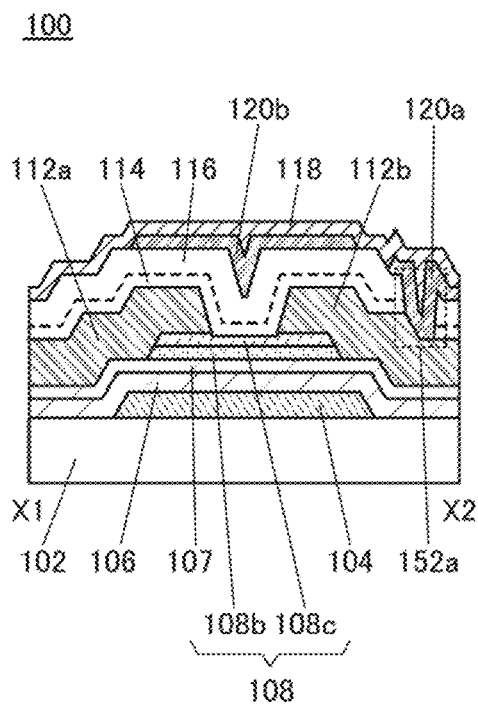
Figure 5C:
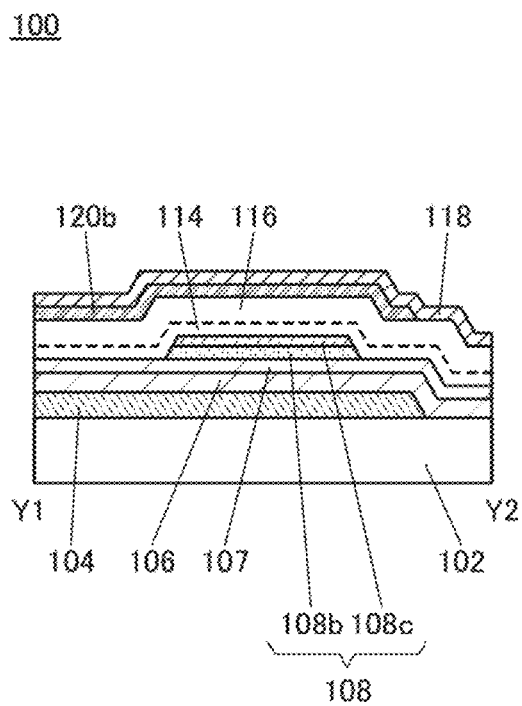

FIG. 5A is a top view of a transistor 100 that is a semiconductor device of one embodiment of the present invention. FIG. 5B is a cross-sectional view taken along the dashed-dotted line X1-X2 in FIG. 5A, and FIG. 5C is a cross-sectional view taken along the dashed-dotted line Y1-Y2 in FIG. 5A. Note that in FIG. 5A, some components of the transistor 100 (e.g., an insulating film functioning as a gate insulating film) are not illustrated to avoid complexity. Furthermore, the direction of the dashed-dotted line X1-X2 may be called a channel length direction, and the direction of the dashed-dotted line Y1-Y2 may be called a channel width direction. As in FIG. 5A, some components are not illustrated in some cases in top views of transistors described below.

The transistor 100 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, a conductive film 112b functioning as a drain electrode electrically connected to the oxide semiconductor film 108, insulating films 114 and 116 over the oxide semiconductor film 108 and the conductive films 112a and 112b, an oxide semiconductor film 120a over the insulating film 116 and electrically connected to the conductive film 112b, an oxide semiconductor film 120b over the insulating film 116, and an insulating film 118 over the insulating film 116 and the oxide semiconductor films 120a and 120b.

In the transistor 100, the insulating films 106 and 107 function as a first gate insulating film of the transistor 100, the insulating films 114 and 116 function as a second gate insulating film of the transistor 100, and the insulating film 118 functions as a protective insulating film of the transistor 100. Note that in this specification and the like, in some cases, the insulating films 106 and 107 are collectively referred to as a first insulating film, the insulating films 114 and 116 are collectively referred to as a second insulating film, and the insulating film 118 is referred to as a third insulating film. In the transistor 100, the oxide semiconductor film 120a functions as a pixel electrode of a display device, and the oxide semiconductor film 120b functions as a second gate electrode of the transistor 100.

The oxide semiconductor film 108 includes an oxide semiconductor film 108b on the conductive film 104 (functioning as a first gate electrode) side and an oxide semiconductor film 108c over the oxide semiconductor film 108b. One or both of the oxide semiconductor films 108b and 108c include In, M (M is Al, Ga, Y, or Sn), and Zn.

The oxide semiconductor film 108b is preferably formed using a material in which the atomic proportion of In is larger than the atomic proportion of M, for example. The oxide semiconductor film 108c is preferably formed using a material in which the atomic proportion of In is smaller than that in the oxide semiconductor film 108b.

The use of a material in which the atomic proportion of In is larger than that of M for the oxide semiconductor film 108b can increase the field-effect mobility (also simply referred to as mobility or $\mu$FE) of the transistor 100. Specifically, the field-effect mobility of the transistor 100 can exceed 10 cm²/Vs, preferably exceed 30 cm²/Vs.

For example, the use of the transistor with high field-effect mobility for a gate driver that generates a gate signal allows a semiconductor device or a display device to have a narrow frame. The use of the transistor with high field-effect mobility in a source driver (specifically, a demultiplexer connected to an output terminal of a shift register included in a source driver) that supplies a signal to a signal line included in a display device reduces the number of wirings connected to the display device.

On the other hand, the use of the material in which the atomic proportion of In is larger than that of M for the oxide semiconductor film 108b makes it easier to change electrical characteristics of the transistor 100 in light irradiation. However, in the semiconductor device of one embodiment of the present invention, the oxide semiconductor film 108c is formed over the oxide semiconductor film 108b. That is, the oxide semiconductor film 108 has a multilayer structure. Furthermore, the oxide semiconductor film 108c formed using a material in which the atomic proportion of In is smaller than the oxide semiconductor film 108b can have larger Eg than that of the oxide semiconductor film 108b. For this reason, the oxide semiconductor film 108 which is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which excess oxygen is included in insulating films in contact with the oxide semiconductor film 108, specifically, the insulating film 107 formed under the oxide semiconductor film 108 and the insulating films 114 and 116 formed over the oxide semiconductor film 108. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which excess oxygen is contained in the insulating film 107 and the insulating films 114 and 116 without increasing manufacturing steps or with an extremely small increase in manufacturing step. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the oxide semiconductor films 120a and 120b, the oxide semiconductor films 120a and 120b are formed by a sputtering method in an atmosphere containing an oxygen gas, whereby oxygen or excess oxygen is added to the insulating film 116 over which the oxide semiconductor films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<1-2. Oxygen Added to Insulating Film>

Here, Samples A1 to A3 to be described below were formed to examine oxygen added to an insulating film. Oxygen added to an insulating film is described with reference to FIG. 1, FIGS. 2A and 2B, FIGS. 3A and 3B, and FIGS. 4A to 4C.

[Structures of Samples A1 to A3]

Figure 4A:
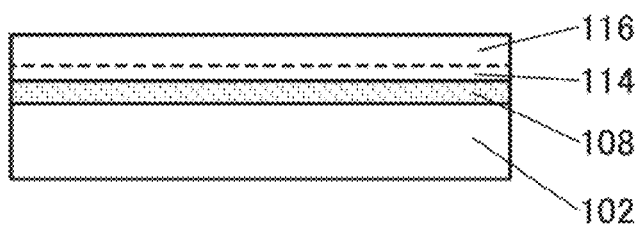
FIGS. 4A to 4C are cross-sectional views illustrating samples for SIMS measurement.
Figure 4B:
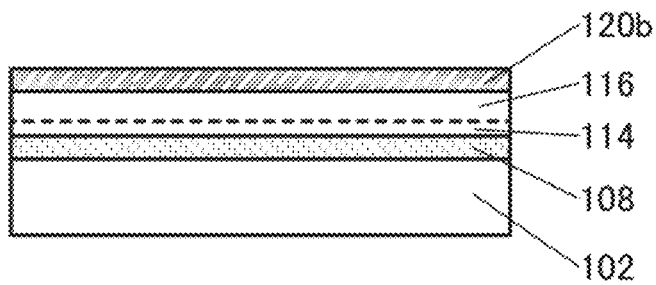
Figure 4C:
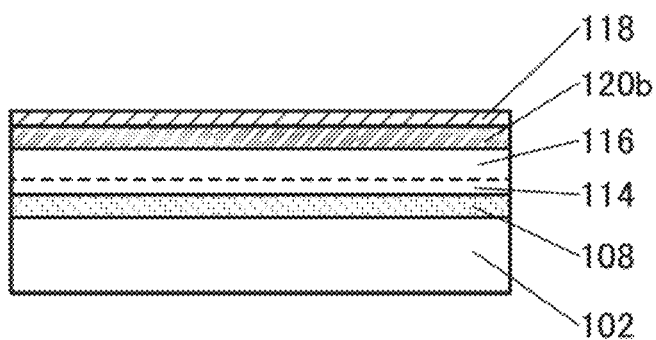

First, the structures of Samples A1 to A3 are described. FIG. 4A is a schematic cross-sectional view illustrating the structure of Sample A1. FIG. 4B is a schematic cross-sectional view illustrating the structure of Sample A2. FIG. 4C is a schematic cross-sectional view illustrating the structure of Sample A3.

Sample A1 shown in FIG. 4A includes the substrate 102, the oxide semiconductor film 108 over the substrate 102, and the insulating films 114 and 116 over the oxide semiconductor film 108. Sample A2 shown in FIG. 4B includes the substrate 102, the oxide semiconductor film 108 over the substrate 102, the insulating films 114 and 116 over the oxide semiconductor film 108, and the oxide semiconductor film 120b over the insulating film 116. Sample A3 shown in FIG. 4C includes the substrate 102, the oxide semiconductor film 108 over the substrate 102, the insulating films 114 and 116 over the oxide semiconductor film 108, the oxide semiconductor film 120b over the insulating film 116, and the insulating film 118 over the oxide semiconductor film 120b.

Note that in the schematic cross-sectional views shown in FIGS. 4A to 4C, components having functions similar to those of the components included in the transistor 100 shown in FIGS. 5A to 5C are indicated by common reference numerals and common hatching patterns.

[Formation Method of Sample A1]

A method for forming Sample A1 is described. First, the oxide semiconductor film 108 was formed over the substrate 102. Note that the oxide semiconductor film 108 was formed with a sputtering apparatus. An argon gas at a flow rate of 100 sccm and an oxygen gas at a flow rate of 100 sccm were introduced into a chamber of the sputtering apparatus, and an electric power of 2.5 kW was supplied to a metal oxide sputtering target of In:Ga:Zn=1:1:1.2 [atomic %] placed in the chamber of the sputtering apparatus; thus, the oxide semiconductor film 108 was formed. Note that an AC power source was used as a power source that supplies power to the metal oxide sputtering target. Note that the thickness of the oxide semiconductor film 108 was 35 nm.

Then, the insulating films 114 and 116 were formed over the oxide semiconductor film 108. As the insulating film 114, a 50-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in vacuum with a PECVD apparatus.

The insulating film 114 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Next, heat treatment was performed. The heat treatment was performed at 350° C. in a nitrogen gas atmosphere for 1 hour.

Through the above process, Sample A1 was formed.
[Formation Method of Sample A2]

To form Sample A2, the oxide semiconductor film 108 and the insulating films 114 and 116 were formed over the substrate 102, and heat treatment was performed. Note that the formation method up to the heat treatment is similar to that of Sample A1.

Then, the oxide semiconductor film 120b was formed over the insulating film 116. As the oxide semiconductor films film 120b, a 100-nm-thick In—Ga—Zn oxide film (hereinafter referred to as IGZO film) was formed under the conditions where the substrate temperature was 170° C., an oxygen gas ($^{18}$O) at a flow rate of 200 sccm was introduced into a chamber, the pressure was 0.6 Pa, and an AC power of 2500 W was applied to a polycrystalline metal oxide sputtering target (having an atomic ratio of In:Ga:Zn=4:2:4.1).

Through the above process, Sample A2 was formed.
[Formation Method of Sample A3]

To form Sample A3, the oxide semiconductor film 108 and the insulating films 114 and 116 were formed over the substrate 102, heat treatment was performed, and then, the oxide semiconductor film 120b was formed over the insulating film 116. Note that up to the formation of the oxide semiconductor film 120b, the formation method is similar to that of Sample A2.

Then, the insulating film 118 was formed over the oxide semiconductor films 120b. As the insulating film 118, a 100-nm-thick silicon nitride film was formed with a PECVD apparatus. The insulating film 118 was deposited under the conditions where the substrate temperature was 350° C., a silane gas at a flow rate of 50 sccm, a nitrogen gas at a flow rate of 5000 sccm, and an ammonia gas at a flow rate of 100 sccm were introduced into a chamber, the pressure was 100 Pa, and high-frequency power of 1000 W was supplied between parallel-plate electrodes provided in a PECVD apparatus with the use of a 27.12 MHz high-frequency power source.

Through the above process, Sample A3 was formed.
<1-3. Oxygen Concentration in Insulating Film Measured by Secondary Ion Mass Spectrometry (SIMS)>

Samples A1 to A3 were subjected to SIMS analysis. Note that an element to be analyzed by SIMS was $^{18}$O. As the SIMS analysis, quantification in a silicon oxide film ($SiO_2$) was performed.

FIG. 1 shows SIMS analysis results. In FIG. 1, the vertical axis and the horizontal axis indicate the $^{18}$O concentration and the depth, respectively. On the horizontal axis, the vicinity of the surface of the oxide semiconductor film 120b is at a depth of 100 nm. Note that in FIG. 1, the bold solid line, the thin dashed line, and the thick dashed line indicate the measurement results of Samples A1, A2, and A3, respectively. The concentration of $^{18}$O in the insulating films 114 and 116 (silicon oxide films) is the concentration obtained according to the natural abundance of $^{18}$O (0.2%) contained in the silicon oxide films. For the SIMS analysis, substrate side depth profile secondary ion mass spectrometry (what is called SSDP-SIMS) in which analysis is performed from the glass substrate 102 side is used.

As shown in FIG. 1, in Samples A2 and A3 each including the oxide semiconductor film 120b, the insulating films 114 and 116 have a concentration gradient of $^{18}$O. Specifically, the profile of the concentration gradient has a region where the oxygen concentration increases toward a surface of the insulating film 116. In other words, when the oxygen concentration profile is seen from the oxide semiconductor film 120b side, the profile has the following regions: a region with a high oxygen concentration in the vicinity of the surface of the insulating film 116; a region where the oxygen concentration decreases toward the insulating film 114; and a region with a high oxygen concentration in the oxide semiconductor film 108 and its vicinity. That is, the concentration gradient of oxygen has a U shape.

When the concentration gradient of oxygen has the above-described shape, oxygen can be favorably added to the oxide semiconductor film 108. Moreover, oxygen vacancies in the oxide semiconductor film 108 can be filled with excess oxygen, whereby a highly reliable semiconductor device can be provided.
<1-4. Hydrogen Concentration in Insulating Film and Oxide Semiconductor Film Measured by SIMS>

Next, the hydrogen concentration in the insulating films 114 and 116 and the oxide semiconductor films 108 and 120b in Sample A2 was analyzed by SIMS. Note that an element to be analyzed by SIMS was H. As the SIMS analysis, quantification in the IGZO film and quantification in the silicon oxide film ($SiO_2$) were performed.

FIGS. 2A and 2B and FIGS. 3A and 3B show the SIMS analysis results. Note that the SIMS analysis results of Sample A2 are shown in each of FIGS. 2A and 2B, and the SIMS analysis results of Sample A3 are shown in each of FIGS. 3A and 3B. The results of the quantification in the IGZO film are shown in each of FIGS. 2A and 3A. The results of the quantification in the silicon oxide film ($SiO_2$) are shown in each of FIGS. 2B and 3B.

In FIGS. 2A and 2B and FIGS. 3A and 3B, the vertical axis and the horizontal axis indicate the H concentration and the depth, respectively. On the horizontal axis in FIGS. 2A and 2B, the vicinity of the surface of the oxide semiconductor film 120b is at a depth of 0 nm. On the horizontal axis in FIGS. 3A and 3B, the vicinity of a surface of the insulating film 118 is at a depth of 0 nm. A method of analyzing the sample from the substrate 102 side (SSDP-SIMS) was used for the SIMS analysis.

As shown in FIGS. 2A and 2B and FIGS. 3A and 3B, there is no large difference in the hydrogen concentration in the insulating films 114 and 116 between Sample A2 and Sample A3. This suggests that hydrogen contained in the insulating film 118 does not enter the insulating films 114 and 116. Meanwhile, the hydrogen concentration in the oxide semiconductor film 120b in Sample A3 is higher than that in Sample A2. This suggests that, by including the insulating film 118, hydrogen contained in the insulating film 118 enters the oxide semiconductor film 120b.

As described above, it is confirmed that hydrogen is added from the insulating film 118 to the oxide semiconductor film 120*b*. Accordingly, the carrier concentration in the oxide semiconductor film 120*b* can be increased, so that the oxide semiconductor film 120*b* can be used as an oxide conductor film.

<1-5. Amount of Oxygen Released from an Insulating Film in Thermal Desorption Spectroscopy Method (TDS)>

Next, the amount of oxygen released from an insulating film containing excess oxygen was evaluated. Specifically, to measure the amount of oxygen released from the insulating film, Samples B1 to B6 to be described below were formed and the released amount of oxygen in TDS was evaluated.

[Structures of Samples B1 to B6]

First, Samples B1 to B6 are described. Note that the formation conditions of Samples B1 to B6 are varied to determine the amount of oxygen added to the insulating film.

To form each of Samples B1 to B6, a 400-nm-thick silicon oxynitride film was formed over a glass substrate with a PECVD apparatus, and then, heat treatment was performed. The silicon oxynitride film was formed under the conditions where the substrate temperature was 350° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus. The heat treatment was performed at 650° C. in a nitrogen atmosphere for 6 minutes using an RTA apparatus. By the heat treatment, oxygen included in the silicon oxynitride film at the time of deposition is released from the silicon oxynitride film. After the heat treatment, a 50-nm-thick oxide semiconductor film was formed over the silicon oxynitride film with a sputtering apparatus. Then, the oxide semiconductor film was removed to expose a surface of the silicon oxynitride film. Note that the formation conditions of the oxide semiconductor films of Samples B1 to B6 were different from each other.

[Formation Conditions of Sample B1]

The oxide semiconductor film of Sample B1 was formed under the conditions where the substrate temperature was 170° C., an argon gas at a flow rate of 180 sccm and an oxygen gas at a flow rate of 20 sccm were introduced into a chamber, i.e., a 10% oxygen gas atmosphere was used, the pressure was 0.6 Pa, and an AC power of 2500 W was supplied to a target (In:Ga:Zn=4:2:4.1 [atomic ratio]) provided in a sputtering apparatus.

[Formation Conditions of Sample B2]

The oxide semiconductor film of Sample B2 was formed under the conditions where the substrate temperature was 170° C., an argon gas at a flow rate of 100 sccm and an oxygen gas at a flow rate of 100 sccm were introduced into a chamber, i.e., a 50% oxygen gas atmosphere was used, the pressure was 0.6 Pa, and an AC power of 2500 W was supplied to a target (In:Ga:Zn=4:2:4.1 [atomic ratio]) provided in a sputtering apparatus.

[Formation Conditions of Sample B3]

The oxide semiconductor film of Sample B3 was formed under the conditions where the substrate temperature was 170° C., an oxygen gas at a flow rate of 200 sccm was introduced into a chamber, i.e., a 100% oxygen gas atmosphere was used, the pressure was 0.6 Pa, and an AC power of 2500 W was supplied to a target (In:Ga:Zn=4:2:4.1 [atomic ratio]) provided in a sputtering apparatus.

[Formation Conditions of Sample B4]

The oxide semiconductor film of Sample B4 was formed under the conditions where the substrate temperature was room temperature, an argon gas at a flow rate of 50 sccm and an oxygen gas at a flow rate of 3 sccm were introduced into a chamber, i.e., a 6% oxygen gas atmosphere was used, the pressure was 0.4 Pa, and a DC power of 1000 W was supplied to a target ($In_2O_3$:$SnO_2$:$SiO_2$=85:10:5 [weight ratio]) provided in a sputtering apparatus.

[Formation Conditions of Sample B5]

The oxide semiconductor film of Sample B5 was formed under the conditions where the substrate temperature was room temperature, an argon gas at a flow rate of 25 sccm and an oxygen gas at a flow rate of 25 sccm were introduced into a chamber, i.e., a 50% oxygen gas atmosphere was used, the pressure was 0.4 Pa, and a DC power of 1000 W was supplied to a target ($In_2O_3$:$SnO_2$:$SiO_2$=85:10:5 [weight ratio]) provided in a sputtering apparatus.

[Formation Conditions of Sample B6]

The oxide semiconductor film of Sample B6 was formed under the conditions where the substrate temperature was room temperature, an oxygen gas at a flow rate of 50 sccm was introduced into a chamber, i.e., a 100% oxygen gas atmosphere was used, the pressure was 0.4 Pa, and a DC power of 1000 W was supplied to a target ($In_2O_3$: $SnO_2$: $SiO_2$=85:10:5 [weight ratio]) provided in a sputtering apparatus.

Then, the amount of a gas having a mass-to-charge ratio (M/z) of 32, i.e., oxygen ($O_2$), released from the silicon oxynitride film of each of Samples B1 to B6 was measured. A TDS apparatus was used for measuring the amount of released gas. In the TDS apparatus, the released amount of a gas corresponding to oxygen was measured in a film-surface temperature range from 50° C. to 600° C.

Figure 6:
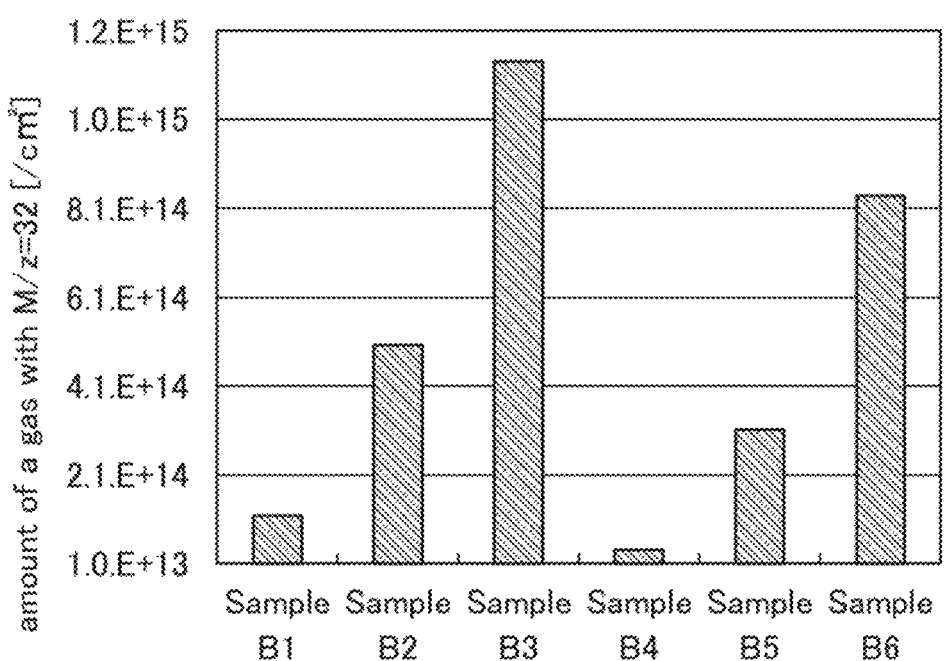
FIG. 6 shows TDS analysis results.

FIG. 6 shows the TDS measurement results of Samples B1 to B6. In FIG. 6, the vertical axis indicates the released amount of a gas with M/z=32, and the horizontal axis indicates the sample name.

As shown in the results in FIG. 6, the amount of a gas with M/z=32 released from Sample B1 was $1.19 \times 10^{14}/cm^3$. The amount of a gas with M/z=32 released from Sample B2 was $5.02 \times 10^{14}/cm^3$. The amount of a gas with M/z=32 released from Sample B3 was $1.14 \times 10^{15}/cm^3$. The amount of a gas with M/z=32 released from Sample B4 was $4.09 \times 10^{13}/cm^3$. The amount of a gas with M/z=32 released from Sample B5 was $3.11 \times 10^{14}/cm^3$. The amount of a gas with M/z=32 released from Sample B6 was $8.40 \times 10^{14}/cm^3$.

The above results suggest that excess oxygen can be added to the insulating film by forming the oxide semiconductor film in an oxygen atmosphere by a sputtering method over the insulating film (here, the silicon oxynitride film) over which the oxide semiconductor film is to be formed. In particular, by raising the flow rate of the oxygen gas as a formation condition of the oxide semiconductor film, oxygen can be added to the insulating film.

<1-6. Oxide Conductor>

Next, an oxide conductor is described. The oxide semiconductor films 120*a* and 120*b* supply excess oxygen to the insulating films 114 and 116 or serve as protective films for suppressing the release of oxygen from the insulating films 114 and 116 in a step of forming the oxide semiconductor films 120*a* and 120*b* of the transistor 100 shown in FIGS. 5A to 5C.

The oxide semiconductor films 120*a* and 120*b* serve as semiconductors before a step of forming the insulating film 118 and serve as conductors after the step of forming the insulating film 118.

To allow the oxide semiconductor films 120*a* and 120*b* to serve as conductors, an oxygen vacancy is formed in the oxide semiconductor films 120*a* and 120*b* and hydrogen is added from the insulating film 118 to the oxygen vacancy, whereby a donor level is formed in the vicinity of the conduction band. As a result, the conductivity of each of the oxide semiconductor films 120a and 120b is increased, so that the oxide semiconductor films become conductors. The oxide semiconductor films 120a and 120b having become conductors can each be referred to as oxide conductor. Therefore, the oxide semiconductor films 120a and 120b may each be referred to as oxide conductor (OC). Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

The sheet resistance of a film formed using an oxide conductor (hereinafter referred to as an oxide conductor film) will be described with reference to FIGS. 7A to 7C and FIG. 8.

[Structures of Samples C1 to C8]

Figure 7A:
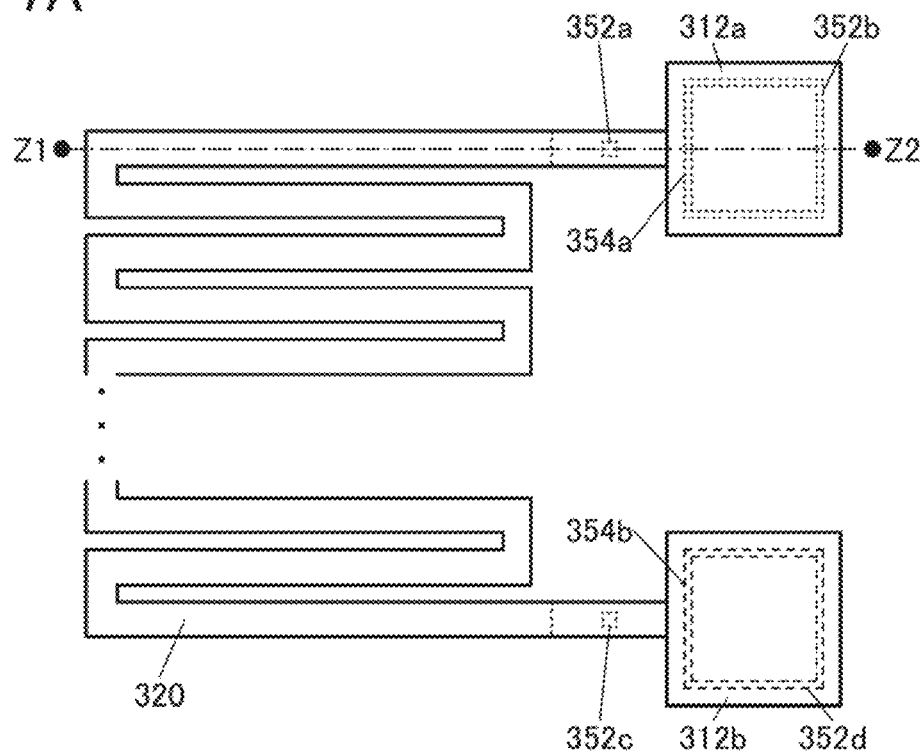
FIGS. 7A to 7C show a top view and cross-sectional views illustrating a sample for measurement of a sheet resistance.
Figure 7B:
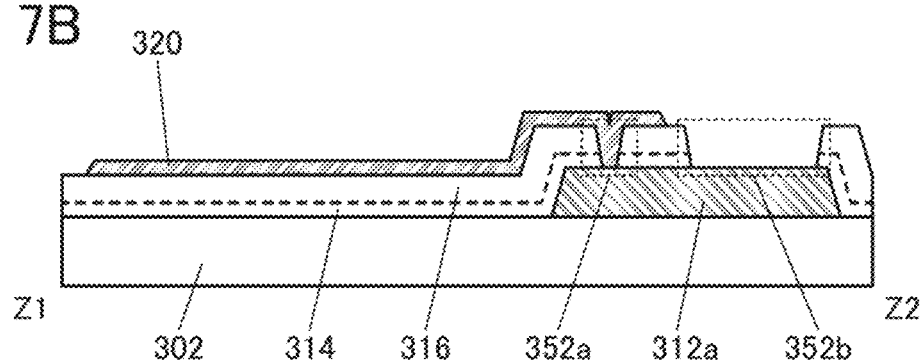
Figure 7C:
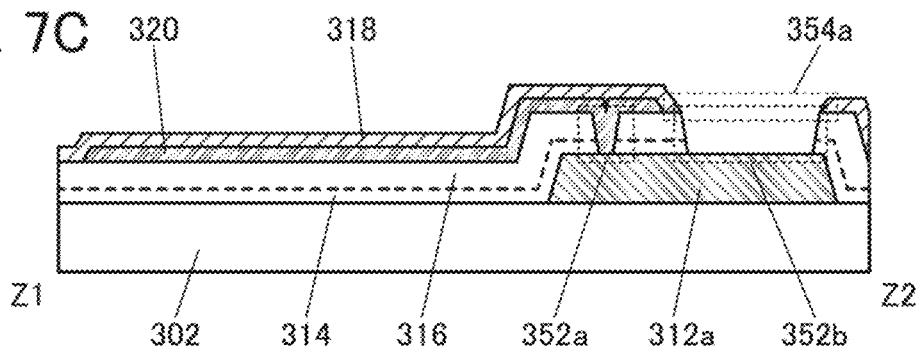

Samples C1 to C8 each including an oxide conductor film were formed. First, the structures of Samples C1 to C8 are described with reference to FIGS. 7A to 7C. FIG. 7A is a top view of each of Samples C1 to C8. FIGS. 7B and 7C are schematic cross-sectional views corresponding to cross sections taken along dashed-dotted line Z1-Z2 in FIG. 7A.

Samples C1 and C2 each include a substrate 302, conductive films 312a and 312b over the substrate 302, insulating films 314 and 316 over the substrate 302 and the conductive films 312a and 312b, and an oxide semiconductor film 320 over the insulating film 316. Note that openings 352a, 352b, 352c, and 352d to the conductive film 312a are formed in the insulating films 314 and 316.

Samples C3 to C8 each include the substrate 302, the conductive films 312a and 312b over the substrate 302, the insulating films 314 and 316 over the substrate 302 and the conductive films 312a and 312b, the oxide semiconductor film 320 over the insulating film 316, and an insulating film 318 over the oxide semiconductor film 320. Note that the openings 352a, 352b, 352c, and 352d to the conductive film 312a are formed in the insulating films 314 and 316. Openings 354a and 354b to the conductive film 312a are formed in the insulating film 318.

As described above, the insulating film 318 is not provided in Samples C1 and C2, unlike in Samples C3 to C8.

Note that in Samples C1 to C8, the oxide semiconductor film 320 is electrically connected to the conductive films 312a and 312b through the openings 352a and 352c. The conductive film 312a serves as a measurement pad for measuring the sheet resistance.

The length L of the oxide semiconductor film 320 was 10 cm, and the width W of the oxide semiconductor film 320 was 10 μm.

Note that the substrate 302, the conductive films 312a and 312b, the insulating film 314, the insulating film 316, the insulating film 318, and the oxide semiconductor film 320 in FIGS. 7A to 7C correspond to the substrate 102, the conductive films 112a and 112b, the insulating film 114, the insulating film 116, the insulating film 118, and the oxide semiconductor film 120a in FIGS. 5A to 5C, respectively.

[Formation Method of Sample C1]

A formation method of Sample C1 is described. A conductive film was formed over the substrate 302, and the conductive film was processed, so that the conductive films 312a and 312b were formed. A glass substrate was used as the substrate 302. As the conductive films 312a and 312b, a 50-nm-thick tungsten film, a 400-nm-thick aluminum film, and a 100-nm-thick titanium film were successively formed in vacuum with a sputtering apparatus.

Then, the insulating films 314 and 316 were formed over the substrate 302 and the conductive films 312a and 312b. As the insulating film 314, a 50-nm-thick silicon oxynitride film was formed with a PECVD apparatus. As the insulating film 316, a 400-nm-thick silicon oxynitride film was formed with a PECVD apparatus. Note that the insulating film 314 and the insulating film 316 were formed successively in vacuum with a PECVD apparatus.

The insulating film 314 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 316 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, first heat treatment was performed. The first heat treatment was performed at 350° C. for 1 hour in a nitrogen gas atmosphere.

Then, the openings 352a and 352b to the conductive film 312a and the openings 352c and 352d to the conductive film 312b were formed. The openings 352a, 352b, 352c, and 352d were formed with a dry etching apparatus.

Next, an oxide semiconductor film was formed over the insulating film 316 to cover the openings 352a, 352b, 352c, and 352d and processed to form the oxide semiconductor film 320. As the oxide semiconductor film 320, a 100-nm-thick indium tin oxide film to which silicon oxide was added (In—Sn—Si oxide, hereinafter referred to as ITSO) was formed under the conditions where the substrate temperature was room temperature, an argon gas at a flow rate of 72 sccm and an oxygen gas at a flow rate of 5 sccm were introduced into a chamber, i.e., a 6.5% oxygen gas atmosphere was used, the pressure was 0.4 Pa, and a DC power of 1000 W was supplied to a target ($In_2O_3$: $SnO_2$:$SiO_2$=85:10:5 [weight ratio]) provided in a sputtering apparatus.

Then, second heat treatment was performed. The second heat treatment was performed at 250° C. for 1 hour in a nitrogen gas atmosphere. Through the above process, Sample C1 was formed.

[Formation Method of Sample C2]

The formation method of Sample C2 is different from that of Sample C1 only in the formation conditions of the oxide semiconductor film 320.

As the oxide semiconductor film 320 of Sample C2, a 100-nm-thick ITSO film was formed under the conditions where the substrate temperature was room temperature, an oxygen gas at a flow rate of 50 sccm was introduced into a chamber, i.e., a 100% oxygen gas atmosphere was used, the pressure was 0.4 Pa, and a DC power of 1000 W was supplied to a target ($In_2O_3$:$SnO_2$:$SiO_2$=85:10:5 [weight ratio]) provided in a sputtering apparatus.

[Formation Method of Sample C3]

A formation method of Sample C3 is described. Up to the step of forming the oxide semiconductor film 320, Sample C3 was formed using a material and a formation method similar to those of Sample C2.

Then, the insulating film 318 was formed over the insulating film 316 and the oxide semiconductor film 320. As the insulating film 318, a 100-nm-thick silicon nitride film was formed with a PECVD apparatus. The insulating film 318 was deposited under the conditions where the substrate temperature was 350° C., a silane gas at a flow rate of 50 sccm, a nitrogen gas at a flow rate of 5000 sccm, and an ammonia gas at a flow rate of 100 sccm were introduced into a chamber, the pressure was 100 Pa, and high-frequency power of 1000 W was supplied between parallel-plate electrodes provided in the PECVD apparatus with the use of a 27.12 MHz high-frequency power source.

Then, the openings 354a and 354b were formed in desired regions of the insulating film 318. The openings 354a and 354b were formed with a dry etching apparatus.

[Formation Methods of Samples C4 to C8]

The formation methods of Samples C4 to C8 are different from the formation method of Sample C3 only in the formation conditions of the oxide semiconductor film 320.

[Sample C4]

As the oxide semiconductor film 320 of Sample C4, a 100-nm-thick IGZO film was formed under the conditions where the substrate temperature was 170° C., an oxygen gas at a flow rate of 200 sccm was introduced into a chamber, the pressure was 0.6 Pa, and an AC power of 2500 W was applied to a polycrystalline metal oxide sputtering target (having an atomic ratio of In:Ga:Zn=1:1:1.2 [atomic ratio]).

[Sample C5]

As the oxide semiconductor film 320 of Sample C5, a 35-nm-thick IGZO film was deposited under the conditions where the substrate temperature was 170° C., an oxygen gas at a flow rate of 200 sccm was introduced into a chamber, i.e., a 100% oxygen gas atmosphere was used, the pressure was 0.6 Pa, and an AC power of 2500 W was applied to a polycrystalline metal oxide sputtering target (In:Ga:Zn=4:2:4.1 [atomic ratio]).

[Sample C6]

As the oxide semiconductor film 320 of Sample C6, a 50-nm-thick IGZO film was formed under the conditions where the substrate temperature was 170° C., an oxygen gas at a flow rate of 200 sccm was introduced into a chamber, i.e., a 100% oxygen gas atmosphere was used, the pressure was 0.6 Pa, and an AC power of 2500 W was applied to a polycrystalline metal oxide sputtering target (In:Ga:Zn=4:2:4.1 [atomic ratio]).

[Sample C7]

As the oxide semiconductor film 320 of Sample C7, a 100-nm-thick IGZO film was formed under the conditions where the substrate temperature was 170° C., an oxygen gas at a flow rate of 200 sccm was introduced into a chamber, i.e., a 100% oxygen gas atmosphere was used, the pressure was 0.6 Pa, and an AC power of 2500 W was applied to a polycrystalline metal oxide sputtering target (In:Ga:Zn=4:2:4.1 [atomic ratio]).

[Sample C8]

As the oxide semiconductor film 320 of Sample C8, a 50-nm-thick first IGZO film was formed under the conditions where the substrate temperature was 170° C., an oxygen gas at a flow rate of 300 sccm was introduced into a chamber, i.e., a 100% oxygen gas atmosphere was used, the pressure was 0.8 Pa, and an AC power of 2500 W was applied to a polycrystalline metal oxide sputtering target (In:Ga:Zn=1:3:6 [atomic ratio]), and a 50-nm-thick second IGZO film was successively formed under the conditions where the substrate temperature was 170° C., an argon gas at a flow rate of 180 sccm and an oxygen gas at a flow rate of 20 sccm was introduced into a chamber, i.e., a 10% oxygen gas atmosphere was used, the pressure was 0.6 Pa, and an AC power of 2500 W was applied to a polycrystalline metal oxide sputtering target (In:Ga:Zn=4:2:4.1 [atomic ratio]).

[Sheet Resistance]

Next, the sheet resistances of Samples C1 to C8 was measured. As the measurement method of the sheet resistance of the oxide semiconductor film 320, probes were made contact with the conductive films 312a and 312b exposed in the openings 352b and 352d shown in FIGS. 7A to 7C. One of the conductive films 312a and 312b was supplied with a ground potential, and the other was supplied with a voltage of 0.01 V.

Figure 8:
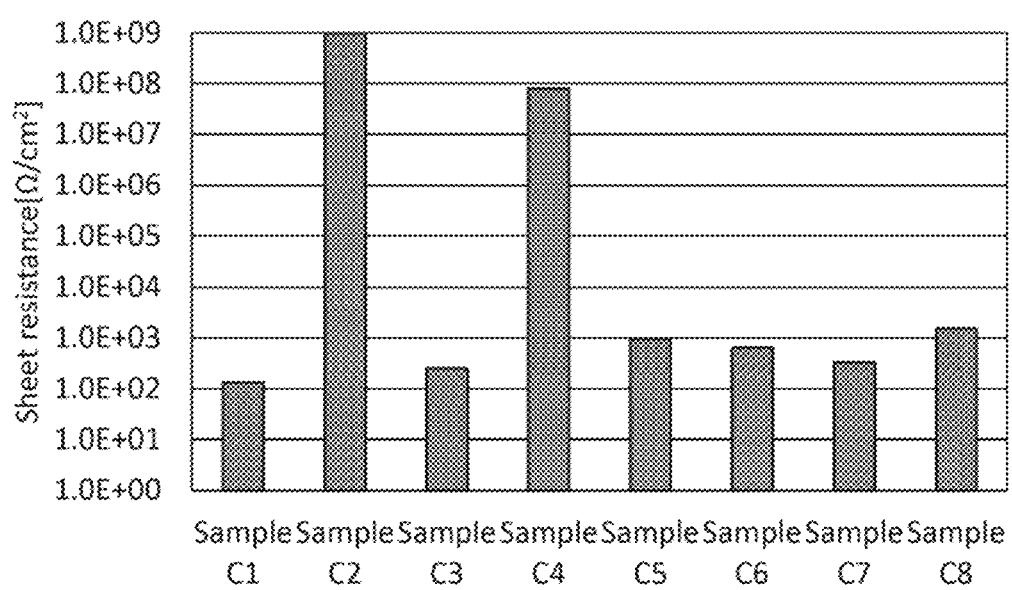
FIG. 8 shows measurement results of sheet resistances.

FIG. 8 shows measured sheet resistances of Samples C1 to C8. In FIG. 8, the vertical axis and the horizontal axis indicate the sheet resistance and the sample name, respectively.

As shown in FIG. 8, the sheet resistances of Sample C1, Sample C3, and Samples C5 to C8 are higher than or equal to $1.0 \times 10^2$ $\Omega/cm^2$ and lower than or equal to $1.0 \times 10^4$ $\Omega/cm^2$. In other words, the oxide semiconductor film 320 in each of Sample C1, Sample C3, and Samples C5 to C8 is a degenerate semiconductor and it is suggested that the conduction band minimum agrees with or roughly agrees with the Fermi level. Meanwhile, the sheet resistances of Samples C2 and C4 are higher than $1.0 \times 10^4$ $\Omega/cm^2$.

As described above, it is suggested that the resistivity of the oxide semiconductor film 320 can be controlled as appropriate by selecting a material to be used and by determining whether to form the insulating film 318 over the oxide semiconductor film 320. Thus, it is confirmed that the oxide semiconductor film 320 serves not only as an electrode but also as a resistor.

<1-7. Components of Semiconductor Device>

Constituent elements of the semiconductor device of this embodiment will be described in detail below.

[Substrate]

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film Functioning as a First Gate Electrode and Source and Drain Electrodes]

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

[Insulating Films Functioning as First Gate Insulating Film]

As each of the insulating films 106 and 107 functioning as gate insulating films of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, oxygen may be added to the deposited insulating film 107. A method for adding oxygen to the deposited insulating film 107 is described later.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 150, the physical thickness of the insulating film can be increased. This makes it possible to reduce a decrease in withstand voltage of the transistor 100 and furthermore to increase the withstand voltage, thereby reducing electrostatic discharge damage to the transistor 100.

[Oxide Semiconductor Film]

The oxide semiconductor film 108 can be formed using the materials described above.

In the case where the oxide semiconductor film 108b is In-M-Zn oxide, it is preferable that the atomic ratio of metal elements of a sputtering target used for forming a film of the In-M-Zn oxide satisfy In>M Examples of the atomic ratio of metal elements of such a sputtering target include In:M:Zn=2:1:3, In:M:Zn=3:1:2, In:M:Zn=4:2:4.1, and In:M:Zn=5:1:7.

In the case where the oxide semiconductor film 108c is In-M-Zn oxide, the atomic ratio between metal elements in a sputtering target used for forming the In-M-Zn oxide preferably satisfies In≤M. The atomic ratio between metal elements in such a sputtering target is In:M:Zn=1:1:1, In:M:Zn=1:1:1.2, In:M:Zn=1:3:2, In:M:Zn=1:3:4, In:M:Zn=1:3:6, or the like.

In the case where the oxide semiconductor film 108b and the oxide semiconductor film 108c are each In-M-Zn oxide, it is preferable to use a target including polycrystalline In-M-Zn oxide as the sputtering target. The use of the target including polycrystalline In-M-Zn oxide facilitates formation of the oxide semiconductor film 108b and the oxide semiconductor film 108c having crystallinity. Note that the atomic ratios of metal elements in the oxide semiconductor film 108b and the oxide semiconductor film 108c vary from the above atomic ratio of metal elements of the sputtering target within a range of ±40% as an error. For example, when a sputtering target with an atomic ratio of In to Ga and Zn of 4:2:4.1 is used for forming the oxide semiconductor film 108b, the atomic ratio of In to Ga and Zn in the oxide semiconductor film 108b may be 4:2:3 or in the vicinity of 4:2:3. As another example, when a sputtering target with an atomic ratio of In:Ga:Zn=5:1:7 is used for forming the oxide semiconductor film 108b, the atomic ratio of In to Ga and Zn in the oxide semiconductor film 108b may be 5:1:6 and its vicinity.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than that of the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy is increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

The oxide semiconductor film 108b and the oxide semiconductor film 108c may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

[Insulating Films Functioning as Second Gate Insulating Film]

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

[Oxide Semiconductor Film Functioning as Pixel Electrode and Oxide Semiconductor Film Functioning as Second Gate Electrode]

The oxide semiconductor film 120a functioning as a pixel electrode and the oxide semiconductor film 120b functioning as a second gate electrode can be formed using a material and a formation method which are similar to those of the oxide semiconductor film 108.

The oxide semiconductor film 120a functioning as a pixel electrode and the oxide semiconductor film 120b functioning as a second gate electrode contain at least one metal element which is the same as that contained in the above-described oxide semiconductor film 108. For example, In oxide, In—Sn oxide, In—Zn oxide, In—Ga oxide, Zn oxide, Al—Zn oxide, In—Ga—Zn oxide, or the like can be used for the oxide semiconductor films 120a and 120b. It is particularly preferable to use an In—Sn oxide or an In—Ga—Zn oxide.

Specifically, indium gallium zinc oxide (IGZO), indium tin oxide (ITO), indium zinc oxide, or indium tin silicon oxide (ITSO) can be used for the oxide semiconductor films 120a and 120b.

That is, the oxide semiconductor film 120a functioning as a pixel electrode and the oxide semiconductor film 120b functioning as a second gate electrode contain at least one metal element which is the same as that contained in the oxide semiconductor film 108 (the oxide semiconductor film 108b and the oxide semiconductor film 108c). For example, the oxide semiconductor film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the oxide semiconductor film 120a functioning as a pixel electrode and the oxide semiconductor film 120b functioning as a second gate electrode are each In-M-Zn oxide, the atomic ratio between metal elements in a sputtering target used for forming the In-M-Zn oxide preferably satisfies In≥M. The atomic ratio between metal elements in such a sputtering target is In:M:Zn=2:1:3, In:M:Zn=3:1:2, In:M:Zn=4:2:4.1, In:M:Zn=5:1:7, or the like.

The oxide semiconductor film 120a functioning as a pixel electrode and the oxide semiconductor film 120b functioning as a second gate electrode can each have a single-layer structure or a stacked-layer structure of two or more layers. Note that in the case where the oxide semiconductor film 120a and the oxide semiconductor film 120b each have a stacked-layer structure, the composition of the sputtering target is not limited to that described above. The case where the oxide semiconductor film 120a and the oxide semiconductor film 120b each have a stacked-layer structure will be described later.

[Insulating Film Functioning as Protective Insulating Film of Transistor]

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one of or both hydrogen and nitrogen to the oxide semiconductor film 120a functioning as a pixel electrode and the oxide semiconductor film 120b functioning as a second gate electrode. The insulating film 118 preferably includes hydrogen and has a function of supplying the hydrogen to the oxide semiconductor films 120a and 120b. The oxide semiconductor films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—ZnO film is formed with a deposition apparatus using an ALD method, an $In(CH_3)_3$ gas and an $O_3$ gas are used to form an In—O layer, a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<1-8. Structure Example 2 of Semiconductor Device>

A structure example different from that of the transistor 100 in FIGS. 5A to 5C is described with reference to FIGS. 9A to 9C.

Figure 9A:
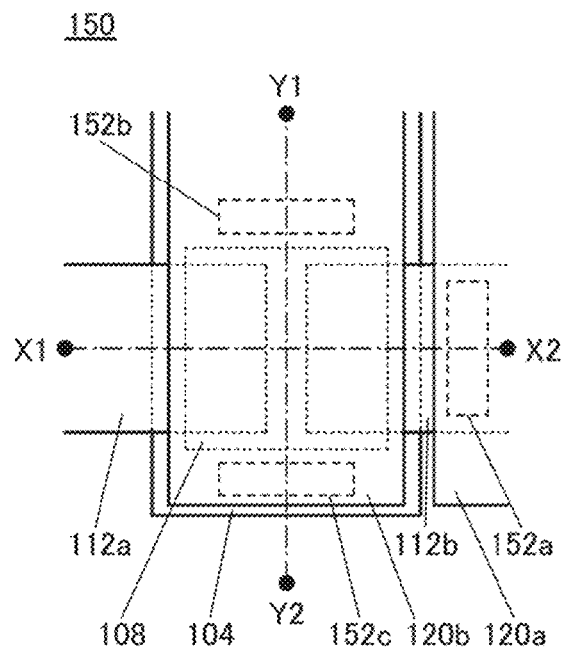
FIGS. 9A to 9C are a top view and cross-sectional views illustrating one embodiment of a semiconductor device.

FIG. 9A is a top view of a transistor 150 that is a semiconductor device of one embodiment of the present invention. FIG. 9B is a cross-sectional view taken along dashed-dotted line X1-X2 illustrated in FIG. 9A, and FIG. 9C is a cross-sectional view taken along dashed-dotted line Y1-Y2 illustrated in FIG. 9A.

The transistor 150 differs from the transistor 100 in that openings 152b and 152c are provided in the channel width direction. The other portions of the transistor 150 are similar to those in the transistor 100 and have similar effects. The portions different from those in the transistor 100 are described below.

Figure 9B:
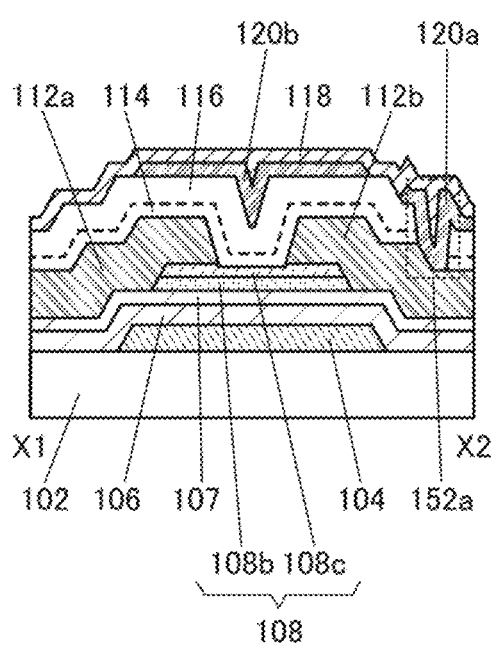
Figure 9C:
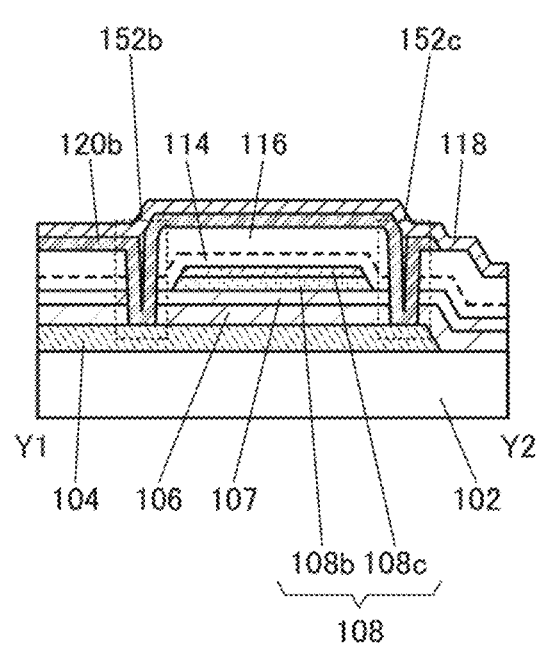

As illustrated in FIG. 9C, the oxide semiconductor film 120b functioning as a second gate electrode is connected to the conductive film 104 functioning as a first gate electrode through openings 152b and 152c provided in the insulating films 106, 107, 114, and 116. Accordingly, the conductive film 104 and the oxide semiconductor film 120b are supplied with the same potential.

Note that although the structure in which the openings 152b and 152c are provided so that the conductive film 104 and the oxide semiconductor film 120b are connected to each other is described in this embodiment, one embodiment of the present invention is not limited thereto. For example, a structure in which only one of the openings 152b and 152c is provided so that the conductive film 104 and the oxide semiconductor film 120b are connected to each other may be employed. Note that in the case where the conductive film 104 and the oxide semiconductor film 120b are not connected to each other as in the transistor 100 shown in FIGS. 5A to 5C, it is possible to apply different potentials to the conductive film 104 and the oxide semiconductor film 120b.

As illustrated in FIG. 9B, the oxide semiconductor film 108 is positioned to face each of the conductive film 104 functioning as a first gate electrode and the oxide semiconductor film 120b functioning as a second gate electrode, and is sandwiched between the two films functioning as gate electrodes. The lengths in the channel length direction and the channel width direction of the oxide semiconductor film 120b functioning as a second gate electrode are longer than those in the channel length direction and the channel width direction of the oxide semiconductor film 108. The whole oxide semiconductor film 108 is covered with the oxide semiconductor film 120b with the insulating films 114 and 116 positioned therebetween. Since the oxide semiconductor film 120b functioning as a second gate electrode is connected to the conductive film 104 functioning as a first gate electrode through the openings 152b and 152c provided in the insulating films 106, 107, 114, and 116, a side surface of the oxide semiconductor film 108 in the channel width direction faces the oxide semiconductor film 120b functioning as a second gate electrode with the insulating films 114 and 116 positioned therebetween.

In other words, in the channel width direction of the transistor 150, the conductive film 104 functioning as a first gate electrode and the oxide semiconductor film 120b functioning as a second gate electrode are connected to each other through the openings provided in the insulating films 106 and 107 functioning as first gate insulating films, and the insulating films 114 and 116 functioning as second gate insulating films; and the conductive film 104 and the oxide semiconductor film 120b surround the oxide semiconductor film 108 with the insulating films 106 and 107 functioning as first gate insulating films, and the insulating films 114 and 116 functioning as second gate insulating films positioned therebetween.

Such a structure makes it possible that the oxide semiconductor film 108 included in the transistor 150 is electrically surrounded by electric fields of the conductive film 104 functioning as a first gate electrode and the oxide semiconductor film 120b functioning as a second gate electrode. A device structure of a transistor, like that of the transistor 150, in which electric fields of a first gate electrode and a second gate electrode electrically surround an oxide semiconductor film where a channel region is formed can be referred to as a Surrounded channel (S-channel) structure.

Since the transistor 150 has the S-channel structure, an electric field for inducing a channel can be effectively applied to the oxide semiconductor film 108 by the conductive film 104 functioning as a first gate electrode; therefore, the current drive capability of the transistor 150 can be improved and high on-state current characteristics can be obtained. Since the on-state current can be increased, it is possible to reduce the size of the transistor 150. In addition, since the transistor 150 is surrounded by the conductive film 104 functioning as a first gate electrode and the oxide semiconductor film 120b functioning as a second gate electrode, the mechanical strength of the transistor 150 can be increased.

<1-9. Structure Example 3 of Semiconductor Device>

A structure example different from that of the transistor 100 in FIGS. 5A to 5C is described with reference to FIGS. 10A to 10C.

Figure 10A:
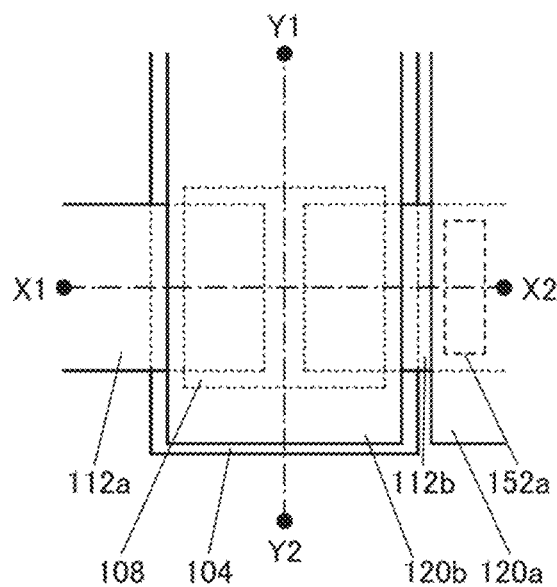
FIGS. 10A to 10C are a top view and cross-sectional views illustrating one embodiment of a semiconductor device.
Figure 10B:
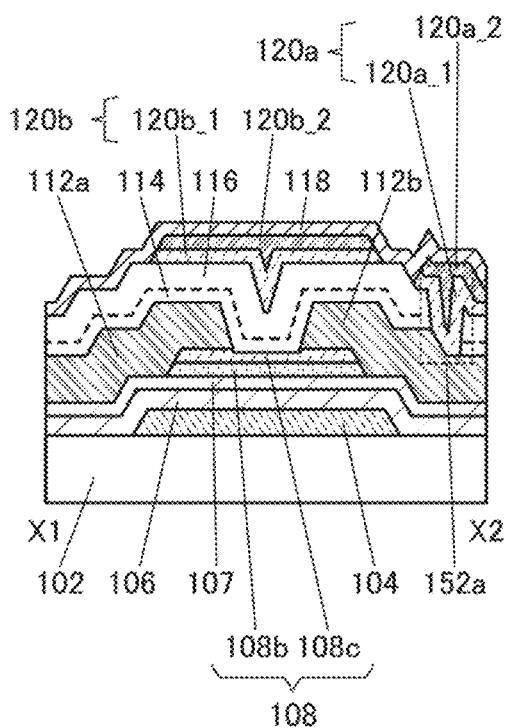
Figure 10C:
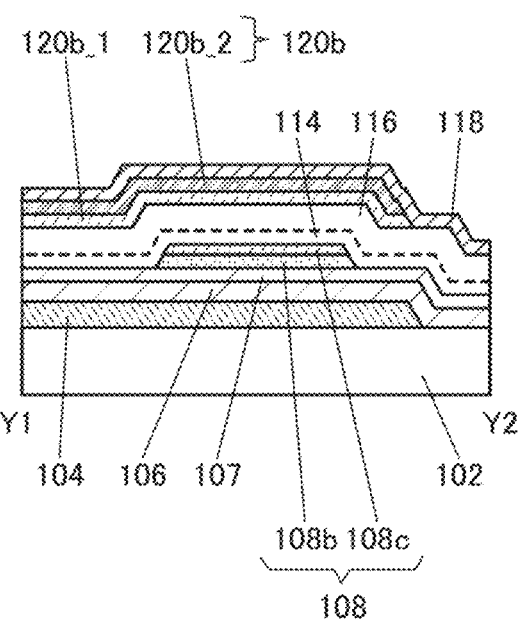

FIG. 10A is a top view of a transistor 160 that is a semiconductor device of one embodiment of the present invention. FIG. 10B is a cross-sectional view taken along dashed dotted line X1-X2 in FIG. 10A, and FIG. 10C is a cross-sectional view taken along dashed dotted line Y1-Y2 in FIG. 10A.

The transistor 160 differs from the transistor 100 in the structures of the oxide semiconductor film 120a functioning as a pixel electrode and the oxide semiconductor film 120b functioning as a second gate electrode. The other portions of the transistor 160 are similar to those in the transistor 100 and have similar effects. The portions different from those in the transistor 100 are described below.

The oxide semiconductor film 120a functioning as a pixel electrode in the transistor 160 has a stacked-layer structure of an oxide semiconductor film 120a_1 and an oxide semiconductor film 120a_2. The oxide semiconductor film 120b functioning as a second gate electrode in the transistor 160 has a stacked-layer structure of an oxide semiconductor film 120b_1 and an oxide semiconductor film 120b_2.

When the oxide semiconductor film 120a and the oxide semiconductor film 120b each have a stacked-layer structure, oxygen can be suitably introduced into the insulating film 116. Moreover, when the oxide semiconductor film 120a and the oxide semiconductor film 120b each have a stacked-layer structure, entry of hydrogen contained in the insulating film 118 into the insulating film 116 can be suppressed.

The atomic ratio between metal elements in a sputtering target used for forming the oxide semiconductor film 120a_1 and the oxide semiconductor film 120b_1 preferably satisfies In≤M. As the atomic ratio of metal elements of such a sputtering target, In:M:Zn=1:1:1, In:M:Zn=1:1:1.2, In:M:Zn=1:3:2, In:M:Zn=1:3:4, In:M:Zn=1:3:6, and the like and are given.

The atomic ratio of metal elements in a sputtering target used for forming the oxide semiconductor film 120a_2 and the oxide semiconductor film 120b_2 preferably satisfies In≥M. As the atomic ratio of metal elements in such a sputtering target, In:M:Zn=1:1:1, In:M:Zn=1:1:1.2, In:M:Zn=2:1:3, InM:Zn=3:1:2, In:M:Zn=4:2:4.1, In:M:Zn=5:1:7, and the like are given.

In the case of forming the oxide semiconductor film 120a and the oxide semiconductor film 120b each having a two-layer structure, the flow rate of an oxygen gas for forming a lower oxide semiconductor film is preferably set higher than the flow rate of an oxygen gas for forming an upper oxide semiconductor film. When the lower oxide semiconductor film is formed using an oxygen gas with a higher flow rate, oxygen can be suitably added to the insulating film 116, especially to the vicinity of the surface of the insulating film 116. When the upper oxide semiconductor film is formed using an oxygen gas with a lower flow rate, the resistance of the oxide semiconductor film can be reduced.

A semiconductor device including the oxide semiconductor film 120a and the oxide semiconductor film 120b each having the above-described structure can have higher reliability.

<1-10. Structure Example 4 of Semiconductor Device>

A structure example different from that of the transistor 150 in FIGS. 9A to 9C is described with reference to FIGS. 11A to 11C.

Figure 11A:
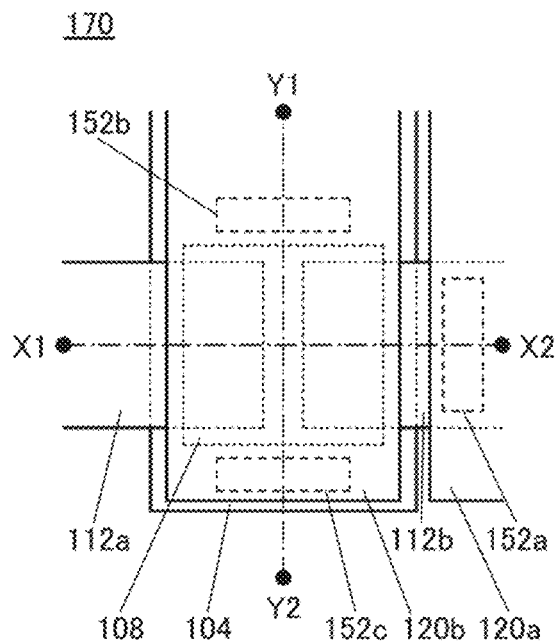
FIGS. 11A to 11C are a top view and cross-sectional views illustrating one embodiment of a semiconductor device.

FIG. 11A is a top view of a transistor 170 that is a semiconductor device of one embodiment of the present invention. FIG. 11B is a cross-sectional view taken along dashed-dotted line X1-X2 illustrated in FIG. 11A, and FIG. 11C is a cross-sectional view taken along dashed-dotted line Y1-Y2 illustrated in FIG. 11A.

The transistor 170 differs from the transistor 150 in the structures of the oxide semiconductor film 120a functioning as a pixel electrode and the oxide semiconductor film 120b functioning as a second gate electrode. The other portions of the transistor 170 are similar to those in the transistor 150 and have similar effects. The structures of the oxide semiconductor film 120a and the oxide semiconductor film 120b may be similar to those of the transistor 160 described above.

<1-11. Structure Example 5 of Semiconductor Device>

Figure 11B:
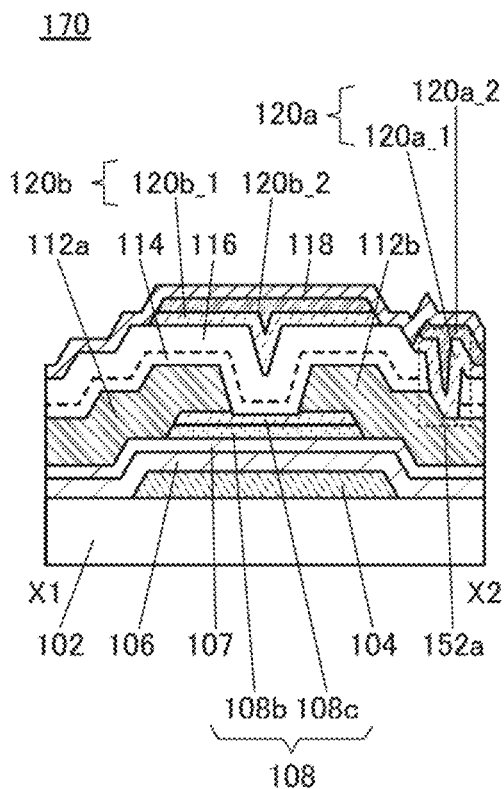
Figure 11C:
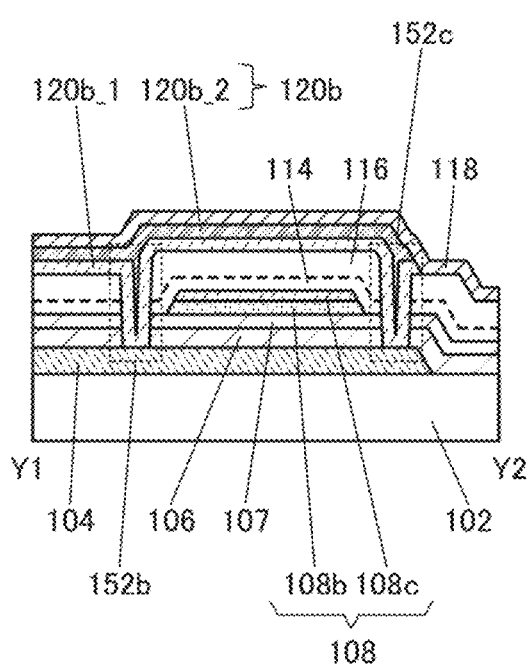

Modification examples of the transistor 150 shown in FIGS. 9A to 9C and a modification example of the transistor 170 shown in FIGS. 11A to 11C are described with reference to FIGS. 12A to 12D, FIGS. 13A and 13B, and FIGS. 14A to 14D.

Figure 12A:
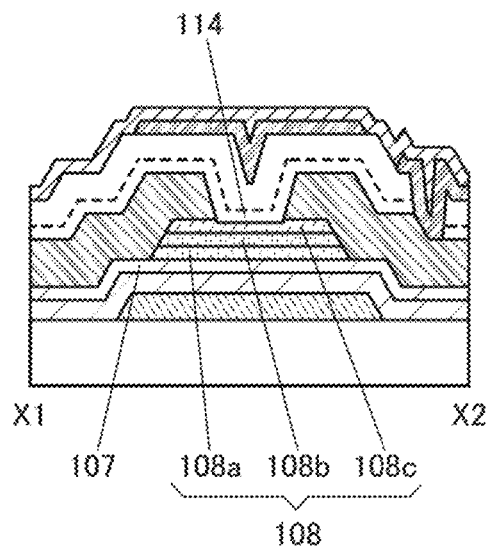
FIGS. 12A to 12D are cross-sectional views illustrating one embodiment of a semiconductor device.
Figure 12B:
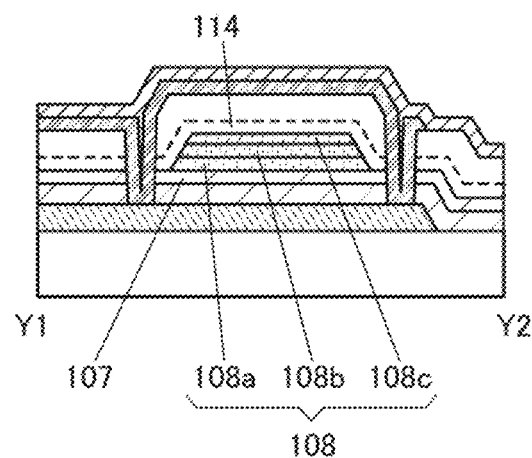
Figure 12C:
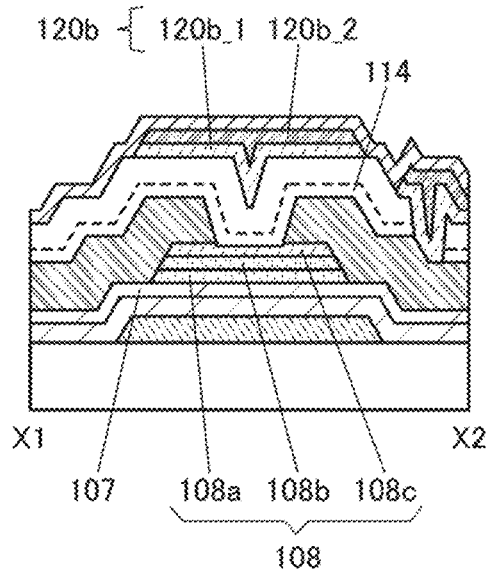
Figure 12D:
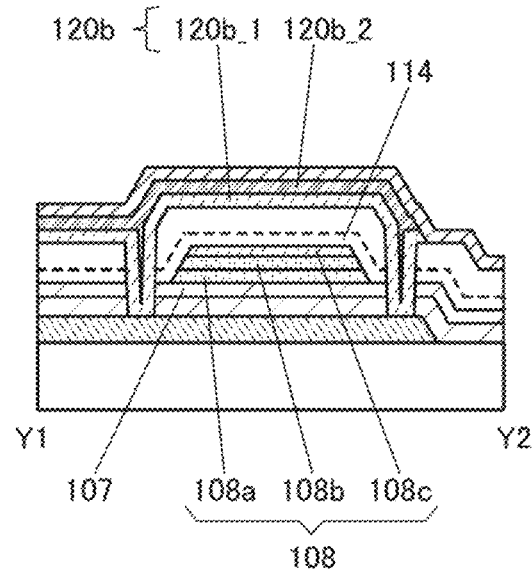

FIGS. 12A and 12B are cross-sectional views of a modification example of the transistor 150 in FIGS. 9B and 9C. FIGS. 12C and 12D are cross-sectional views of a modification example of the transistor 170 in FIGS. 11B and 11C.

A transistor 150A in FIGS. 12A and 12B has the same structure as the transistor 150 in FIGS. 9B and 9C except that the oxide semiconductor film 108 has a three-layer structure. Specifically, the oxide semiconductor film 108 of the transistor 150A includes an oxide semiconductor film 108a, the oxide semiconductor film 108b, and the oxide semiconductor film 108c.

A transistor 170A in FIGS. 12C and 12D has the same structure as the transistor 170 in FIGS. 11B and 11C except that the oxide semiconductor film 108 has a three-layer structure. Specifically, the oxide semiconductor film 108 of the transistor 170A includes the oxide semiconductor film 108a, the oxide semiconductor film 108b, and the oxide semiconductor film 108c.

Here, band structures of insulating films in contact with the oxide semiconductor films 108a, 108b, and 108c and insulating films in contact with the oxide semiconductor films 108b and 108c are described with reference to FIGS. 13A and 13B.

Figure 13A:
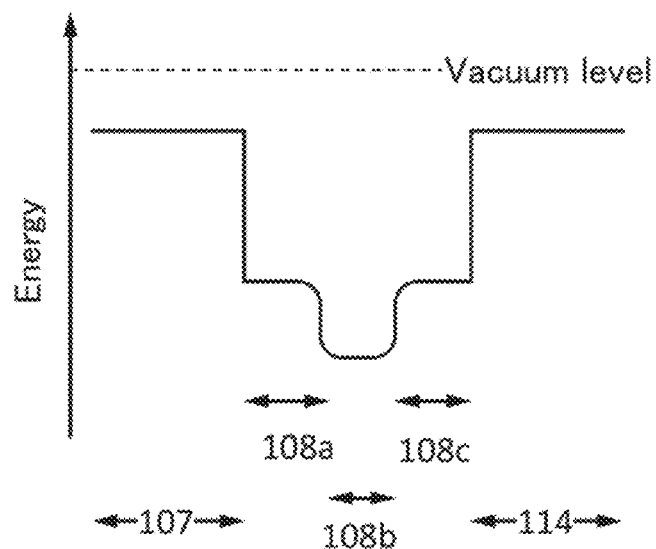
FIGS. 13A and 13B illustrate a band structure.

FIG. 13A shows an example of a band structure in the thickness direction of a stack including the insulating film 107, the oxide semiconductor films 108a, 108b, and 108c, and the insulating film 114. FIG. 13B shows an example of a band structure in the thickness direction of a stack including the insulating film 107, the oxide semiconductor films 108b and 108c, and the insulating film 114. For easy understanding, the conduction band minimum (Ec) of each of the insulating film 107, the oxide semiconductor films 108a, 108b, and 108c, and the insulating film 114 is shown in the band diagrams.

In the band structure of FIG. 13A, a silicon oxide film is used as each of the insulating films 107 and 114, an oxide semiconductor film formed using a metal oxide target having an atomic ratio of metal elements of In:Ga:Zn=1:1:1.2 is used as the oxide semiconductor film 108a, an oxide semiconductor film formed using a metal oxide target having an atomic ratio of metal elements of In:Ga:Zn=4:2:4.1 is used as the oxide semiconductor film 108b, and an oxide semiconductor film formed using a metal oxide target having an atomic ratio of metal elements of In:Ga:Zn=1:1:1.2 is used as the oxide semiconductor film 108c.

Figure 13B:
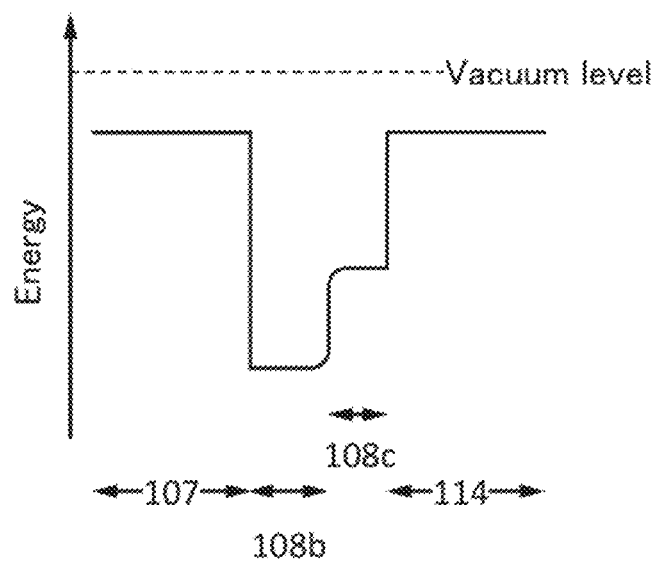

In the band structure of FIG. 13B, a silicon oxide film is used as each of the insulating films 107 and 114, an oxide semiconductor film formed using a metal oxide target having an atomic ratio of metal elements of In:Ga:Zn=4:2:4.1 is used as the oxide semiconductor film 108b, and an oxide semiconductor film formed using a metal oxide target having an atomic ratio of metal elements of In:Ga:Zn=1:1:1.2 is used as the oxide semiconductor film 108c.

As illustrated in FIGS. 13A and 13B, the energy level of the conduction band minimum gradually varies between the oxide semiconductor film 108a and the oxide semiconductor film 108b and between the oxide semiconductor film 108b and the oxide semiconductor film 108c. In other words, the energy level at the bottom of the conduction band is continuously varied or continuously connected. To obtain such a band structure, there exists no impurity, which forms a defect state such as a trap center or a recombination center, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, it is necessary to form the films successively without exposure to the air by using a multi-chamber deposition apparatus (sputtering apparatus) provided with a load lock chamber.

With the band structure of FIG. 13A or FIG. 13B, the oxide semiconductor film 108b serves as a well, and a channel region is formed in the oxide semiconductor film 108b in the transistor with the stacked-layer structure.

By providing the oxide semiconductor film 108a and/or the oxide semiconductor film 108c, the oxide semiconductor film 108b is distanced from trap states that could be formed in the vicinity of the interface between the oxide semiconductor film 108b and the insulating film (the insulating film 107 or the insulating film 114).

In addition, in some cases, the trap states are more distant from the vacuum level than the energy level of the conduction band minimum (Ec) of the oxide semiconductor film 108b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 108b. Such a structure inhibits accumulation of electrons in the trap states. As a result, the on-state current and the field-effect mobility of the transistor can be increased.

The energy level of the conduction band minimum of each of the oxide semiconductor films 108a and 108c is closer to the vacuum level than that of the oxide semiconductor film 108b. A typical difference between the energy level of the conduction band minimum of the oxide semiconductor film 108b and the energy level of the conduction band minimum of each of the oxide semiconductor films 108a and 108c is 0.15 eV or more or 0.5 eV or more and 2 eV or less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current. That is, the oxide semiconductor film 108b functions as a channel region, and the oxide semiconductor films 108a and 108c function as oxide insulating films. In addition, since the oxide semiconductor films 108a and 108c each include one or more metal elements included in the oxide semiconductor film 108b in which a channel region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Thus, each of the oxide semiconductor films 108a and 108c can also be referred to as "oxide insulating film" owing to its physical property and/or function. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than the energy level of the conduction band minimum of the oxide semiconductor film 108b. For example, a difference in energy level between the conduction band minimum of the oxide semiconductor film 108b and the conduction band minimum of the oxide semiconductor films 108a and 108c is 0.2 eV or more, preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor film 108a and 108c is preferably a CAAC-OS, in which case a higher blocking property against constituent elements of the conductive films 112a and 112b, for example, copper elements, is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating film 114 to the oxide semiconductor film 108b.

Although the example where an oxide semiconductor film formed using a metal oxide target having an atomic ratio of metal elements, In:Ga:Zn=1:1:1.2, is used as each of the oxide semiconductor films 108a and 108c is described in this embodiment, one embodiment of the present invention is not limited thereto. For example, an oxide semiconductor film formed using a metal oxide target having an atomic ratio of metal elements, In:Ga:Zn=1:1:1, In:Ga:Zn=1:3:2, In:Ga:Zn=1:3:4, or In:Ga:Zn=1:3:6, may be used as each of the oxide semiconductor films 108a and 108c.

When the oxide semiconductor films 108a and 108c are formed using a metal oxide target having an atomic ratio of In:Ga:Zn=1:1:1, the oxide semiconductor films 108a and 108c have an atomic ratio of In:Ga:Zn=1:$\beta$1 (0<$\beta$1≤2):$\beta$2 (0<$\beta$2≤2) in some cases. When the oxide semiconductor films 108a and 108c are formed using a metal oxide target having an atomic ratio of In:Ga:Zn=1:3:4, the oxide semiconductor films 108a and 108c have an atomic ratio of In:Ga:Zn=1:$\beta$3 (1≤$\beta$3≤5):$\beta$4 (2≤$\beta$4≤6) in some cases. When the oxide semiconductor films 108a and 108c are formed using a metal oxide target having an atomic ratio of In:Ga:Zn=1:3:6, the oxide semiconductor films 108a and 108c have an atomic ratio of In:Ga:Zn=1:$\beta$5 (1≤$\beta$5≤5):$\beta$6 (4≤$\beta$6≤8) in some cases.

Figure 14A:
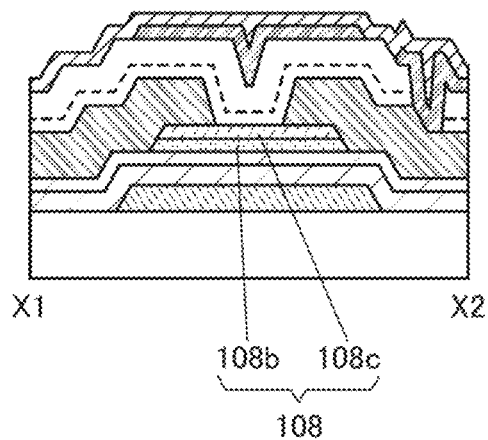
FIGS. 14A to 14D are cross-sectional views illustrating an example of a manufacturing process of a semiconductor device.
Figure 14B:
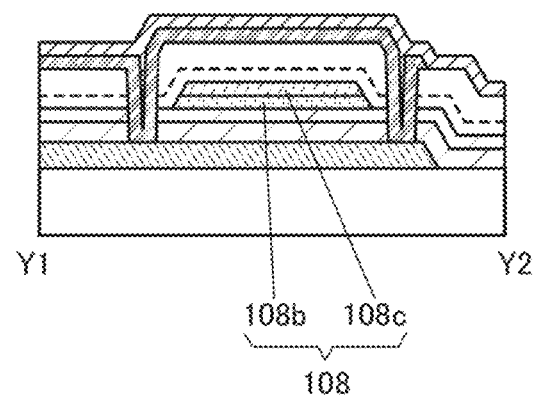
Figure 14C:
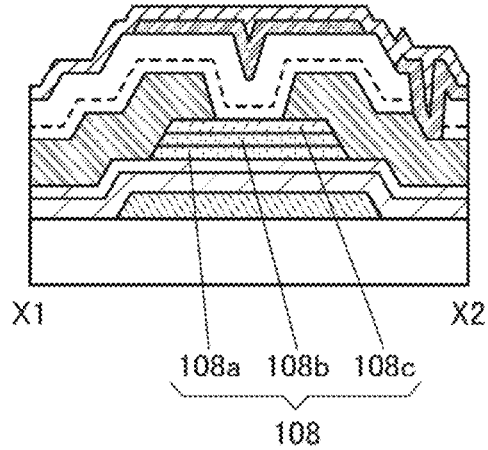
Figure 14D:
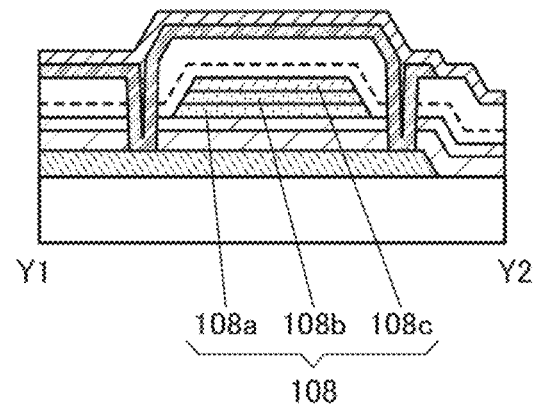

The drawings illustrate an example where the oxide semiconductor film 108c in the transistor 150 and the oxide semiconductor film 108c in the transistor 150A have a small thickness in a region which is not covered with the conductive films 112a and 112b, that is, an example where part of the oxide semiconductor film has a depressed portion. However, one embodiment of the present invention is not limited thereto, and the oxide semiconductor film does not necessarily have a depressed region in a region which is not covered with the conductive films 112a and 112b. FIGS. 14A to 14D illustrate examples in this case. FIGS. 14A to 14D are cross-sectional views illustrating examples of the semiconductor device. FIGS. 14A and 14B illustrate a structure where the oxide semiconductor film 108c in the transistor 150 does not have a depressed portion, and FIGS. 14C and 14D illustrate a structure where the oxide semiconductor film 108c in the transistor 150A does not have a depressed portion.

The structures of the transistors of this embodiment can be freely combined with each other.

<1-12. Method for Manufacturing Semiconductor Device>

Next, a method for manufacturing the transistor 100 that is a semiconductor device of one embodiment of the present invention is described with reference to FIGS. 15A to 15F, FIGS. 16A to 16F, FIGS. 17A to 17F, and FIGS. 18A to 18F.

FIGS. 15A to 15F, FIGS. 16A to 16F, FIGS. 17A to 17F, and FIGS. 18A to 18F are cross-sectional views showing a method for manufacturing a semiconductor device. Cross-sectional views in the channel length direction are shown in FIGS. 15A, 15C, and 15E, FIGS. 16A, 16C, and 16E, FIGS. 17A, 17C, and 17E, and FIGS. 18A, 18C, and 18E. Cross-sectional views in the channel width direction are shown in FIGS. 15B, 15D, and 15F, FIGS. 16B, 16D, and 16F, FIGS. 17B, 17D, and 17F, and FIGS. 18B, 18D, and 18F.

First, a conductive film is formed over the substrate 102 and processed through a lithography process and an etching process, whereby the conductive film 104 functioning as a first gate electrode is formed. Then, the insulating films 106 and 107 which function as a first gate insulating film are formed over the conductive film 104 (see FIGS. 15A and 15B).

In this embodiment, a glass substrate is used as the substrate 102, and as the conductive film 104 functioning as a first gate electrode, a 100-nm-thick tungsten film is formed by a sputtering method. As the insulating film 106, a 400-nm-thick silicon nitride film is formed by a PECVD method. As the insulating film 107, a 50-nm-thick silicon oxynitride film is formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 (specifically the oxide semiconductor film 108b) formed later.

Next, an oxide semiconductor film 108b_0 and an oxide semiconductor film 108c_0 are formed over the insulating film 107 (see FIGS. 15C, 15D, 15E, and 15F).

Figure 15A:
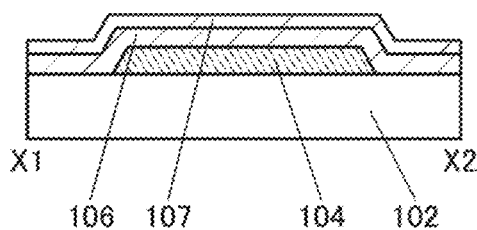
FIGS. 15A to 15F are cross-sectional views illustrating an example of a manufacturing process of a semiconductor device.
Figure 15B:
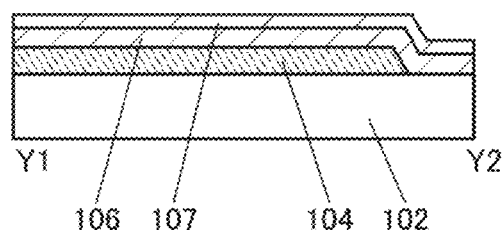
Figure 15C:
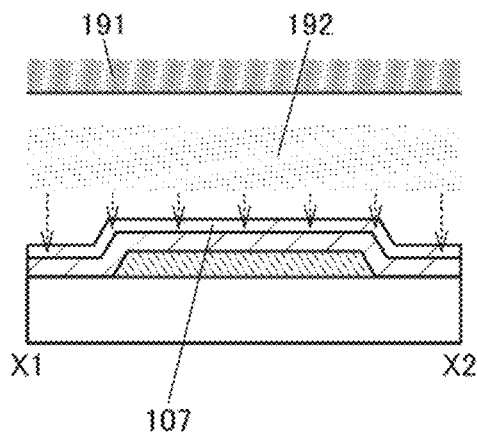
Figure 15D:
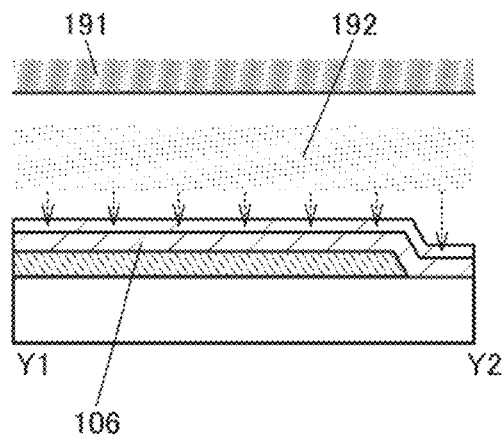
Figure 15E:
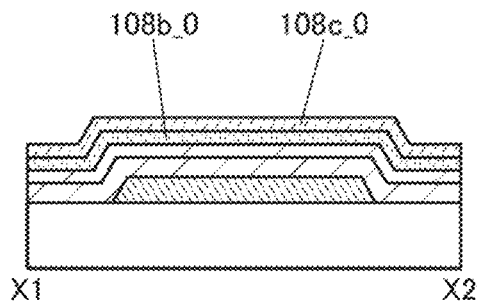
Figure 15F:
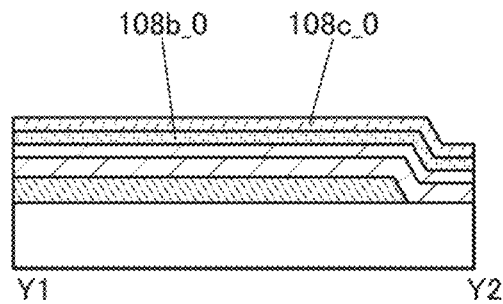

FIGS. 15C and 15D are schematic cross-sectional views showing an inner portion of a deposition apparatus when the oxide semiconductor film 108b_0 is formed over the insulating film 107. In FIGS. 15C and 15D, a sputtering apparatus is used as the deposition apparatus, and a target 191 placed inside the sputtering apparatus and plasma 192 formed under the target 191 are schematically shown.

When the oxide semiconductor film 108b_0 is formed, plasma discharge is performed in an atmosphere containing a first oxygen gas. At this time, oxygen is added to the insulating film 107 over which the oxide semiconductor film 108b_0 is to be formed. When the oxide semiconductor film 108b_0 is formed, an inert gas (e.g., a helium gas, an argon gas, or a xenon gas) and the first oxygen gas may be mixed.

The first oxygen gas is mixed at least when the oxide semiconductor film 108b_0 is formed. The proportion of the first oxygen gas in a deposition gas for forming the oxide semiconductor film 108b_0 is higher than 0% and lower than or equal to 100%, preferably higher than or equal to 10% and lower than or equal to 100%, more preferably higher than or equal to 30% and lower than or equal to 100%.

In FIGS. 15C and 15D, oxygen or excess oxygen added to the insulating film 107 is schematically shown by arrows of broken lines.

The oxide semiconductor films 108b_0 and 108c_0 may be formed at the same substrate temperature or different substrate temperatures. Note that the oxide semiconductor films 108b_0 and 108c_0 are preferably formed at the same substrate temperature, in which case the manufacturing cost can reduced.

The oxide semiconductor film 108 is formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C., for example. The oxide semiconductor film 108 is formed while being heated, so that the crystallinity of the oxide semiconductor film 108 can be increased. On the other hand, in the case where a large-sized glass substrate (e.g., the 6th generation to the 10th generation) is used as the substrate 102 and the oxide semiconductor film 108 is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film 108 at a substrate temperature higher than or equal to 100° C. and lower than 150° C.

In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

When the oxide semiconductor film is formed by a sputtering method, each chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide semiconductor film are removed as much as possible. Alternatively, a turbo molecular pump and a cold trap are preferably combined so as to prevent a backflow of a gas, especially a gas containing carbon or hydrogen from an exhaust system to the inside of the chamber.

After the oxide semiconductor film 108b 0 is formed, the oxide semiconductor film 108c_0 is successively formed over the oxide semiconductor film 108b_0. Note that when the oxide semiconductor film 108c_0 is formed, plasma discharge is performed in an atmosphere containing a second oxygen gas.

Note that the proportion of the first oxygen gas for forming the oxide semiconductor film 108b_0 may be the same as or different from the proportion of the second oxygen gas for forming the oxide semiconductor film 108c_0. For example, the proportion of the second oxygen gas in a deposition gas for forming the oxide semiconductor film 108c_0 is higher than 0% and lower than or equal to 100%, preferably higher than or equal to 10% and lower than or equal to 100%, more preferably higher than or equal to 30% and lower than or equal to 100%.

Note that in the case where the second oxygen gas and an argon gas are used when the oxide semiconductor film 108c_0 is formed, the flow rate of the argon gas is preferably higher than the flow rate of the second oxygen gas. When the flow rate of the argon gas is set higher, a dense film can be formed as the oxide semiconductor film 108c_0. Alternatively, the substrate temperature when the oxide semiconductor film 108c_0 is formed is set high, typically 250° C. or lower, preferably higher than or equal to 150° C. and lower than or equal to 190° C. to form a dense film as the oxide semiconductor film 108c 0. The dense film formed as the oxide semiconductor film 108c_0 can suppress entry of a metal element contained in the conductive films 112a and 112b into the oxide semiconductor film 108b 0.

In this embodiment, the oxide semiconductor film 108b_0 is formed by a sputtering method using an In—Ga—Zn metal oxide target (In:Ga:Zn=4:2:4.1 [atomic ratio]) and then the oxide semiconductor film 108c_0 is successively formed in a vacuum by a sputtering method using an In—Ga—Zn metal oxide target (In:Ga:Zn=1:1:1.2 [atomic ratio]). The substrate temperature when the oxide semiconductor film 108b_0 is formed is set to 170° C., and the substrate temperature when the oxide semiconductor film 108c_0 is formed is set to 170° C. As the deposition gas for forming the oxide semiconductor film 108b_0, an oxygen gas at a flow rate of 60 sccm and an argon gas at a flow rate of 140 sccm are used. As the deposition gas for forming the oxide semiconductor film 108c_0, an oxygen gas at a flow rate of 100 sccm and an argon gas at a flow rate of 100 sccm are used.

Figure 16A:
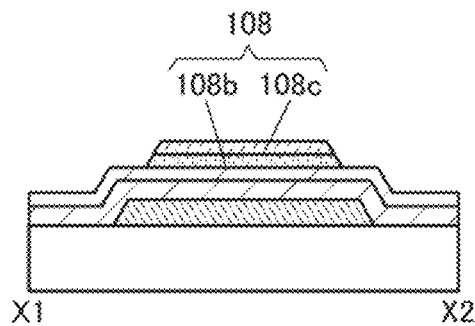
FIGS. 16A to 16F are cross-sectional views illustrating an example of a manufacturing process of a semiconductor device.
Figure 16B:
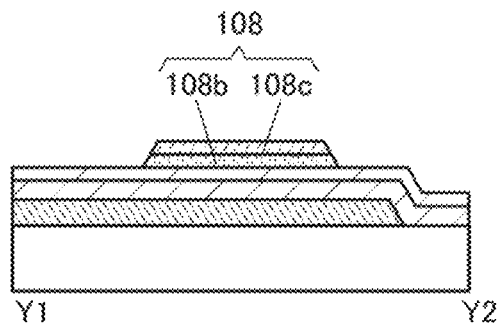

Next, the oxide semiconductor film 108b_0 and the oxide semiconductor film 108c_0 are processed into desired shapes, so that the island-shaped oxide semiconductor films 108b and 108c are formed (see FIGS. 16A and 16B).

Figure 16C:
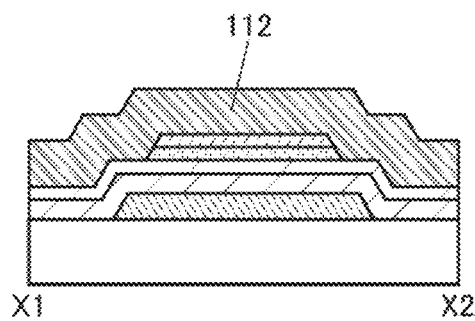
Figure 16D:
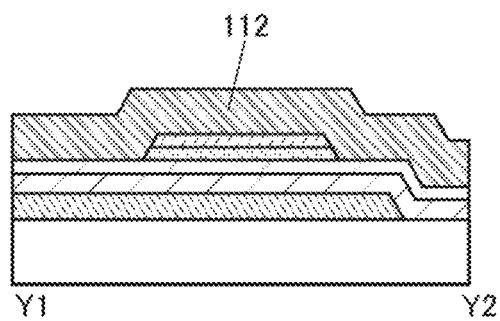

Next, a conductive film 112 to be a source electrode and a drain electrode is formed over the insulating film 107 and the oxide semiconductor film 108 by a sputtering method (see FIGS. 16C and 16D).

In this embodiment, as the conductive film 112, a stacked film in which a 50-nm-thick tungsten film and a 400-nm-thick aluminum film are sequentially stacked is formed by a sputtering method. Although the conductive film 112 have a two-layer structure in this embodiment, one embodiment of the present invention is not limited thereto. For example, the conductive film 112 may have a three-layer structure in which a 50-nm-thick tungsten film, a 400-nm-thick aluminum film, and a 100-nm-thick titanium film are sequentially stacked.

Figure 16E:
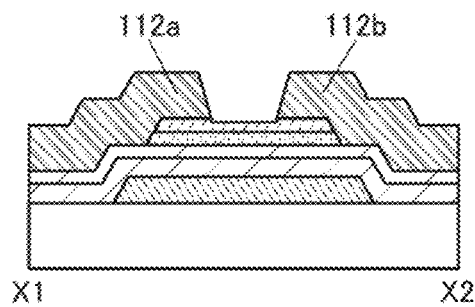
Figure 16F:
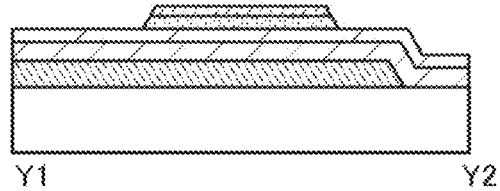

Next, the conductive film 112 is processed into desired shapes, so that the separate conductive films 112a and 112b are formed (see FIGS. 16E and 16F).

In this embodiment, the conductive film 112 is processed with a dry etching apparatus. Note that the method for processing the conductive film 112 is not limited thereto, and a wet etching apparatus may be used, for example. When the conductive film 112 is processed, a finer pattern can be formed with a dry etching apparatus than with a wet etching apparatus. On the other hand, the conductive film 112 can be processed with a wet etching apparatus at lower manufacturing cost than with a dry etching apparatus.

After the conductive films 112a and 112b are formed, a surface (on the back channel side) of the oxide semiconductor film 108 (specifically, the oxide semiconductor film 108c) may be cleaned. The cleaning may be performed, for example, using a chemical solution such as phosphoric acid. The cleaning using a chemical solution such as a phosphoric acid can remove impurities (e.g., an element included in the conductive films 112a and 112b) attached to the surface of the oxide semiconductor film 108c. Note that the cleaning is not necessarily performed, and thus the cleaning may be unnecessary.

In the step of forming the conductive films 112a and 112b and/or the cleaning step, the thickness of a region of the oxide semiconductor film 108 which is not covered by the conductive films 112a and 112b might be reduced.

Figure 17A:
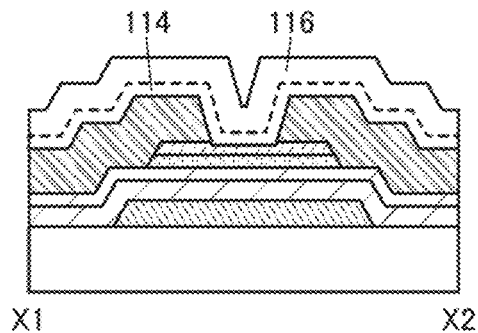
FIGS. 17A to 17F are cross-sectional views illustrating an example of a manufacturing process of a semiconductor device.
Figure 17B:
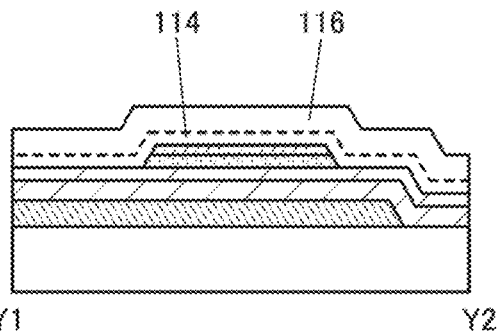
Figure 17C:
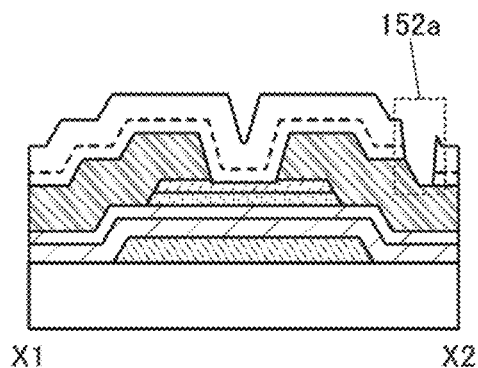
Figure 17D:
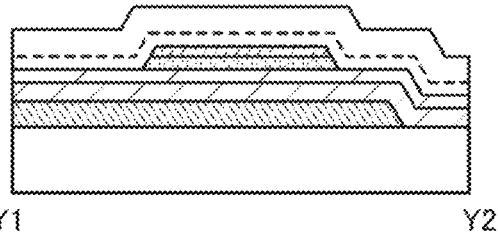

Next, the insulating films 114 and 116 are formed over the oxide semiconductor film 108 and the conductive films 112a and 112b (see FIGS. 17A and 17B).

Note that after the insulating film 114 is formed, the insulating film 116 is preferably formed in succession without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancies in the oxide semiconductor film 108 can be reduced.

As the insulating film 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. As a typical example, it is possible to form an oxide insulating film in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor 100 can be improved.

Heat treatment (hereinafter referred to as first heat treatment) is preferably performed after the insulating films 114 and 116 are formed. The first heat treatment can reduce nitrogen oxide contained in the insulating films 114 and 116. By the first heat treatment, part of oxygen contained in the insulating films 114 and 116 can be moved to the oxide semiconductor film 108, so that the amount of oxygen vacancies included in the oxide semiconductor film 108 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, and the like). Note that an electric furnace, rapid thermal anneal (RTA), or the like can be used for the heat treatment, in which it is preferable that hydrogen, water, and the like not be contained in the nitrogen, oxygen, ultra-dry air, or a rare gas.

Next, a mask is formed over the insulating film 116 through a lithography process, and an opening 152a is formed in desired regions in the insulating film 114 and 116. Note that the opening 152a is formed to reach the conductive film 112b (see FIGS. 17C and 17D).

Next, an oxide semiconductor film 120 is formed over the insulating film 116 to cover the opening 152a (see FIGS. 17E and 17F and FIGS. 18A and 18B).

Figure 17E:
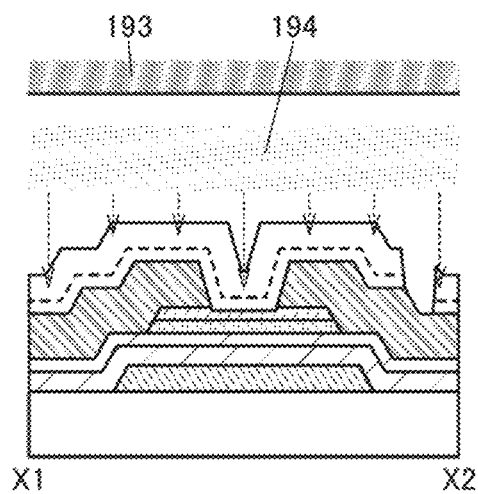
Figure 17F:
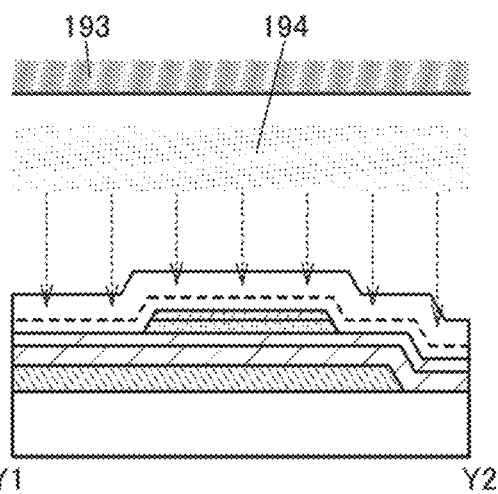

FIGS. 17E and 17F are schematic cross-sectional views showing an inner portion of a deposition apparatus when the oxide semiconductor film 120 is formed over the insulating film 116. In FIGS. 17E and 17F, a sputtering apparatus is used as the deposition apparatus, and a target 193 placed inside the sputtering apparatus and plasma 194 formed under the target 193 are schematically shown.

When the oxide semiconductor film 120 is formed, plasma discharge is performed in an atmosphere containing a third oxygen gas. At this time, oxygen is added to the insulating film 116 over which the oxide semiconductor film 120 is to be formed. When the oxide semiconductor film 120 is formed, an inert gas (e.g., a helium gas, an argon gas, or a xenon gas) and the third oxygen gas may be mixed. For example, it is preferable to use the argon gas and the third oxygen gas with the flow rate higher than the flow rate of the argon gas. When the flow rate of the third oxygen gas is set higher, oxygen can be favorably added to the insulating film 116. As an example of the formation conditions of the oxide semiconductor film 120, the proportion of the third oxygen gas in a whole deposition gas is higher than or equal to 50% and lower than or equal to 100%, preferably higher than or equal to 80% and lower than or equal to 100%.

In FIGS. 17E and 17F, oxygen or excess oxygen added to the insulating film 116 is schematically shown by arrows of broken lines.

The oxide semiconductor film 120 is formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film 120 is formed while being heated, so that the crystallinity of the oxide semiconductor film 120 can be increased. On the other hand, in the case where a large-sized glass substrate (e.g., the 6th generation to the 10th generation) is used as the substrate 102 and the oxide semiconductor film 120 is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film 120 at a substrate temperature higher than or equal to 100° C. and lower than 150° C.

In this embodiment, the oxide semiconductor film 120 is formed by a sputtering method using an In—Ga—Zn metal oxide target (In:Ga:Zn=4:2:4.1 [atomic ratio]). The substrate temperature when the oxide semiconductor film 120 is formed is set to 170° C. As the deposition gas for forming the oxide semiconductor film 120, an oxygen gas at a flow rate of 100 sccm is used.

The oxide semiconductor film 120 is not limited to the above-described composition, and the above-described oxide semiconductor film (with an atomic ratio of In:Ga:Zn=1:1:1, In:Ga:Zn=1:3:2, In:Ga:Zn=1:3:4, In:Ga:Zn=1:3:6, In:Ga:Zn=3:1:2, or In:Ga:Zn=4:2:3, for example) may be used.

The oxide semiconductor film 120 formed in an atmosphere containing the third oxygen gas enables the insulating film 116 to contain oxygen or excess oxygen in the vicinity of its surface.

Figure 18A:
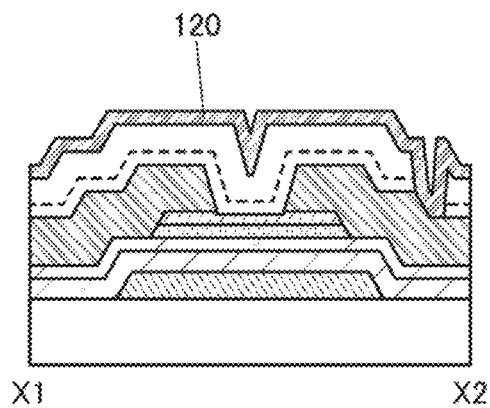
FIGS. 18A to 18F are cross-sectional views illustrating an example of a manufacturing process of a semiconductor device.
Figure 18B:
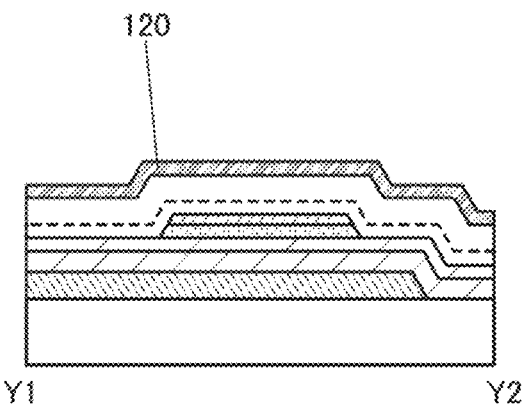
Figure 18C:
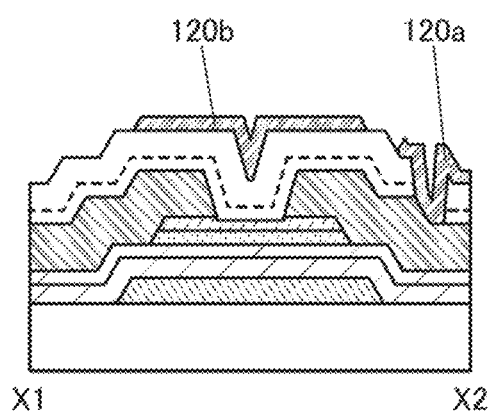
Figure 18D:
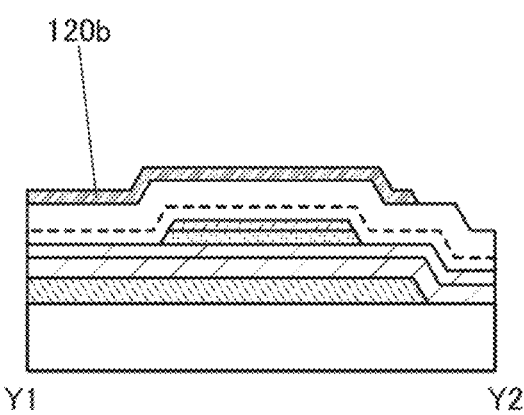

Next, the oxide semiconductor film 120 is processed into a desired shape, so that the island-shaped oxide semiconductor films 120a and 120b are formed (see FIGS. 18C and 18D).

Figure 18E:
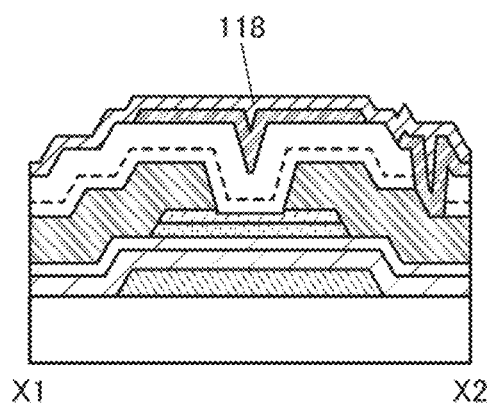
Figure 18F:
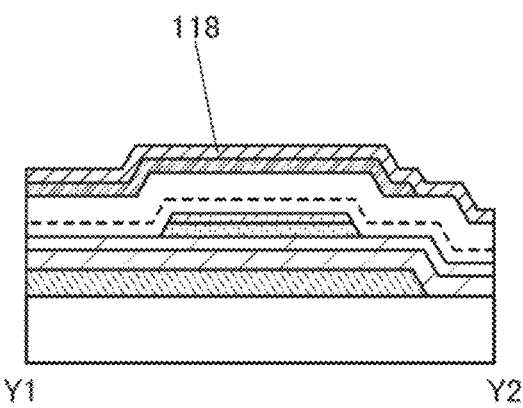

Next, the insulating film 118 is formed over the insulating film 116 and the oxide semiconductor films 120a and 120b (see FIGS. 18E and 18F).

The insulating film 118 includes one or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

After the insulating film 118 is formed, heat treatment similar to the first heat treatment (hereinafter referred to as second heat treatment) may be performed.

Through such heat treatment at lower than 400° C., preferably lower than 375° C., further preferably higher than or equal to 180° C. and lower than or equal to 350° C. after the addition of oxygen to the insulating film 116 when the oxide semiconductor film 120 is formed, oxygen or excess oxygen in the insulating film 116 can be moved to the oxide semiconductor film 108 (particularly, the oxide semiconductor film 108b) and compensate oxygen vacancies in the oxide semiconductor film 108. Consequently, a region with a high oxygen concentration can be formed in the vicinity of the surface of the oxide semiconductor film 108.

Figure 19A:
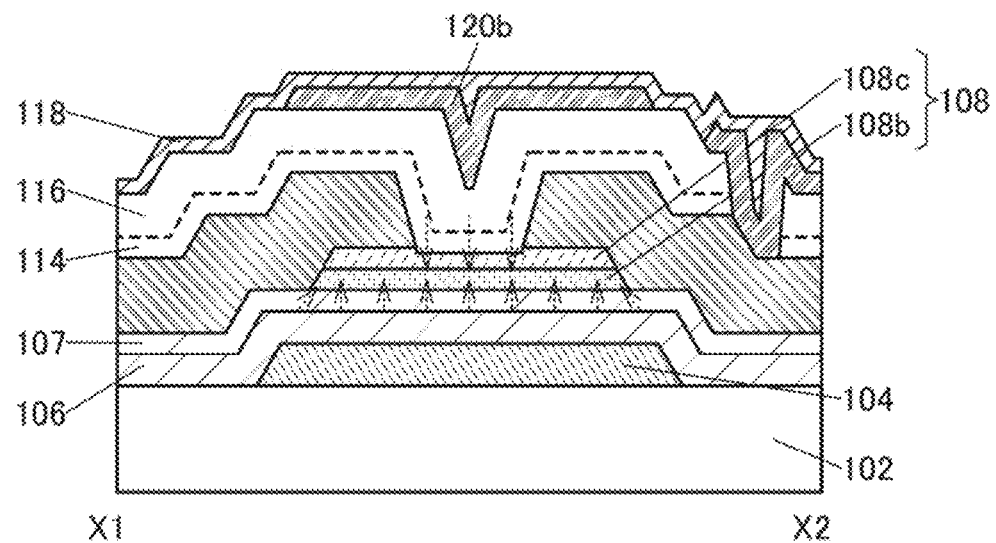
FIGS. 19A and 19B are model diagrams illustrating oxygen moving in an oxide semiconductor film.
Figure 19B:
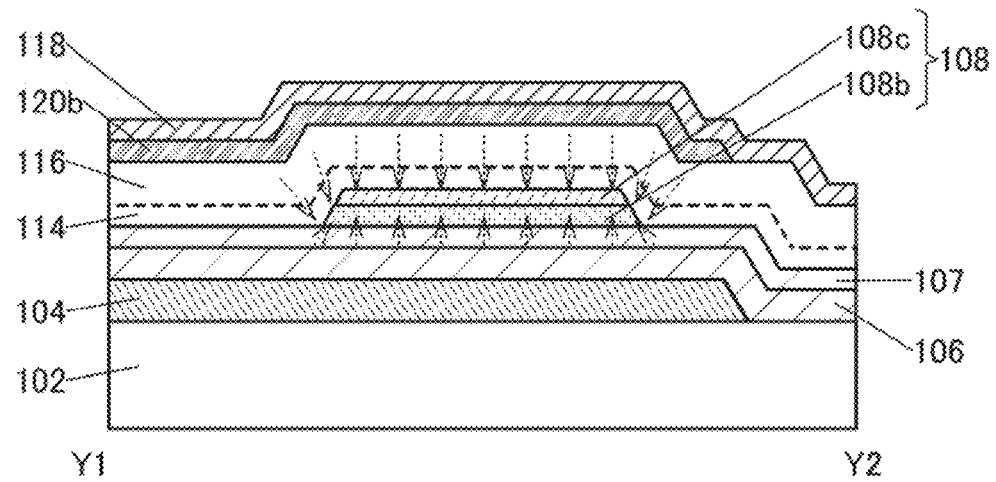

Oxygen moved to the oxide semiconductor film 108 is described with reference to FIGS. 19A and 19B. FIGS. 19A and 19B are model diagrams illustrating oxygen moved to the oxide semiconductor film 108 due to the substrate temperature at the time of forming the insulating film 118 (typically, lower than 375° C.) or the second heat treatment after the formation of the insulating film 118 (typically, lower than 375° C.). In FIGS. 19A and 19B, oxygen (oxygen radicals, oxygen atoms, or oxygen molecules) in the oxide semiconductor film 108 are shown by arrows of broken lines.

In the oxide semiconductor film 108 in FIGS. 19A and 19B, oxygen vacancies are compensated with oxygen moved from films in contact with the oxide semiconductor film 108 (here, the insulating film 107 and the insulating film 114). Specifically, in the semiconductor device of one embodiment of the present invention, the insulating film 107 includes an excess oxygen region because an oxygen gas is used at the time of forming the oxide semiconductor film 108b by sputtering and oxygen is added to the insulating film 107. Furthermore, the insulating film 116 includes an excess oxygen region because an oxygen gas is used at the time of forming the oxide semiconductor film 120 by sputtering and oxygen is added to the insulating film 116. In the oxide semiconductor film 108 between the insulating films including the excess oxygen regions, oxygen vacancies can be favorably compensated.

Furthermore, the insulating film 106 is provided under the insulating film 107, and the insulating film 118 is provided over the insulating films 114 and 116. When the insulating films 106 and 118 are formed using a material having low oxygen permeability, e.g., silicon nitride, oxygen contained in the insulating films 107, 114, and 116 can be confined to the oxide semiconductor film 108 side; thus, oxygen can be favorably moved to oxygen vacancies that might be formed in the oxide semiconductor film 108.

A side edge portion of the oxide semiconductor film 108 is electrically covered with the conductive film 104 serving as a first gate electrode and the oxide semiconductor film 120b serving as a second gate electrode. Electrically covering the oxide semiconductor film 108 including reduced oxygen vacancies with upper and lower electrodes can achieve a highly reliable semiconductor device.

The insulating film 118 includes one or both of hydrogen and nitrogen. Thus, one or both of hydrogen and nitrogen is added to the oxide semiconductor films 120a and 120b in contact with the formed insulating film 118, so that the oxide semiconductor films 120a and 120b have high carrier density and can function as oxide conductive films.

In the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, more preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Note that in this embodiment, hydrogen or nitrogen is added from the insulating film 118 to the oxide semiconductor films 120a and 120b to increase the carrier density of the oxide semiconductor films 120a and 120b; however, a method for increasing the carrier density of the oxide semiconductor films 120a and 120b is not limited thereto. For example, treatment for adding an impurity element to the oxide semiconductor films 120a and 120b may be performed to increase the carrier density of the oxide semiconductor films 120a and 120b.

Typical examples of the impurity element are hydrogen, boron, carbon, nitrogen, fluorine, aluminum, silicon, phosphorus, chlorine, and rare gas elements. Typical examples of rare gas elements are helium, neon, argon, krypton, and xenon. When the impurity element is added to the oxide semiconductor film, a bond between a metal element and oxygen in the oxide semiconductor film is cut, whereby an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, carrier density is increased in the oxide semiconductor film, and the oxide semiconductor film has higher conductivity.

Through the above process, the transistor 100 illustrated in FIGS. 5B and 5C can be manufactured.

The transistor 100 has a bottom-gate structure; therefore, the production line of amorphous silicon is used, for example, so that the transistor 100 can be manufactured without investing in equipment or with extremely small investing in equipment.

In the entire manufacturing process of the transistor 100, the substrate temperature is preferably lower than 400° C., further preferably lower than 375° C., still further preferably higher than or equal to 180° C. and lower than or equal to 350° C. because the change in shape of the substrate (distortion or warp) can be reduced even when a large-sized substrate is used. As typical examples of a step in which the substrate temperature is increased in the manufacturing process of the transistor 100, the following are given: the substrate temperature in the formation of the insulating films 106 and 107 (lower than 400° C., preferably higher than or equal to 250° C. and lower than or equal to 350° C.), the substrate temperature in the formation of the oxide semiconductor film 108 (higher than or equal to room temperature and lower than 340° C., preferably higher than or equal to 100° C. and lower than or equal to 200° C., further preferably higher than or equal to 100° C. and lower than 150° C.), the substrate temperature in the formation of the insulating films 116 and 118 (lower than 400° C., preferably lower than 375° C., further preferably higher than or equal to 180° C. and lower than or equal to 350° C.), and the first heat treatment or the second heat treatment (lower than 400° C., preferably lower than 375° C., further preferably higher than or equal to 180° C. and lower than or equal to 350° C.).

In the above-described manufacturing method, the oxide semiconductor film 120 is formed over the insulating film 116, and oxygen is added to the insulating film 116 when the oxide semiconductor film 120 is formed. However, one embodiment of the present invention is not limited to this example.

For example, a manufacturing method shown in FIGS. 20A to 20F and FIGS. 21A to 21D may be used. FIGS. 20A to 20F and FIGS. 21A to 21D are cross-sectional views illustrating a method for manufacturing a semiconductor device. FIGS. 20A, 20C, and 20E and FIGS. 21A and 2C are cross-sectional views in the channel length direction. FIGS. 20B, 20D, and 20F and FIGS. 21B and 21D are cross-sectional views in the channel width direction.

Figure 20A:
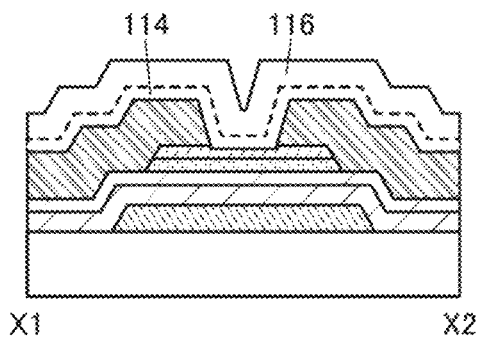
FIGS. 20A to 20F are cross-sectional views of an example of a manufacturing process of a semiconductor device.
Figure 20B:
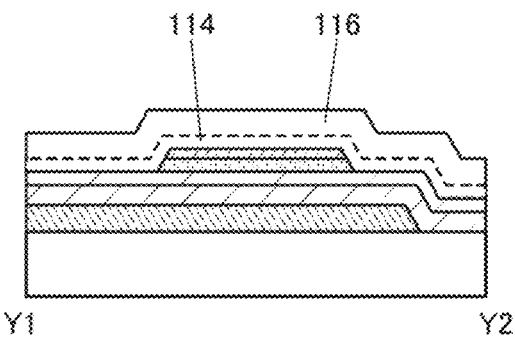

First, the steps up to FIGS. 16E and 16F are performed, and then, the insulating films 114 and 116 are formed over the oxide semiconductor film 108 and the conductive films 112a and 112b (see FIGS. 20A and 20B).

The first heat treatment is preferably performed after the insulating films 114 and 116 are formed. The first heat treatment can reduce nitrogen oxide included in the insulating films 114 and 116. By the first heat treatment, part of oxygen contained in the insulating films 114 and 116 can be moved to the oxide semiconductor film 108, so that the amount of oxygen vacancies included in the oxide semiconductor film 108 can be reduced.

Figure 20C:
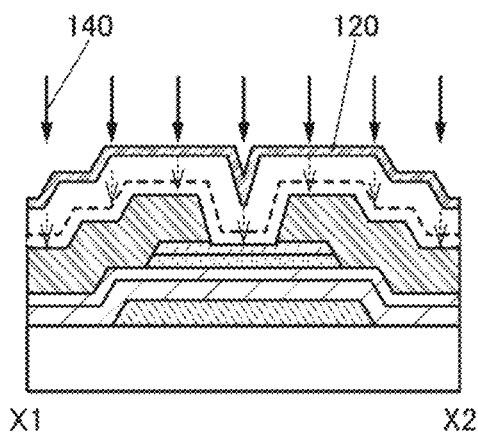
Figure 20D:
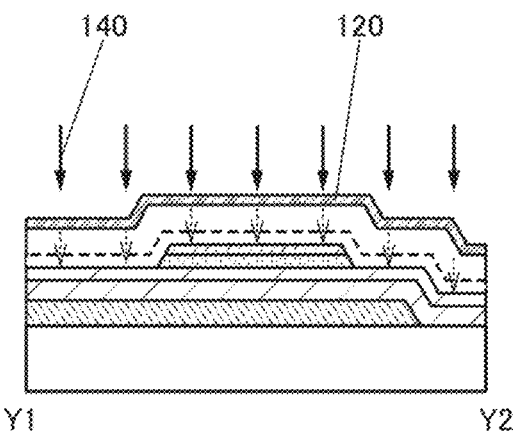

Then, the oxide semiconductor film 120 is formed over the insulating film 116, and oxygen 140 is added to the insulating film 116, the insulating film 114, or the oxide semiconductor film 108 through the oxide semiconductor film 120 (see FIGS. 20C and 20D).

In FIGS. 20C and 20D, oxygen added to the insulating film 114 or the insulating film 116 is schematically shown by arrows of broken lines. By the addition of the oxygen 140 to the insulating film 116 through the oxide semiconductor film 120, much oxygen can be added to the vicinity of the surface of the insulating film 116.

As a method for adding the oxygen 140 to the insulating film 116 through the oxide semiconductor film 120, an ion doping method, an ion implantation method, plasma treatment, or the like is given. Depending on the apparatus or conditions for adding the oxygen 140, the oxygen 140 can be added to the insulating film 114 or the oxide semiconductor film 108 under the insulating film 116 in some cases. The oxygen 140 may be excess oxygen, oxygen radicals, or the like. By the bias application to the substrate side when the oxygen 140 is added, the oxygen 140 can be effectively added to the insulating film 116. With the use of an ashing apparatus, for example, power density of the bias voltage applied to the ashing apparatus may be greater than or equal to 1 $W/cm^2$ and less than or equal to 5 $W/cm^2$. When the oxide semiconductor film 120 is provided over the insulating film 116 and then the oxygen 140 is added, the oxide semiconductor film 120 functions as a protective film for inhibiting release of oxygen from the insulating film 116. Thus, a larger amount of oxygen can be added to the insulating film 116.

After the oxygen 140 is added to the insulating film 116 through the oxide semiconductor film 120, heat treatment (hereinafter referred to as second heat treatment) may be performed. The second heat treatment can be performed under conditions similar to those of the first heat treatment.

Figure 20E:
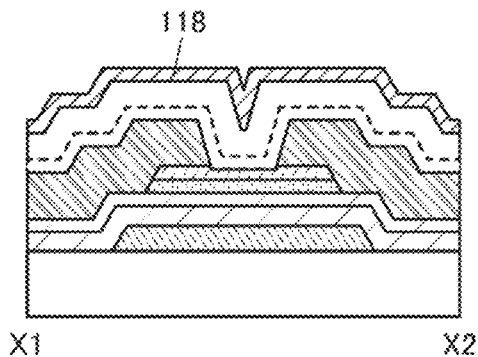
Figure 20F:
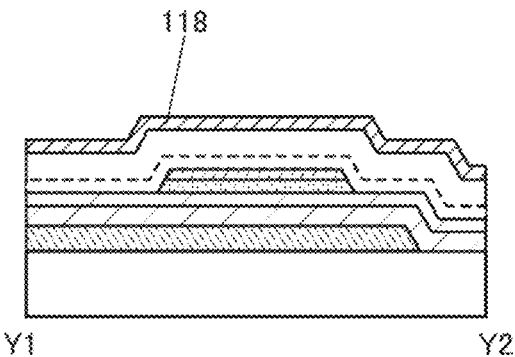

Next, the oxide semiconductor film 120 is removed to expose a surface of the insulating film 116, and then, the insulating film 118 is formed over the insulating film 116 (see FIGS. 20E and 20F).

When the oxide semiconductor film 120 is removed, part of the insulating film 116 is also removed in some cases. For example, dry etching, wet etching, or a combination thereof can be used for removing the oxide semiconductor film 120. In this embodiment, a wet etching method is used to remove the oxide semiconductor film 120. A wet etching method is preferably used as the method for removing the oxide semiconductor film 120 because of low manufacturing cost.

The insulating film 118 can be formed by a sputtering method or a PECVD method, for example. In the case where the insulating film 118 is formed by a PECVD method, for example, the substrate temperature is lower than 400° C., preferably lower than 375° C., further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

After the insulating film 118 is formed, heat treatment similar to the second heat treatment (hereinafter referred to as third heat treatment) may be performed. Through such heat treatment at lower than 400° C., preferably lower than 375° C., further preferably higher than or equal to 180° C. and lower than or equal to 350° C. after the addition of the oxygen 140 to the insulating film 116, oxygen or excess oxygen in the insulating film 116 can be moved to the oxide semiconductor film 108 (particularly, the oxide semiconductor film 108b) and compensate oxygen vacancies in the oxide semiconductor film 108.

Then, a mask is formed over the insulating film 118 through a lithography process, and the opening 152a is formed in a desired region in the insulating films 114, 116, and 118. In addition, a mask is formed over the insulating film 118 through a lithography process, and the openings 152b and 152c are formed in desired regions in the insulating films 106, 107, 114, 116, and 118. Note that the opening 152a is formed to reach the conductive film 112b. The openings 152b and 152c are formed to reach the conductive film 104 (see FIGS. 21A and 21B).

Note that the openings 152a, 152b, and 152c may be formed in the same step or may be formed by different steps. In the case where the openings 152a, 152b, and 152c are formed in the same step, for example, a gray-tone mask or a half-tone mask can be used. Moreover, the openings 152b and 152c may be formed in a plurality of steps. For example, openings are formed in the insulating films 106 and 107 in advance, and then, openings are formed in the insulating films 114, 116, and 118 over the openings.

Figure 21A:
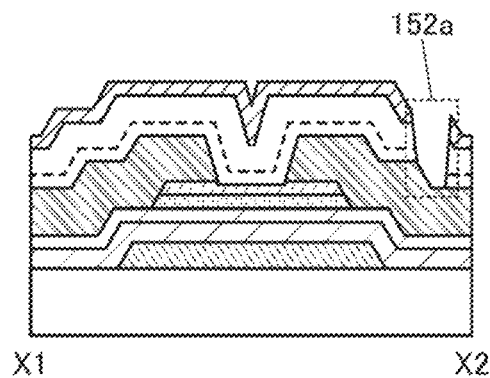
FIGS. 21A to 21D are cross-sectional views of an example of a manufacturing process of a semiconductor device and an example of a semiconductor device.
Figure 21B:
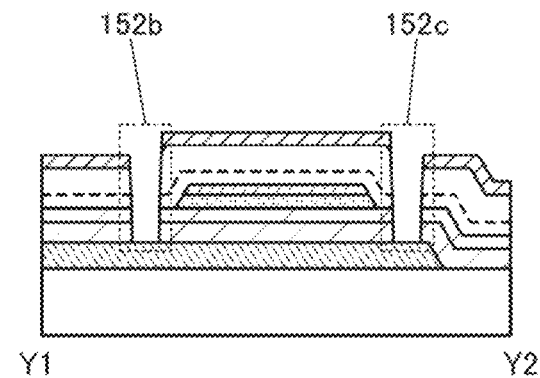
Figure 21C:
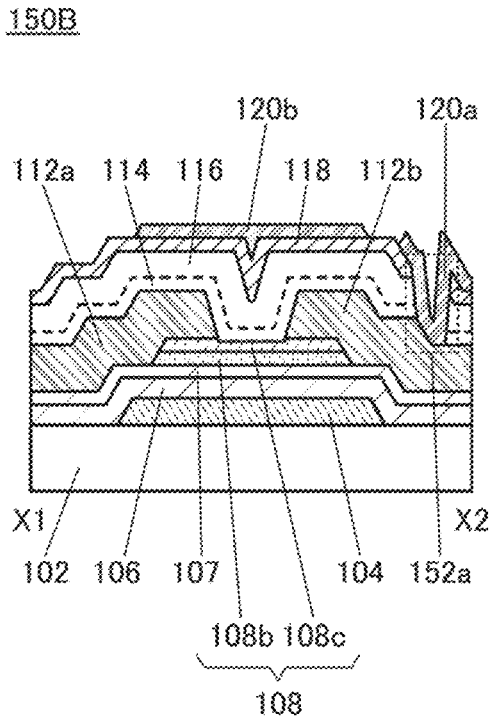
Figure 21D:
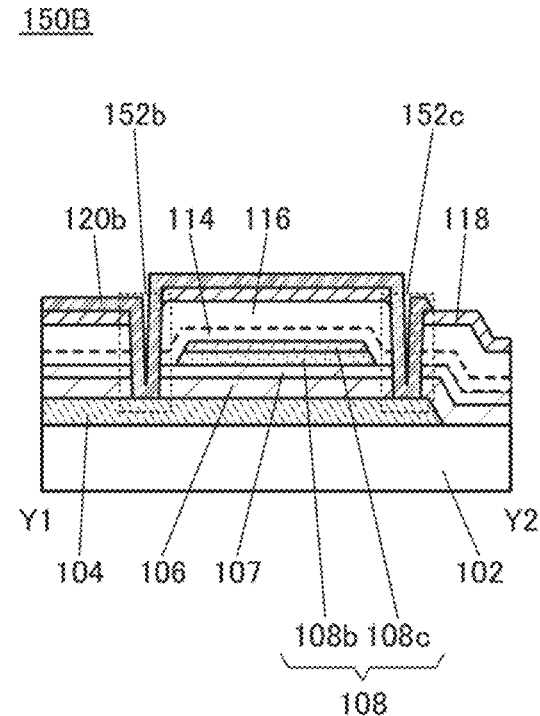

Next, a conductive film is formed over the insulating film 118 so as to cover the openings 152a, 152b, and 152c, and the conductive film is processed into a desired shape, so that the oxide semiconductor films 120a and 120b are formed (see FIGS. 21C and 21D).

Through the above steps, a transistor can be manufactured. Note that the cross-sectional views shown in FIGS. 21C and 21D also serve as the cross-sectional views of a transistor 150B that is a variation of the transistor 150.

Note that the structure and method described in this embodiment can be used in appropriate combination with the structure and method described in any of the other embodiments.

Embodiment 2

In this embodiment, a structure of an oxide semiconductor and the like are described with reference to FIGS. 22A to 22D, FIGS. 23A to 23D, FIGS. 24A to 24C, FIGS. 25A and 25B, FIG. 26, FIG. 27, FIGS. 28A to 28C, FIGS. 29A to 29F, FIGS. 30A to 30G, and FIGS. 31A to 31G.

<2-1. Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

As the oxide semiconductor film of one embodiment of the present invention, a CAAC-OS is particularly preferable among the above-described oxide semiconductors. When a CAAC-OS is used as the oxide semiconductor film, the crystallinity of the oxide semiconductor film can be increased, and impurities, oxygen vacancies, or the density of defect states in the oxide semiconductor film can be reduced.

<2-2. CAAC-OS>

First, a CAAC-OS will be described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a TEM, a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
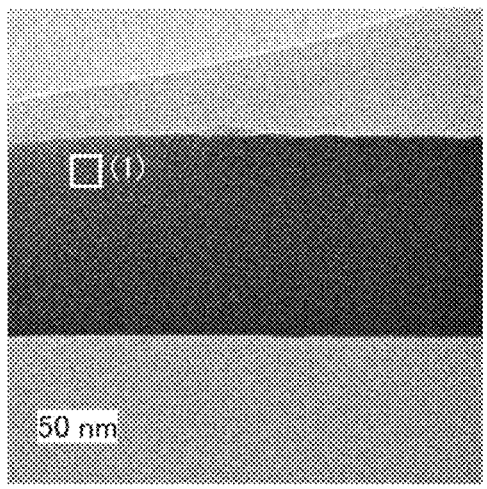
FIGS. 22A to 22D are Cs-corrected high-resolution TEM images of a cross section of a CAAC-OS and a cross-sectional schematic view of a CAAC-OS.

A CAAC-OS observed with TEM is described below. FIG. 22A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
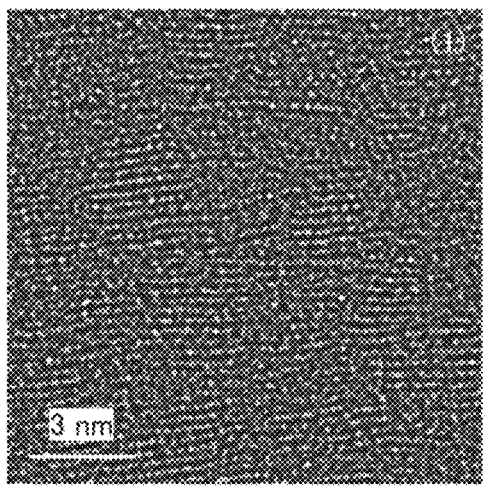

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which the CAAC-OS is formed (hereinafter, the surface is referred to as a formation surface) or the top surface of the CAAC-OS, and is arranged parallel to the formation surface or the top surface of the CAAC-OS.

Figure 22C:
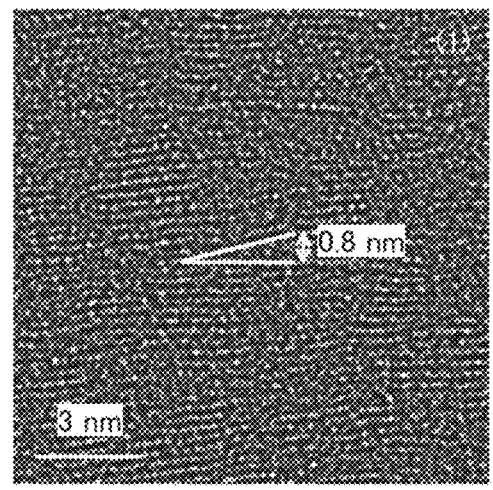

As shown in FIG. 22B, the CAAC-OS has a characteristic atomic arrangement. The characteristic atomic arrangement is denoted by an auxiliary line in FIG. 22C. FIGS. 22B and 22C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 22D:
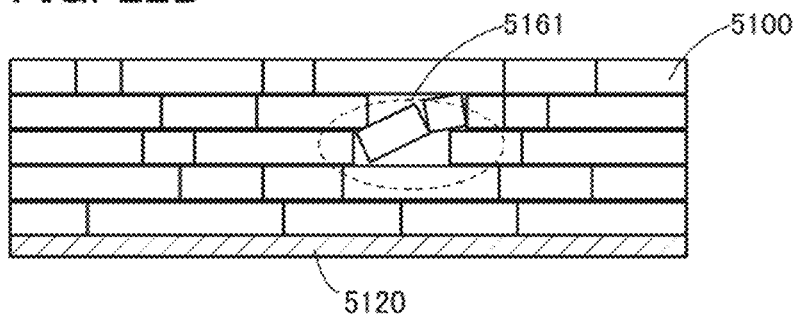

Here, according to the Cs-corrected high-resolution TEM images, the schematic arrangement of pellets 5100 of a CAAC-OS over a substrate 5120 is illustrated by such a structure in which bricks or blocks are stacked (see FIG. 22D). The part in which the pellets are tilted as observed in FIG. 22C corresponds to a region 5161 shown in FIG. 22D.

Figure 23A:
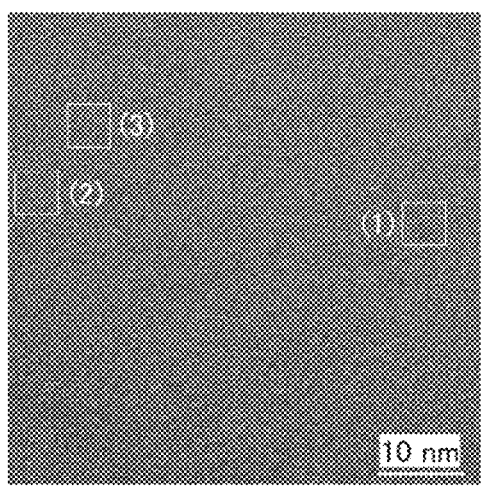
FIGS. 23A to 23D are Cs-corrected high-resolution TEM images of a plane of a CAAC-OS.
Figure 23B:
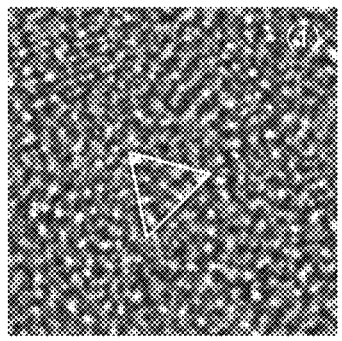
Figure 23C:
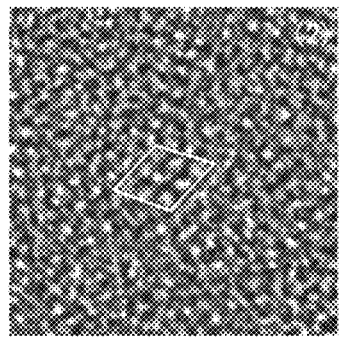
Figure 23D:
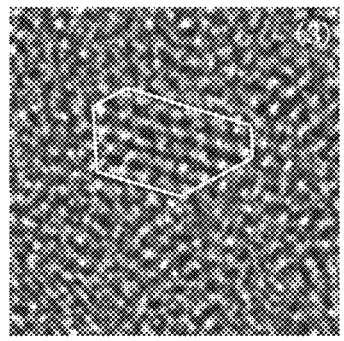

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
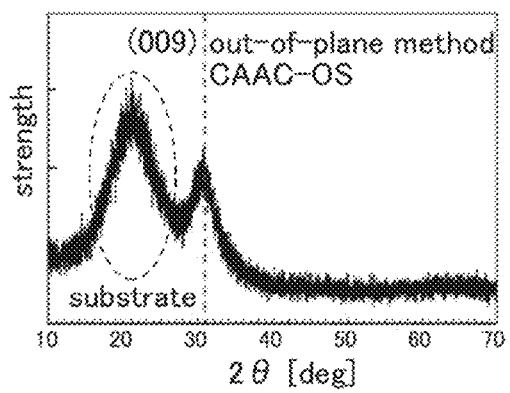
FIGS. 24A to 24C show structural analysis of a CAAC-OS and a single crystal oxide semiconductor by XRD.

Next, a CAAC-OS analyzed by XRD is described. For example, when the structure of a CAAC-OS including an InGaZnO$_4$ crystal is analyzed by an out-of-plane method, a peak appears at a diffraction angle (2θ) of around 31° as shown in FIG. 24A. This peak is assigned to the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 24B:
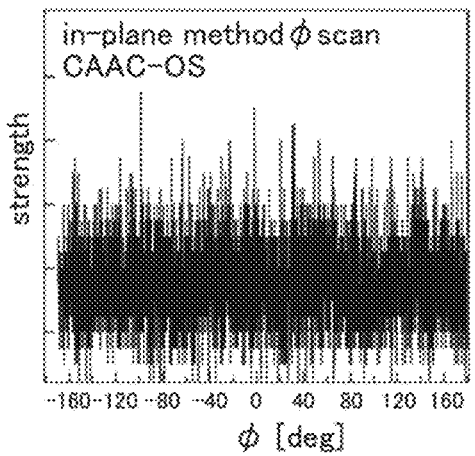
Figure 24C:
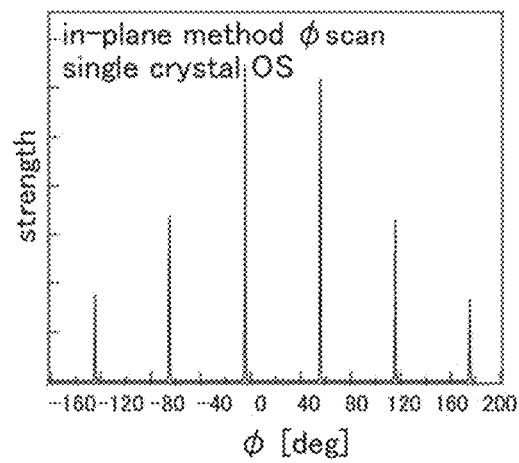

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when φ scan is performed with 2θ fixed at around 56°, as shown in FIG. 24C, six peaks which are assigned to crystal planes equivalent to the (110) plane are observed. Accordingly, the structural analysis using XRD shows that the directions of the a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 25A can be obtained. In this diffraction pattern, spots assigned to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be assigned to the (010) plane, the (100) plane, and the like of the InGaZnO$_4$ crystal. The second ring in FIG. 25B is considered to be assigned to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<2-3. nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<2-4. a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 26:
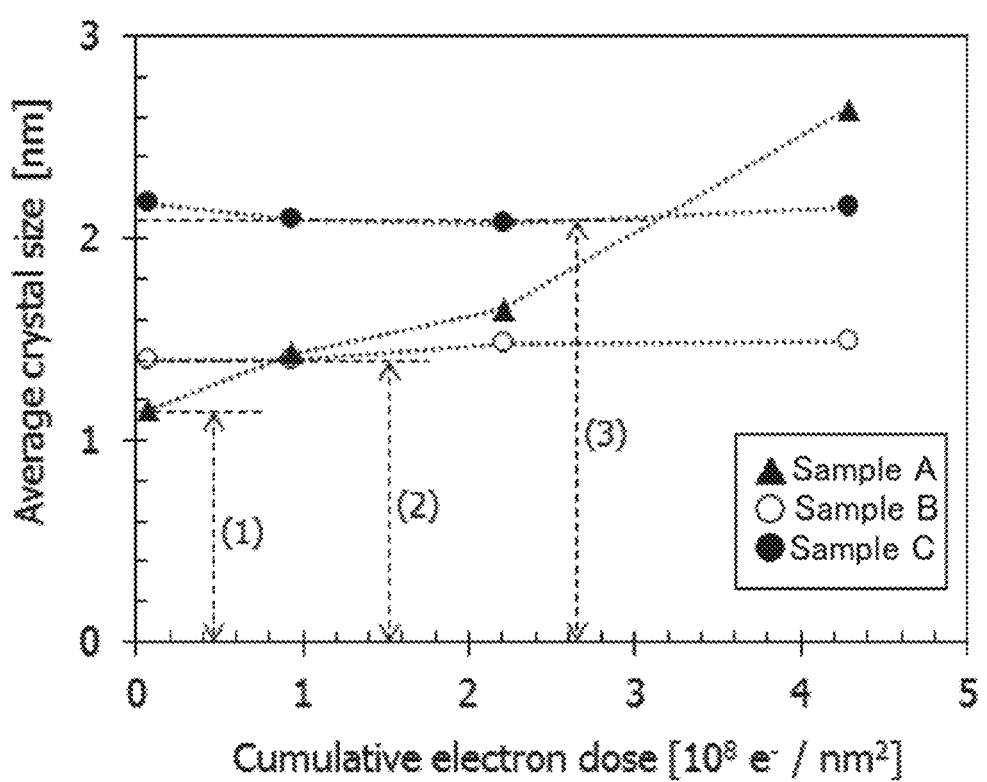
FIG. 26 shows a change of crystal parts of an In—Ga—Zn oxide owing to electron irradiation.

FIG. 26 shows change in the average size of crystal parts (at 22 points to 45 points) in each sample. Note that the crystal part size corresponds to the length of a lattice fringe. FIG. 26 indicates that the crystal part size in the a-like OS increases with an increase in the cumulative electron dose. Specifically, as shown by (1) in FIG. 26, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<2-5. Formation Method of CAAC-OS>

An example of a method for forming CAAC-OS will be described below.

Figure 27:
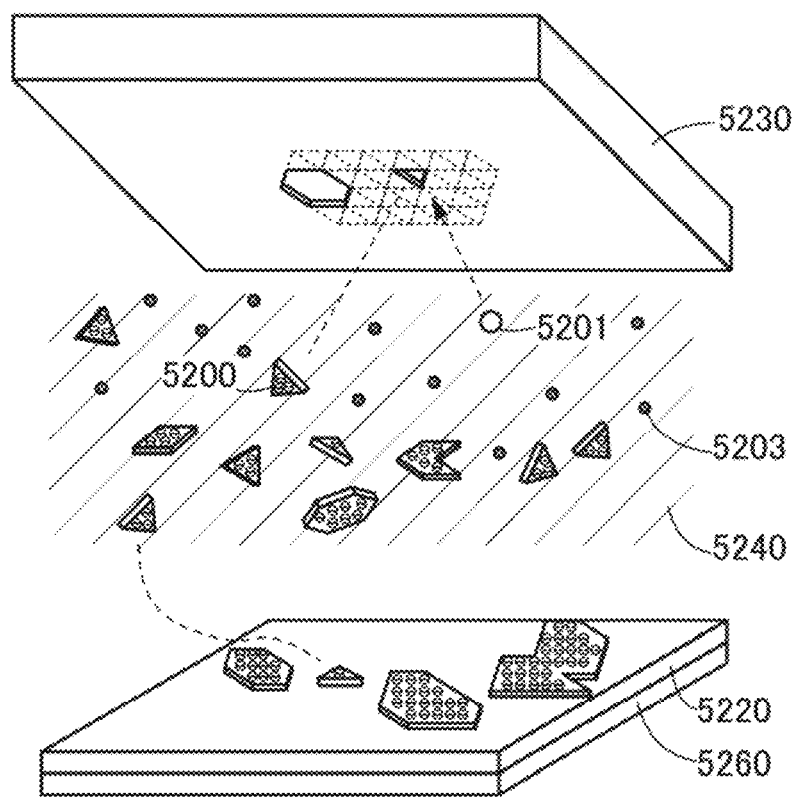
FIG. 27 shows a deposition method of a CAAC-OS.

FIG. 27 is a schematic view of the inside of a film formation chamber. The CAAC-OS can be formed by a sputtering method.

As shown in FIG. 27, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the deposition speed is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 28A:
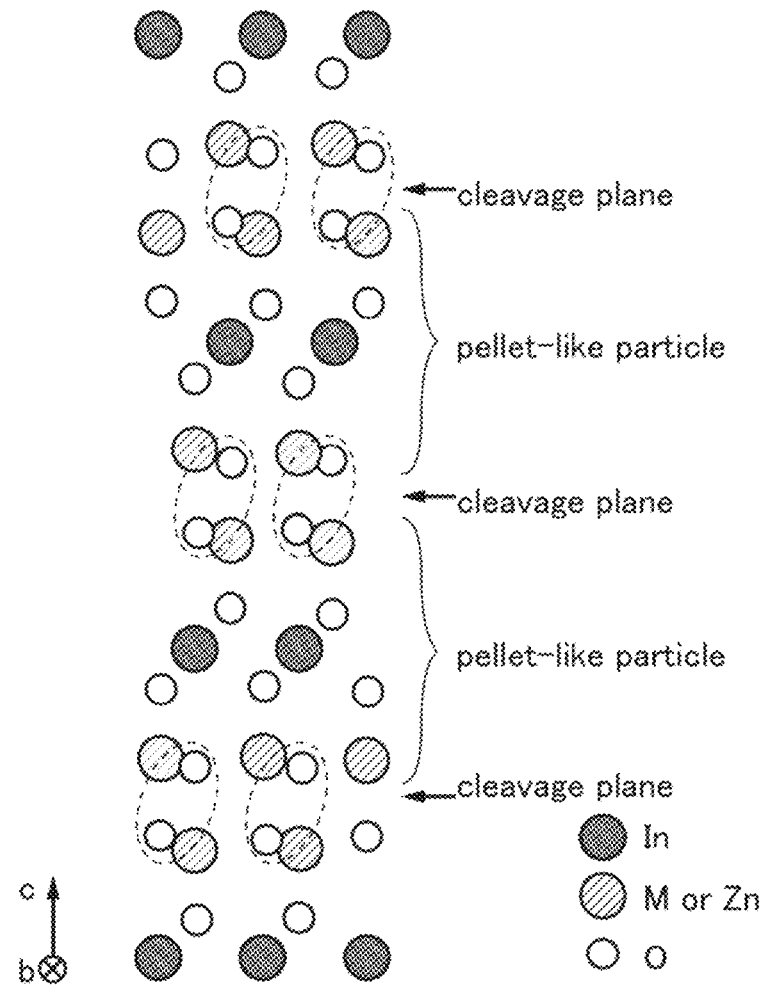
FIGS. 28A to 28C illustrate a crystal of $InMZnO_4$.
Figure 28B:
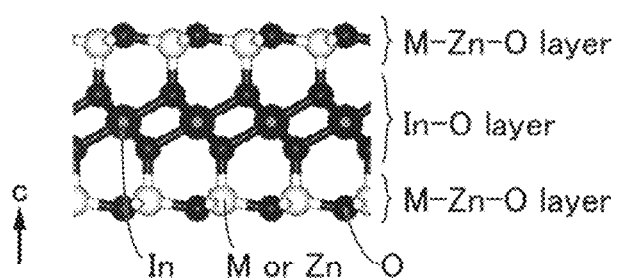
Figure 28C:
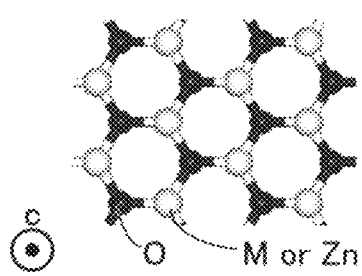

Here, the target 5230 has a polycrystalline structure which includes a plurality of crystal grains and in which a cleavage plane exists in any of the crystal grains. FIGS. 28A to 28C show a crystal structure of $InMZnO_4$ (the element M is Al, Ga, Y, or Sn, for example) included in the target 5230 as an example. Note that the crystal structure shown in FIG. 28A is $InMZnO_4$ observed from a direction parallel to a b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, the pellet 5200 which is a flat-plate-like or pellet-like sputtered particle is separated from the cleavage plane (see FIG. 27). The pellet 5200 corresponds to a portion between the two cleavage planes shown in FIG. 28A. Thus, when the pellet 5200 is observed, the cross-section thereof is as shown in FIG. 28B, and the top surface thereof is as shown in FIG. 28C. Note that the structure of the pellet 5200 may be distorted by an impact of collision of the ion 5201.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, the width of the pellet 5200 is, for example, greater than or equal to 1 nm and less than or equal to 100 nm, preferably greater than or equal to 2 nm and less than or equal to 50 nm, more preferably greater than or equal to 3 nm and less than or equal to 30 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach the surface of the substrate 5220. Note that part of the particle 5203 is sometimes discharged to the outside by a vacuum pump or the like because the particle 5203 is small in mass.

Next, deposition of the pellet 5200 and the particle 5203 over the surface of the substrate 5220 is described with reference to FIGS. 29A to 29F.

First, a first of the pellets 5200 is deposited over the substrate 5220. Since the pellet 5200 has a flat-plate-like shape, it is deposited so that the flat plane faces the surface of the substrate 5220. Here, a charge on a surface of the pellet 5200 on the substrate 5220 side is lost through the substrate 5220.

Next, a second of the pellets 5200 reaches the substrate 5220. Since a surface of the first pellet 5200 and a surface of the second pellet 5200 are charged, they repel each other. As a result, the second pellet 5200 avoids being deposited over the first pellet 5200, and is deposited with its flat plane facing the surface of the substrate 5220 so as to be a little distance away from the first pellet 5200. With repetition of this, millions of the pellets 5200 are deposited over the surface of the substrate 5220 to have a thickness of one layer. A region where no pellet 5200 is deposited is generated between adjacent pellets 5200 (see FIG. 29A).

Then, the particles 5203 that have received energy from plasma reach the surface of the substrate 5220. The particles 5203 cannot be deposited on an active region such as the surfaces of the pellets 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 29B).

Figure 29A:
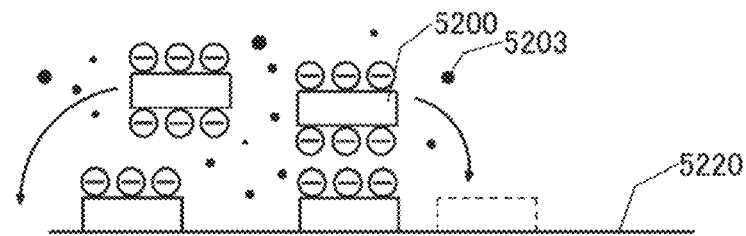
FIGS. 29A to 29F illustrate a deposition method of a CAAC-OS.
Figure 29B:
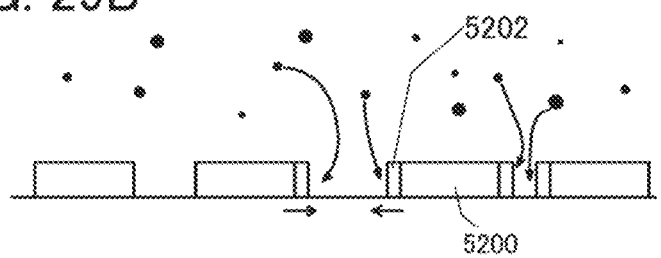
Figure 29C:
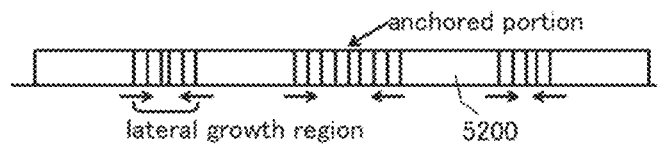

The lateral growth portions 5202 then further grow laterally so that the pellets 5200 are anchored to each other (see FIG. 29C). In this manner, the lateral growth portions 5202 are formed until they fill regions where no pellet 5200 is deposited. This mechanism is similar to a deposition mechanism for an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. Regions filling the gaps between the crystal regions are distorted crystal regions, and thus, it will not be appropriate to say that the regions have an amorphous structure.

Figure 29D:
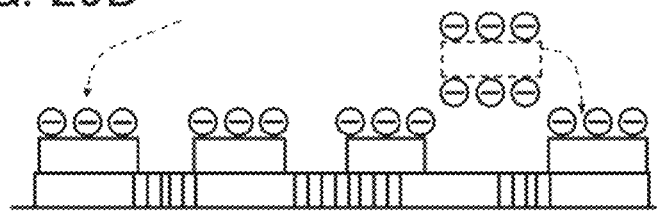
Figure 29E:
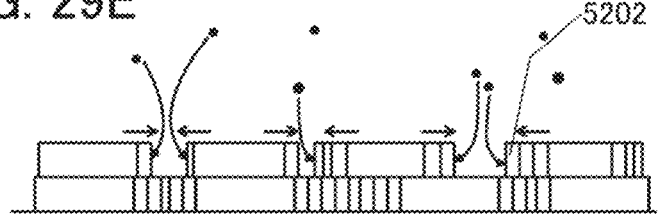
Figure 29F:
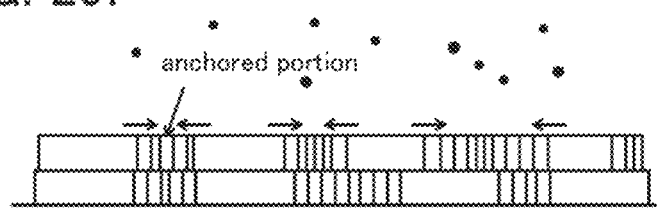

Next, new pellets 5200 are deposited with their flat planes facing the surface (see FIG. 29D). After that, the particles 5203 are deposited so as to fill regions where no pellet 5200 is deposited, thereby forming the lateral growth portions 5202 (see FIG. 29E). In such a manner, the particles 5203 are attached to side surfaces of the pellets 5200 and the lateral growth portions 5202 cause a lateral growth so that the pellets 5200 in the second layer are anchored to each other (see FIG. 29F). Deposition continues until the m-th layer (m is an integer of two or more) is formed; as a result, a stacked-layer thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. Therefore, even when a large-sized substrate of the 8th generation or more is used as the substrate 5220, a warp or the like due to the deposition of the CAAC-OS hardly occurs.

In contrast, if the surface temperature of the substrate 5220 is low, the migration of the pellets 5200 over the substrate 5220 does not easily occur. As a result, the pellets 5200 are stacked to form an nc-OS or the like with low orientation. In the nc-OS, the pellets 5200 are possibly deposited with certain gaps when the pellets 5200 are negatively charged. Therefore, the nc-OS has low orientation but some regularity, and thus it has a denser structure than an amorphous oxide semiconductor.

When spaces between pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are considered to be deposited on the surface of the substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be formed.

In addition, even when the surface of the substrate (formation surface) has an uneven shape, the pellets are aligned along the shape.

The above-described deposition model suggests that a CAAC-OS with high crystallinity can be formed in the following manner: deposition is performed in a high vacuum to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In-M-Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the targets are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

<2-6. Lateral Growth>

The following description explains that a lateral growth occurs when the particles 5203 are attached to (bonded to or adsorbed on) the pellet 5200 laterally.

Figure 30A:
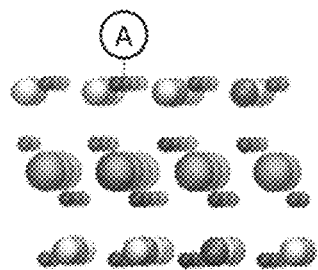
FIGS. 30A to 30G are diagrams showing positions where a particle is attached to a pellet.
Figure 30B:
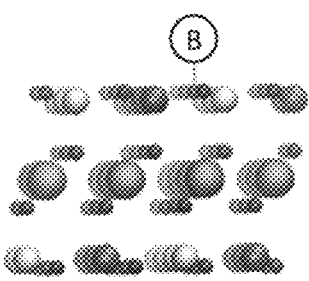
Figure 30C:
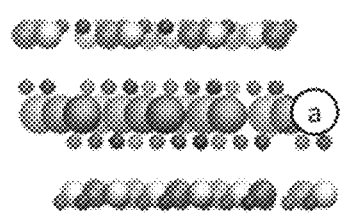
Figure 30D:
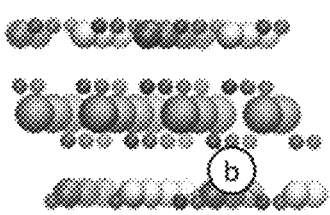
Figure 30E:
Figure 30F:
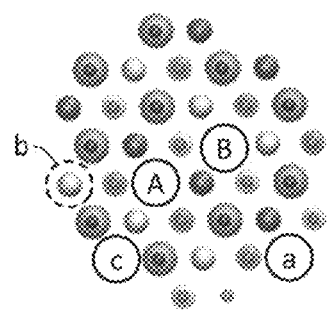
Figure 30G:
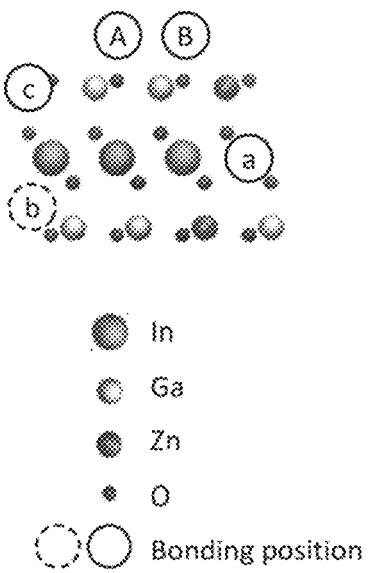

FIGS. 30A to 30E illustrate a structure of the pellet 5200 and positions to which metal ions can be attached. A model assumed as the pellet 5200 is a cluster model with 84 atoms extracted from an InMZnO$_4$ crystal structure with a constant stoichiometric composition. The case where the element M is Ga is described below. FIG. 30F illustrates a structure of the pellet 5200 seen in the direction parallel to the c-axis. FIG. 30G illustrates a structure of the pellet 5200 seen in the direction parallel to the a-axis.

The positions to which metal ions can be attached are represented as a position A, a position B, a position a, a position b, and a position c. The position A is an upper part of an interstitial site surrounded by one gallium atom and two zinc atoms on the top surface of the pellet 5200. The position B is an upper part of an interstitial site surrounded by two gallium atoms and one zinc atom on the top surface of the pellet 5200. The position a is in an indium site on a side surface of the pellet 5200. The position b is in an interstitial site between an In—O layer and a Ga—Zn—O layer on a side surface of the pellet 5200. The position c is in a gallium site on a side surface of the pellet 5200.

The relative energy was estimated from first principles calculation in each case where a metal ion was located in the assumed position (the position A, the position B, the position a, the position b, or the position c). In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and F-only k-point sampling was used. Table 1 shows the relative energies in the case where an indium ion (In$^{3+}$), a gallium ion (Ga$^{3+}$), and a zinc ion (Zn$^{2+}$) are located at the position A, the position B, the position a, the position b, and the position c. Note that the relative energy is a relative value under the condition where the energy of the model with the lowest energy among the calculated models is set to 0 eV.

TABLE 1

| | Relative energy [eV] | | | | |
|---|---|---|---|---|---|
| | Top surface of pellet | | Side surface of pellet | | |
| Ion | A | B | a | b | c |
| In$^{3+}$ | 2.1 | 1.5 | 0.0 | 1.8 | 1.9 |
| Ga$^{3+}$ | 3.7 | 3.0 | 0.6 | 0.0 | 3.5 |
| Zn$^{2+}$ | 2.3 | 1.8 | 0.0 | 0.6 | 2.9 |

It is found that any metal ion is more likely to be attached to the side surface of the pellet 5200 than to the top surface thereof. It is also found that a zinc ion as well as an indium ion is most likely to be attached to the indium site at the position a.

Figure 31A:
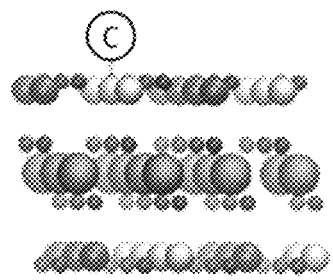
FIGS. 31A to 31G are diagrams showing positions where a particle is attached to a pellet.
Figure 31B:
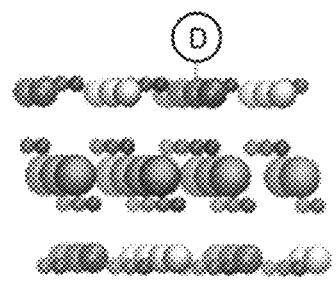
Figure 31C:
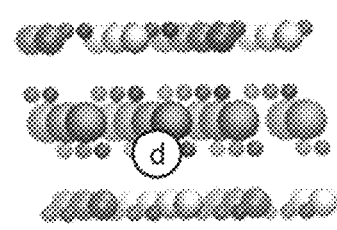
Figure 31D:
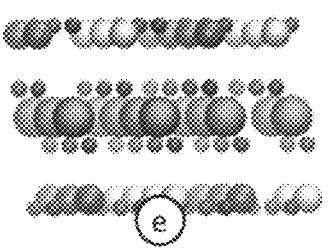
Figure 31E:
Figure 31F:
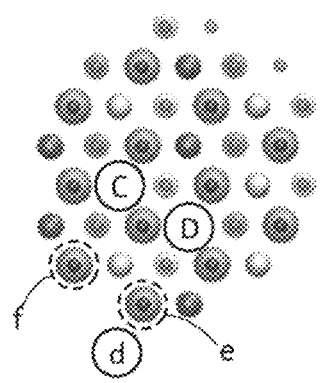
Figure 31G:
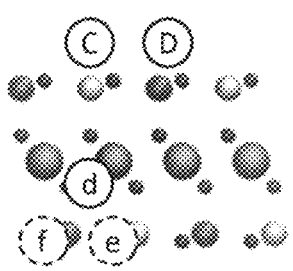

Ease of an oxygen ion ($O^{2-}$) attached to the pellet 5200 was examined. FIGS. 31A to 31E illustrate a structure of the pellet 5200 and positions to which oxygen ions can be attached. FIG. 31F illustrates a structure of the pellet 5200 seen in the direction parallel to the c-axis. FIG. 31G illustrates a structure of the pellet 5200 seen in the direction parallel to the b-axis.

The positions to which oxygen ions can be attached are represented as a position C, a position D, a position d, a position e, and a position f. In the position C, an oxygen ion is bonded to gallium on the top surface of the pellet 5200. In the position D, an oxygen ion is bonded to zinc on the top surface of the pellet 5200. In the position d, an oxygen ion is bonded to indium on a side surface of the pellet 5200. In the position e, an oxygen ion is bonded to gallium on a side surface of the pellet 5200. In the position f, an oxygen ion is bonded to zinc on a side surface of the pellet 5200.

The relative energy was estimated from first principles calculation in each case where an oxygen ion was located in the assumed position (the position C, the position D, the position d, the position e, or the position f). Table 2 shows the relative energies in the case where oxygen ions ($O^{2-}$) are located at the position C, the position D, the position d, the position e, and the position f.

TABLE 2

| | Relative energy [eV] | | | | |
|---|---|---|---|---|---|
| | Top surface of pellet | | Side surface of pellet | | |
| Ion | C | D | d | e | f |
| $O^{2-}$ | 3.9 | 3.6 | 0.0 | 0.5 | 1.5 |

It is found that the oxygen ion is also likely to be attached to the side surface of the pellet 5200 than to the top surface thereof.

According to the above, the particle 5203 that has approached the pellet 5200 is preferentially attached to the side surface of the pellet 5200. This suggests that the deposition model in which a lateral growth of the pellet 5200 occurs when the particles 5203 are attached to the side surface of the pellet 5200 has high validity.

Note that the structure described in this embodiment can be used in appropriate combination with any of the structures described in the other embodiments or examples.

Embodiment 3

In this embodiment, a display device including a semiconductor device of one embodiment of the present invention is described with reference to FIGS. 32A and 32B and FIGS. 33 to 50. Note that a structure in which a liquid crystal element is used as a display element of a display device (a liquid crystal display device) is specifically described in this embodiment.

<3-1. Liquid Crystal Display Device>

Figure 32A:
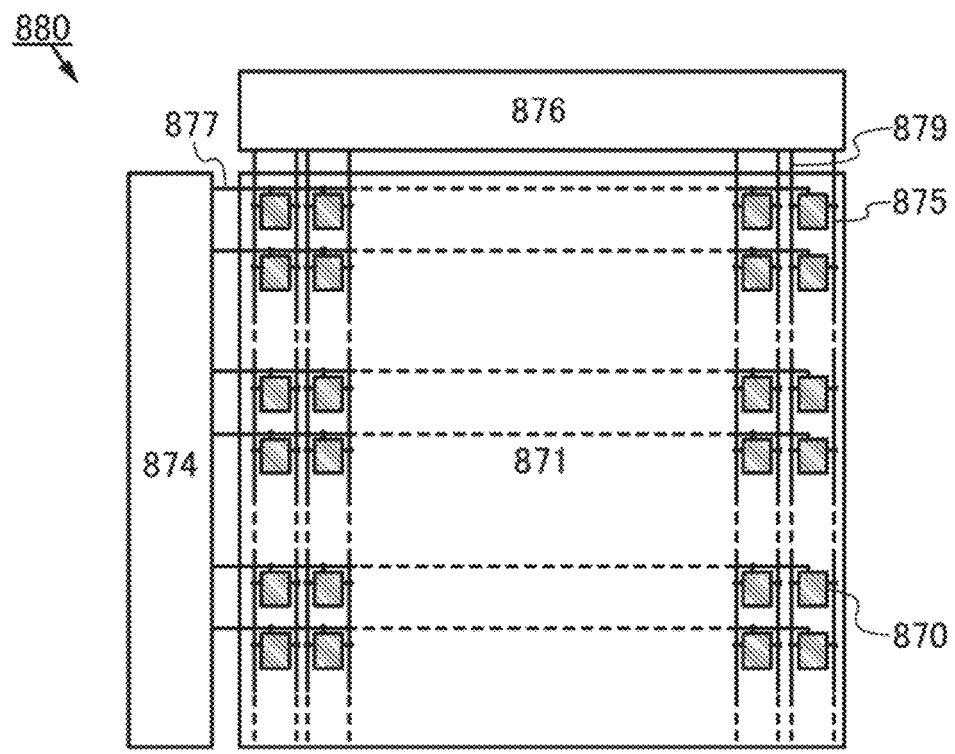
FIGS. 32A and 32B are a top view showing one embodiment of a display device and a circuit diagram showing one embodiment of a pixel.

A liquid crystal display in FIG. 32A includes a pixel portion 871, a gate driver 874, a source driver 876, m scan lines 877 which are arranged parallel or substantially parallel to each other and whose potentials are controlled by the gate driver 874, and n signal lines 879 which are arranged parallel or substantially parallel to each other and whose potentials are controlled by the source driver 876. Further, the pixel portion 871 includes a plurality of pixels 870 arranged in a matrix. Furthermore, common lines 875 arranged parallel or substantially parallel to each other are provided along the signal lines 879. The gate driver 874 and the source driver 876 are collectively referred to as a driver circuit portion in some cases.

Each of the scan lines 877 is electrically connected to the n pixels 870 arranged in the corresponding row among the plurality of pixels 870 arranged in m rows and n columns in the pixel portion 871. Each of the signal lines 879 is electrically connected to the m pixels 870 arranged in the corresponding column among the plurality of pixels 870 arranged in m rows and n columns. Note that m and n are each an integer of 1 or more. Each of the common lines 875 is electrically connected to the m pixels 870 arranged in the corresponding row among the pixels 870 arranged in m rows and n columns.

Figure 32B:
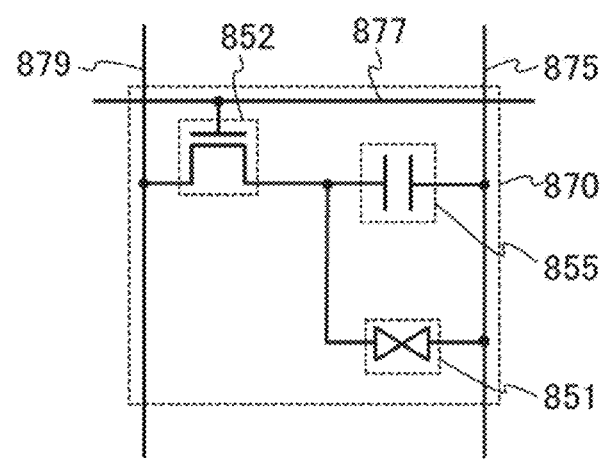

FIG. 32B illustrates an example of a circuit structure that can be used for the pixel 870 in the liquid crystal display device 880 illustrated in FIG. 32A.

The pixel 870 illustrated in FIG. 32B includes a liquid crystal element 851, a transistor 852, and a capacitor 855.

The transistor described in Embodiment 1 can be used as the transistor 852.

One of a pair of electrodes of the liquid crystal element 851 is connected to the transistor 852 and the potential thereof is set according to the specifications of the pixel 870 as appropriate. The other of the pair of electrodes of the liquid crystal element 851 is connected to the common line 875 and a common potential is applied thereto. The alignment state of liquid crystals in the liquid crystal element 851 is controlled in accordance with data written to the transistor 852.

The liquid crystal element 851 is an element which controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). As the liquid crystal used for the liquid crystal element 851, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As a driving method of the liquid crystal display device 880 including the liquid crystal element 851, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

The liquid crystal display device 880 may be a normally black liquid crystal display device such as a transmissive liquid crystal display device utilizing a vertical alignment (VA) mode. As a vertical alignment mode, a multi-domain vertical alignment (MVA) mode, a patterned vertical alignment (PVA) mode, or an ASV mode can be employed, for example.

<3-2. Horizontal Electric Field Mode Liquid Crystal Display Device>

First, liquid crystal display devices using a horizontal electric field mode, typically, liquid crystal display devices using an FFS mode and an IPS mode are described.

In the structure of the pixel 870 illustrated in FIG. 32B, one of a source electrode and a drain electrode of the transistor 852 is electrically connected to the signal line 879, and the other is electrically connected to the one of the pair of electrodes of the liquid crystal element 851. A gate electrode of the transistor 852 is electrically connected to the scan line 877. The transistor 852 has a function of controlling whether to write a data signal.

In the structure of the pixel 870 shown in FIG. 32B, one of a pair of electrodes of the capacitor 855 is connected to the other of the source electrode and the drain electrode of the transistor 852. The other of the pair of electrodes of the capacitor 855 is electrically connected to the common line 875. The potential of the common line 875 is set in accordance with the specifications of the pixel 870 as appropriate. The capacitor 855 functions as a storage capacitor for retaining written data. Note that in the liquid crystal display device 880 driven by the FFS mode, the one of the pair of electrodes of the capacitor 855 is partly or entirely the one of the pair of electrodes of the liquid crystal element 851, and the other of the pair of electrodes of the capacitor 855 is partly or entirely the other of the pair of electrodes of the liquid crystal element 851.

<3-3. Structure Example 1 of Horizontal Electric Field Element Substrate>

Figure 33:
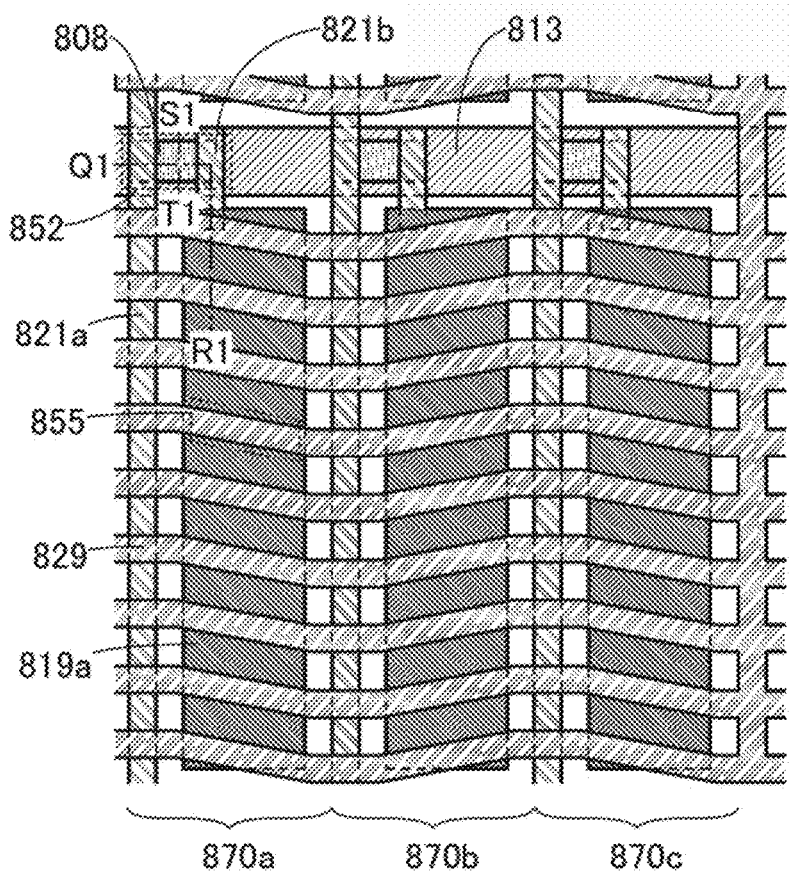
FIG. 33 is a top view showing one embodiment of a pixel.

A specific structure of an element substrate included in the liquid crystal display device 880 is described. FIG. 33 is a top view of a plurality of pixels 870a, 870b, and 870c included in the liquid crystal display device 880 driven by the FFS mode.

In FIG. 33, a conductive film 813 functioning as a scan line extends substantially perpendicularly to the signal line (in the horizontal direction in the drawing). A conductive film 821a functioning as a signal line extends substantially perpendicularly to the scan line (in the vertical direction in the drawing). As the conductive film 813 functioning as a scan line is electrically connected to the gate driver 874, and the conductive film 821a functioning as a signal line is electrically connected to the source driver 876 (see FIG. 32A).

The transistor 852 is provided in the vicinity of the intersection portion of the scan line and the signal line. The transistor 852 includes: the conductive film 813 functioning as a gate electrode; the gate insulating film (not illustrated in FIG. 33); an oxide semiconductor film 808 where a channel region is formed, over the gate insulating film; and the conductive film 821a and a conductive film 821b that function as a source electrode and a drain electrode. The conductive film 813 also functions as a scan line, and a region of the conductive film 813 that overlaps with the oxide semiconductor film 808 functions as the gate electrode of the transistor 852. The conductive film 821a functions as a signal line, and the conductive film 821a that overlaps with the oxide semiconductor film 808 serves as the source electrode or the drain electrode of the transistor 852. Furthermore, in the top view shown in FIG. 33, an end portion of the scan line is located on the outer side than an end portion of the oxide semiconductor film 808. Thus, the scan line functions as a light-blocking film for blocking light from a light source such as a backlight. For this reason, the oxide semiconductor film 808 included in the transistor is not irradiated with light, so that a variation in the electrical characteristics of the transistor can be suppressed.

The conductive film 821b is electrically connected to an oxide semiconductor film 819a functioning as a pixel electrode. A common electrode 829 is provided over the oxide semiconductor film 819a with an insulating film (not shown in FIG. 33) positioned therebetween.

The common electrode 829 includes stripe regions extending in a direction intersecting with the signal line. The stripe regions are connected to a region extending in a direction parallel or substantially parallel to the signal line. Accordingly, the stripe regions of the common electrode 829 are at the same potential in a plurality of pixels included in the liquid crystal display device 880.

The capacitor 855 is formed in a region where the oxide semiconductor film 819a and the common electrode 829 overlap with each other. The oxide semiconductor film 819a and the common electrode 829 each have a light-transmitting property. That is, the capacitor 855 has a light-transmitting property.

Owing to the light-transmitting property of the capacitor 855, the capacitor 855 can be formed large (in a large area) in the pixel 870. Thus, a display device with a large amount of charge capacity as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charge stored in the capacitor is small in the high-resolution display device. However, since the capacitor 855 of this embodiment transmits light, when it is provided in a pixel, a sufficient amount of charge can be obtained in the pixel and the aperture ratio can be improved. Typically, the capacitor 855 can be favorably used for a high-resolution display device with a pixel density of 200 ppi or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Further, according to the structure of this embodiment, the aperture ratio can be improved even in a high-resolution display device, which makes it possible to use light from a light source such as a backlight efficiently, so that power consumption of the display device can be reduced.

Figure 34:
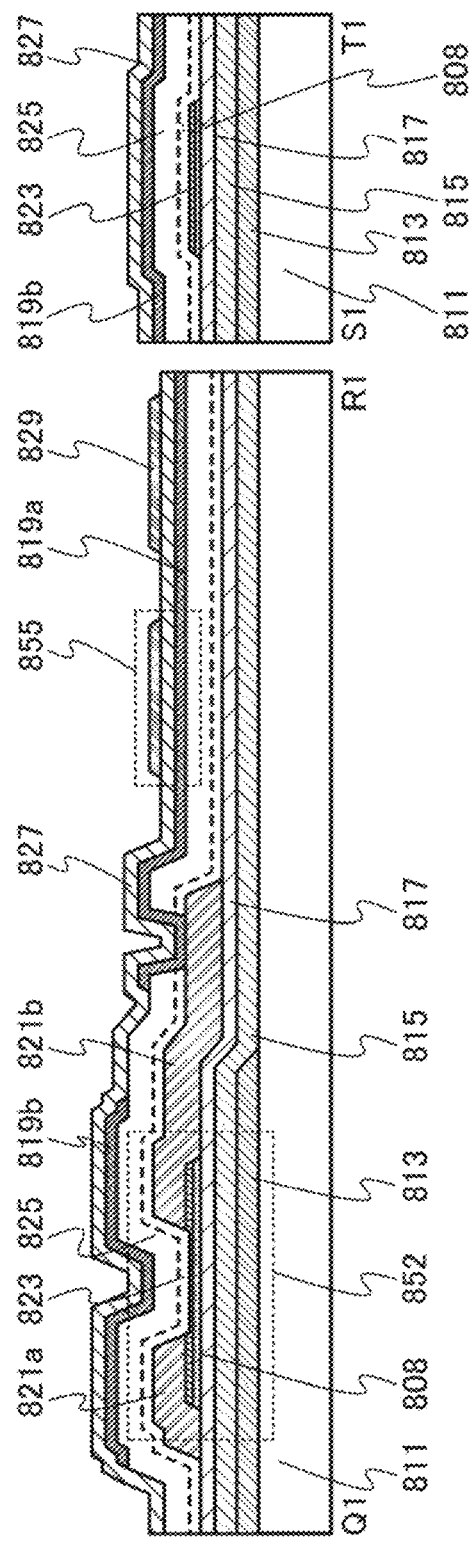
FIG. 34 is a cross-sectional view showing one embodiment of a pixel.

FIG. 34 is a cross-sectional view taken along the dashed-dotted line Q1-R1 and the dashed-dotted line S1-T1 in FIG. 33. The transistor 852 illustrated in FIG. 34 is a channel-etched transistor. Note that the transistor 852 in the channel length direction and the capacitor 855 are illustrated in the cross-sectional view taken along the dashed-dotted line Q1-R1, and the transistor 852 in the channel width direction is illustrated in the cross-sectional view taken along dashed-dotted line S1-T1. Note that the oxide semiconductor film 819b functioning as a second gate electrode is not illustrated in FIG. 33 for simplicity of the drawing.

The transistor 852 shown in FIG. 34 includes the conductive film 813 functioning as a first gate electrode over a substrate 811, an insulating film 815 formed over the substrate 811 and the conductive film 813 functioning as a first gate electrode, an insulating film 817 formed over the insulating film 815, the oxide semiconductor film 808 overlapping the conductive film 813 functioning as a gate electrode with the insulating film 815 and the insulating film 817 positioned therebetween, the conductive films 821a and 821b functioning as a source electrode and a drain electrode and in contact with the oxide semiconductor film 808, insulating films 823 and 825 provided over the oxide semiconductor film 808 and the conductive films 821a and 821b functioning as a source electrode and a drain electrode, the oxide semiconductor film 819b functioning as a second gate electrode over the insulating film 825, and an insulating film 827 over the insulating film 825 and the oxide semiconductor film 819b.

The oxide semiconductor film 819a is formed over the insulating film 825. The oxide semiconductor film 819a is electrically connected to one of the conductive films 821a and 821b functioning as a source electrode and a drain electrode (here, the conductive film 821b) through an opening provided in the insulating film 823 and the insulating film 825. The insulating film 827 is formed over the insulating film 825 and the oxide semiconductor film 819a. The common electrode 829 is formed over the insulating film 827.

A region where the oxide semiconductor film 819a, the insulating film 827, and the common electrode 829 overlap with one another functions as the capacitor 855.

Note that a cross-sectional structure of one embodiment of the present invention is not limited thereto. For example, the oxide semiconductor film 819a may have a slit. Alternatively, the oxide semiconductor film 819a may have a comb-like shape.

Figure 35:
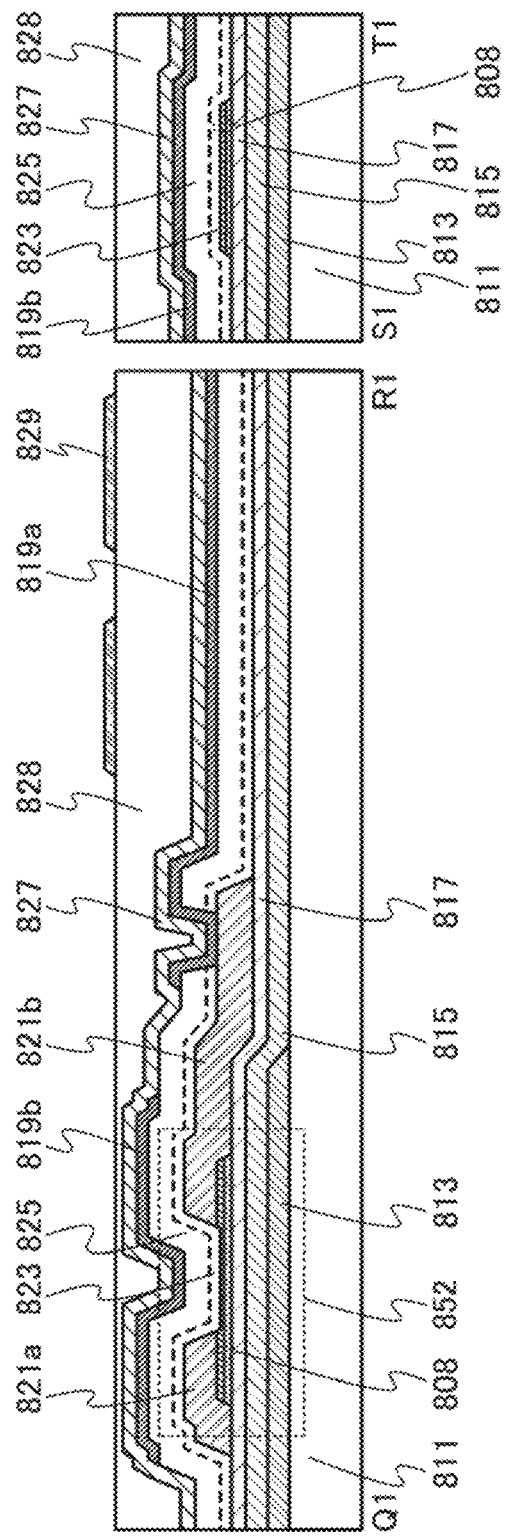
FIG. 35 is a cross-sectional view showing one embodiment of a pixel.

Note that as shown in FIG. 35, the common electrode 829 may be provided over the insulating film 828 provided over the insulating film 827. The insulating film 828 functions as a planarization film.

<3-4. Structure Example 2 of Horizontal Electric Field Mode Element Substrate>

Figure 36:
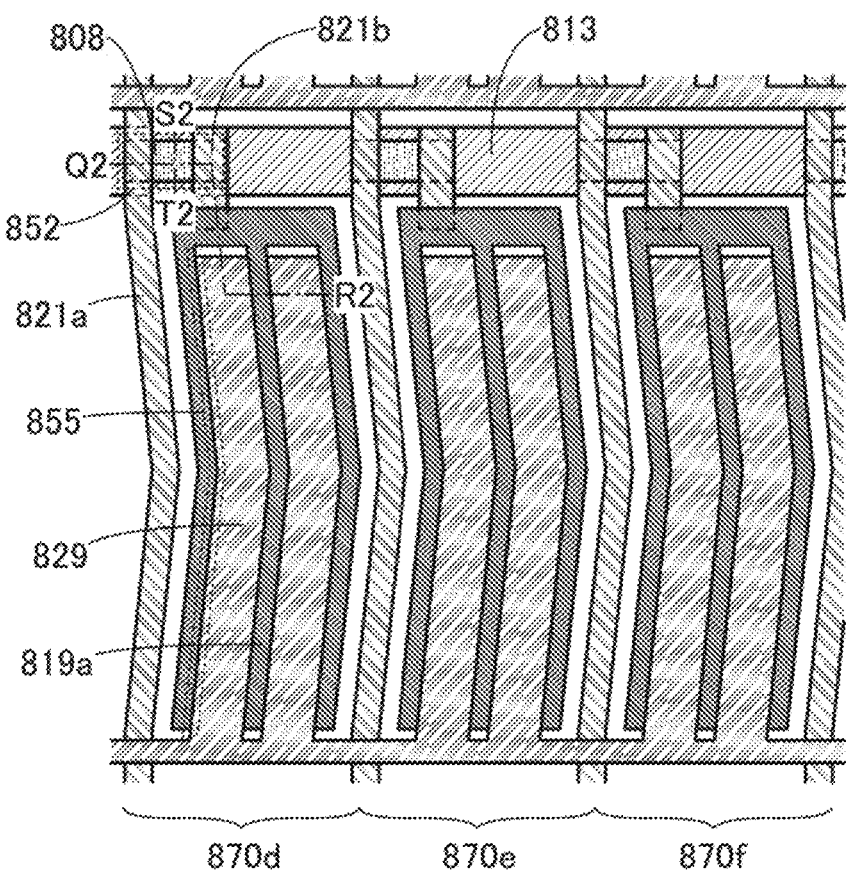
FIG. 36 is a top view showing one embodiment of a pixel.

FIG. 36 is a top view of a plurality of pixels 870d, 870e, and 870f included in the liquid crystal display device 880. The structures of the pixels 870d, 870e, and 870f are different from those of the pixels shown in FIG. 33. The liquid crystal display device 880 shown in FIG. 36 is driven in the IPS mode.

In FIG. 36, the conductive film 813 functioning as a scan line extends in the horizontal direction in the drawing. The conductive film 821a functioning as a signal line extends substantially perpendicularly to the scan line (in the vertical direction in the drawing) so as to have a partly bent dogleg shape (V-like shape). As the conductive film 813 functioning as a scan line is electrically connected to the gate driver 874, and the conductive film 821a functioning as a signal line is electrically connected to the source driver 876 (see FIG. 32A).

The transistor 852 is provided in the vicinity of the intersection portion of the scan line and the signal line. The transistor 852 includes the conductive film 813 functioning as a gate electrode; the gate insulating film (not illustrated in FIG. 36); an oxide semiconductor film 808 where a channel region is formed, over the gate insulating film; and the conductive films 821a and 821b functioning as a source electrode and a drain electrode. The conductive film 813 also functions as a scan line, and a region of the conductive film 813 that overlaps with the oxide semiconductor film 808 functions as the gate electrode of the transistor 852. The conductive film 821a serves as a signal line, and the conductive film 821a that overlaps with the oxide semiconductor film 808 serves as the source electrode of the transistor 852. Further, in the top view of FIG. 36, an end portion of the scan line is located on the outer side than an end portion of the oxide semiconductor film 808. Thus, the scan line functions as a light-blocking film for blocking light from a light source such as a backlight. For this reason, the oxide semiconductor film 808 included in the transistor is not irradiated with light, so that a variation in the electrical characteristics of the transistor can be suppressed.

The conductive film 821b is electrically connected to the oxide semiconductor film 819a functioning as a pixel electrode. The oxide semiconductor film 819a has a comb-like shape. An insulating film (not illustrated in FIG. 36) is provided over the oxide semiconductor film 819a, and the common electrode 829 is provided over the insulating film. The common electrode 829 has a comb-like shape so as to overlap a part of the oxide semiconductor film 819a and mesh with the oxide semiconductor film 819a in the top view. The common electrode 829 is connected to a region extending in a direction parallel or substantially parallel to the scan line. Accordingly, the common electrodes 829 are at the same potential in pixels included in the liquid crystal display device 880. Note that the oxide semiconductor film 819a and the common electrode 829 have a dogleg shape bent along the signal line (the conductive film 821a).

The capacitor 855 is formed in a region where the oxide semiconductor film 819a and the common electrode 829 overlap with each other. The oxide semiconductor film 819a and the common electrode 829 each have a light-transmitting property. That is, the capacitor 855 has a light-transmitting property.

Figure 37:
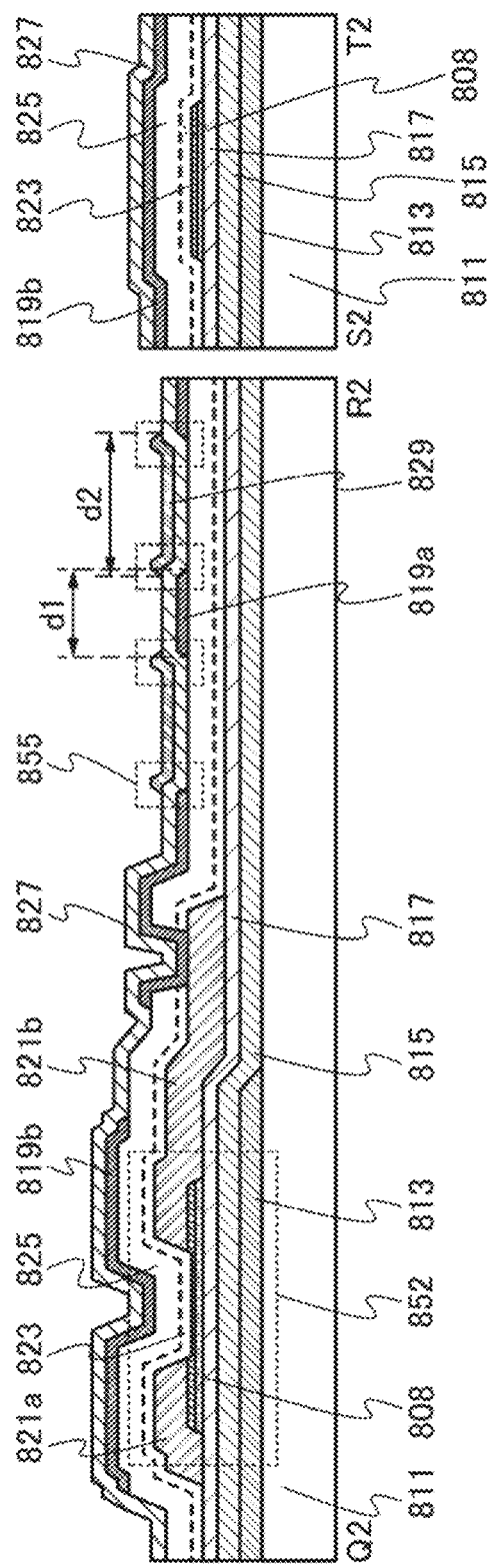
FIG. 37 is a cross-sectional view showing one embodiment of a pixel.

FIG. 37 is a cross-sectional view taken along the dashed-dotted line Q2-R2 and the dashed-dotted line S2-T2 in FIG. 36. The transistor 852 illustrated in FIG. 37 is a channel-etched transistor. Note that the transistor 852 in the channel length direction and the capacitor 855 are illustrated in the cross-sectional view taken along the dashed-dotted line Q2-R2, and the transistor 852 in the channel width direction is illustrated in the cross-sectional view taken along dashed-dotted line S2-T2. Note that the oxide semiconductor film 819b functioning as a second gate electrode is not illustrated in FIG. 36 for simplicity of the drawing.

The transistor 852 shown in FIG. 37 includes the conductive film 813 functioning as a gate electrode over a substrate 811, an insulating film 815 formed over the substrate 811 and the conductive film 813 functioning as a gate electrode, an insulating film 817 formed over the insulating film 815, the oxide semiconductor film 808 overlapping the conductive film 813 functioning as a gate electrode with the insulating film 815 and the insulating film 817 positioned therebetween, the conductive films 821a and 821b functioning as a source electrode and a drain electrode and in contact with the oxide semiconductor film 808, insulating films 823 and 825 provided over the oxide semiconductor film 808 and the conductive films 821a and 821b functioning as a source electrode and a drain electrode, the oxide semiconductor film 819b functioning as a second gate electrode over the insulating film 825, and an insulating film 827 over the insulating film 825 and the oxide semiconductor film 819b.

The oxide semiconductor film 819a is formed over the insulating film 825. The oxide semiconductor film 819a is electrically connected to one of the conductive films 821a and 821b functioning as a source electrode and a drain electrode (here, the conductive film 821b) through an opening provided in the insulating film 823 and the insulating film 825. The insulating film 827 is formed over the insulating film 825 and the oxide semiconductor film 819a. The common electrode 829 is formed over the insulating film 827.

A region where the oxide semiconductor film 819a, the insulating film 827, and the common electrode 829 overlap with one another functions as the capacitor 855.

In the liquid crystal display device shown in FIG. 36 and FIG. 37, the capacitor included in the pixel has a structure in which an end portion and the vicinity of the end portion of the oxide semiconductor film 819a overlap with an end portion and the vicinity of the end portion of the common electrode 829. The capacitor having such a structure can be of appropriate size which is not too large in a large liquid crystal display device.

Figure 38:
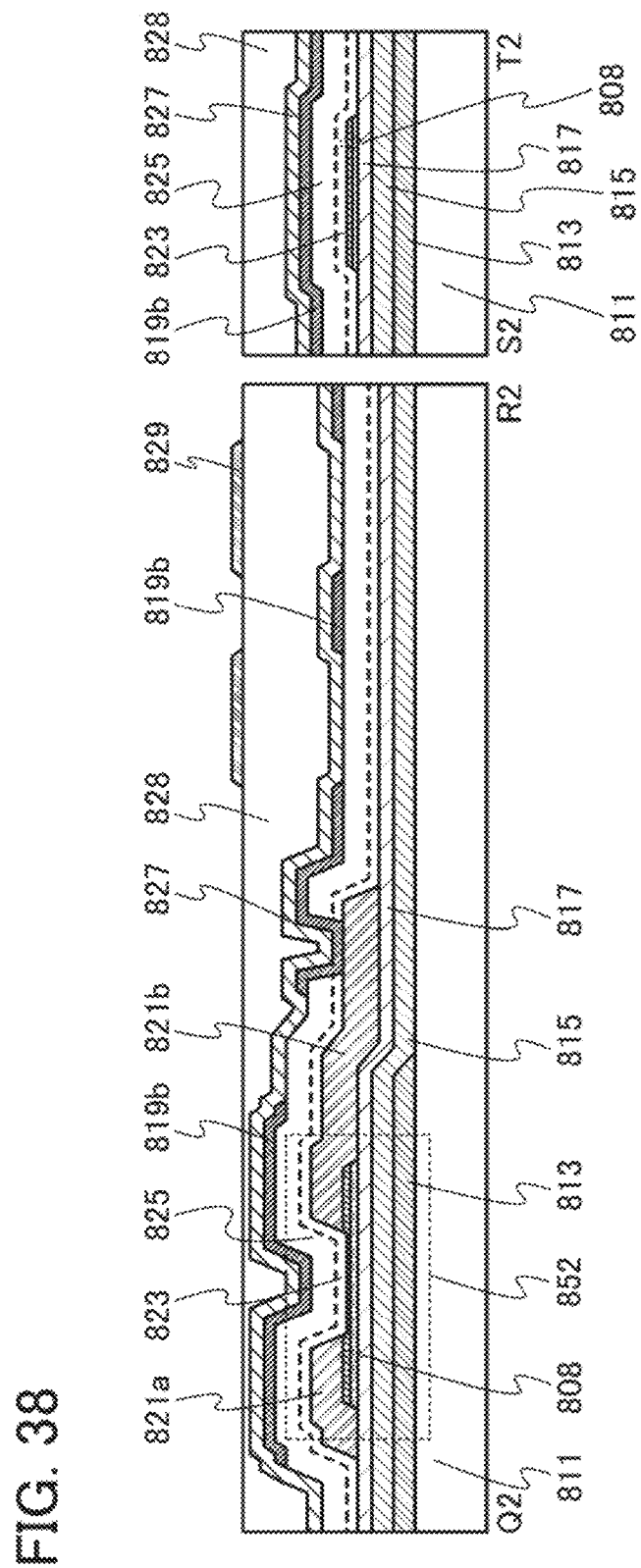
FIG. 38 is a cross-sectional view showing one embodiment of a pixel.

Note that as shown in FIG. 38, the common electrode 829 may be provided over the insulating film 828 provided over the insulating film 827.

Figure 39:
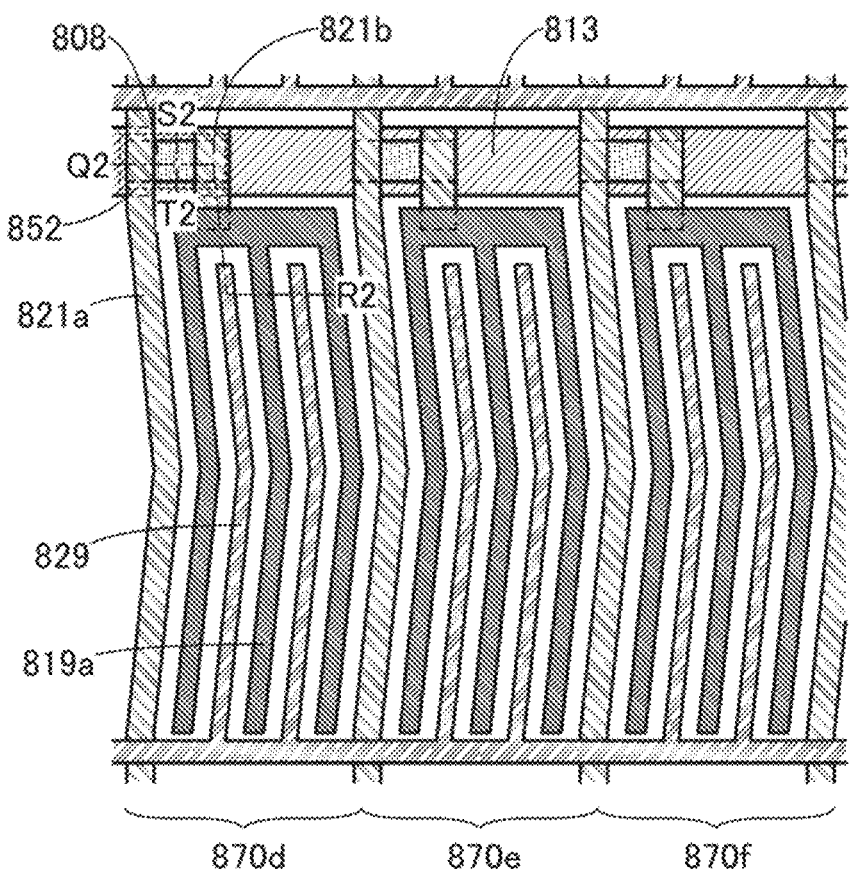
FIG. 39 is a top view showing one embodiment of a pixel.
Figure 40:
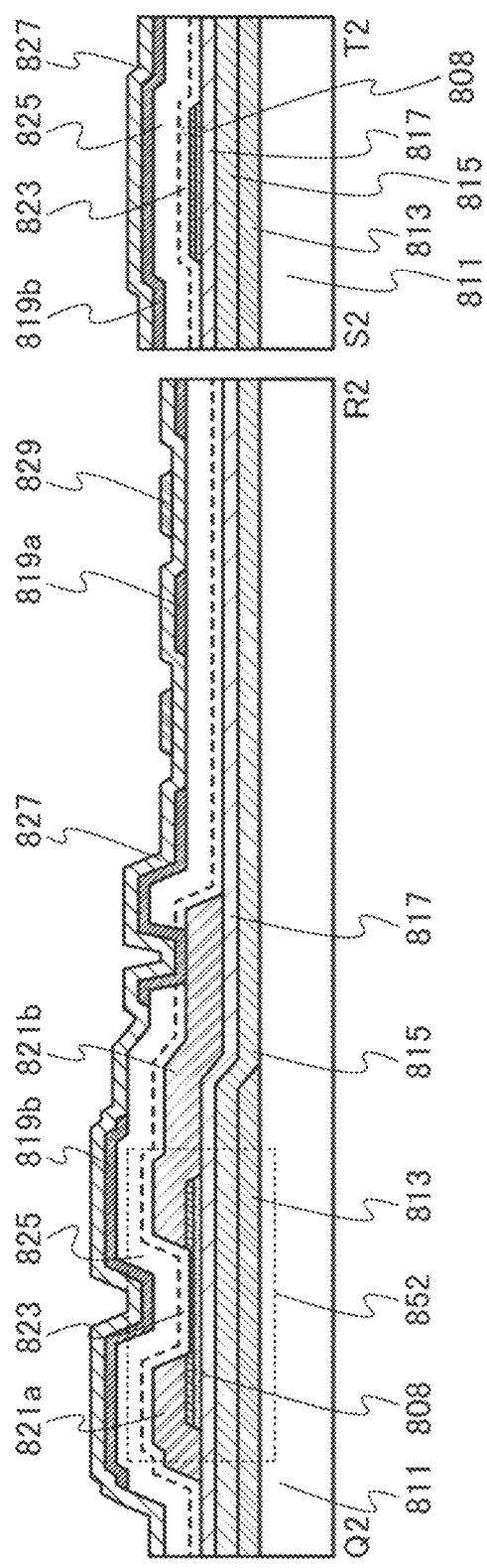
FIG. 40 is a cross-sectional view showing one embodiment of a pixel.
Figure 41:
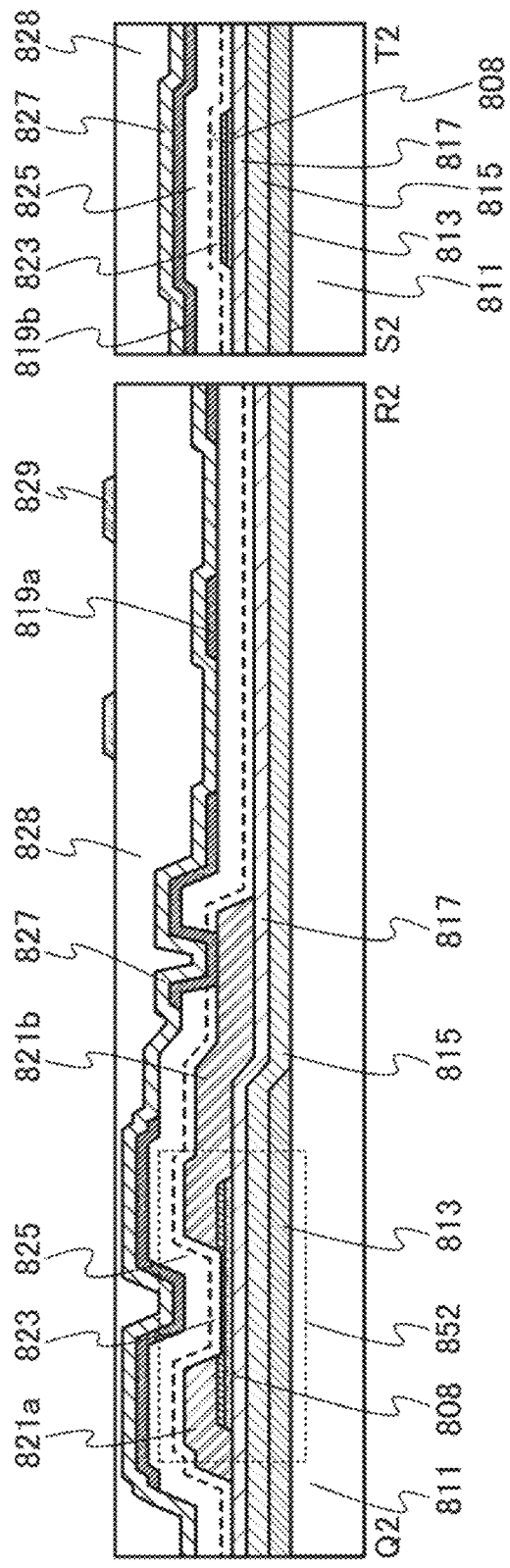
FIG. 41 is a cross-sectional view showing one embodiment of a pixel.

A structure in which the oxide semiconductor film 819a does not overlap with the common electrode 829 as shown in FIG. 39 and FIG. 40 may be used. The positional relation of the oxide semiconductor film 819a and the common electrode 829 can be determined as appropriate depending on the size of a capacitor in accordance with the driving method and the resolution of the display device. Note that the common electrode 829 included in the display device shown in FIG. 40 may be provided over the insulating film 828 functioning as a planarization film (see FIG. 41).

Figure 42:
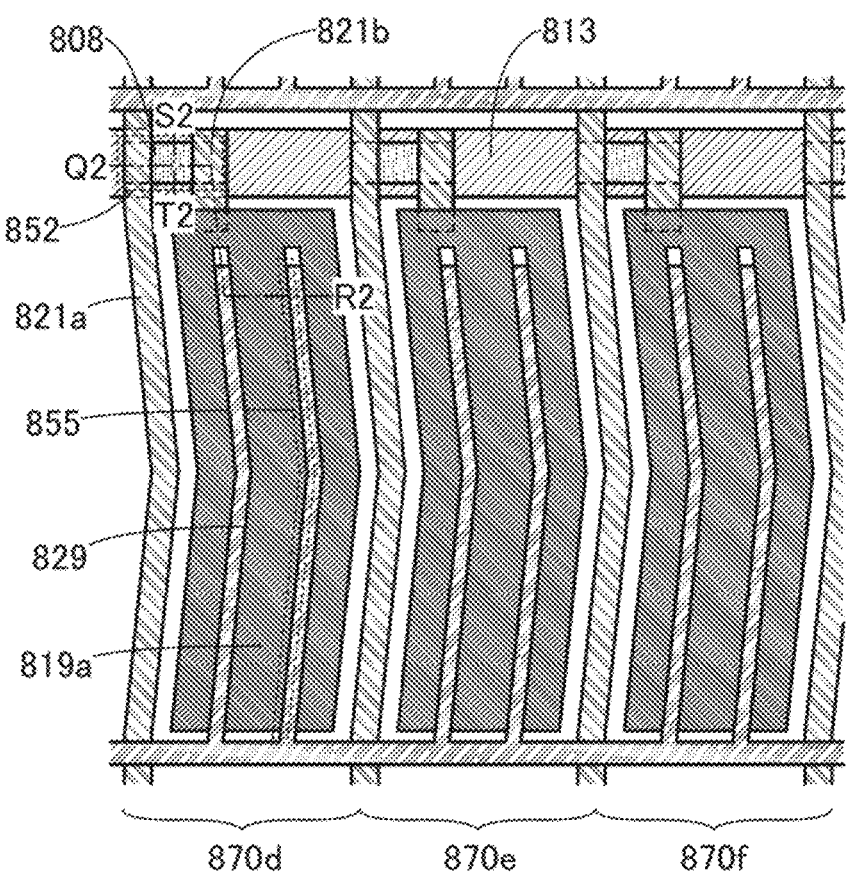
FIG. 42 is a top view showing one embodiment of a pixel.
Figure 43:
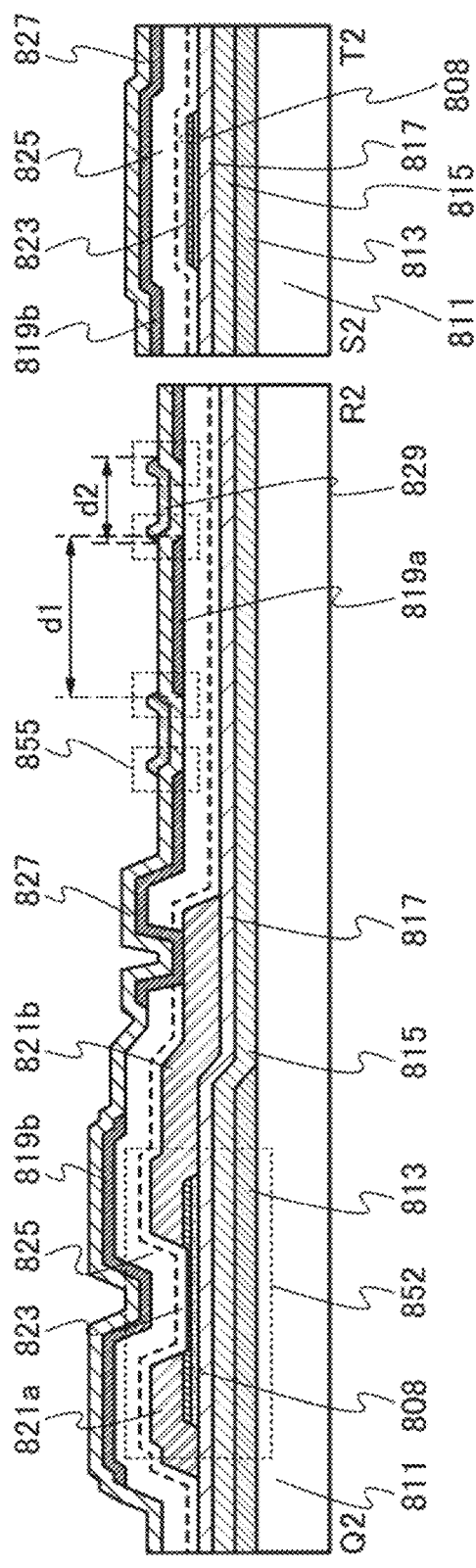
FIG. 43 is a cross-sectional view showing one embodiment of a pixel.

In the liquid crystal display device shown in FIG. 36 and FIG. 37, a width (d1 in FIG. 37) of a region extending in a direction parallel or substantially parallel to the signal line (the conductive film 821a) in the oxide semiconductor film 819a is smaller than a width (d2 in FIG. 37) of a region extending in a direction parallel or substantially parallel to the signal line in the common electrode 829; however, the liquid crystal display device is not limited to this structure. As shown in FIG. 42 and FIG. 43, the width d1 may be larger than the width d2. The width d1 may be equal to the width d2. In one pixel (e.g., the pixel 870d), widths of a plurality of regions extending in a direction parallel or substantially parallel to the signal line in the oxide semiconductor film 819a and/or the common electrode 829 may be different from each other.

Figure 44:
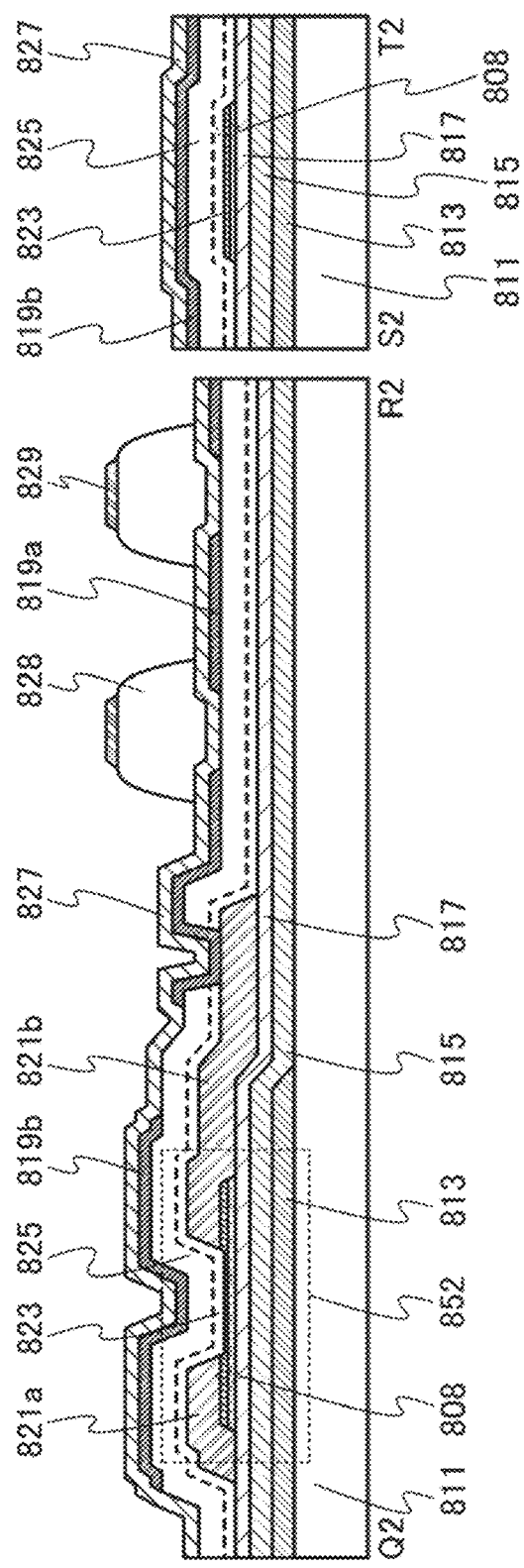
FIG. 44 is a cross-sectional view showing one embodiment of a pixel.
Figure 45:
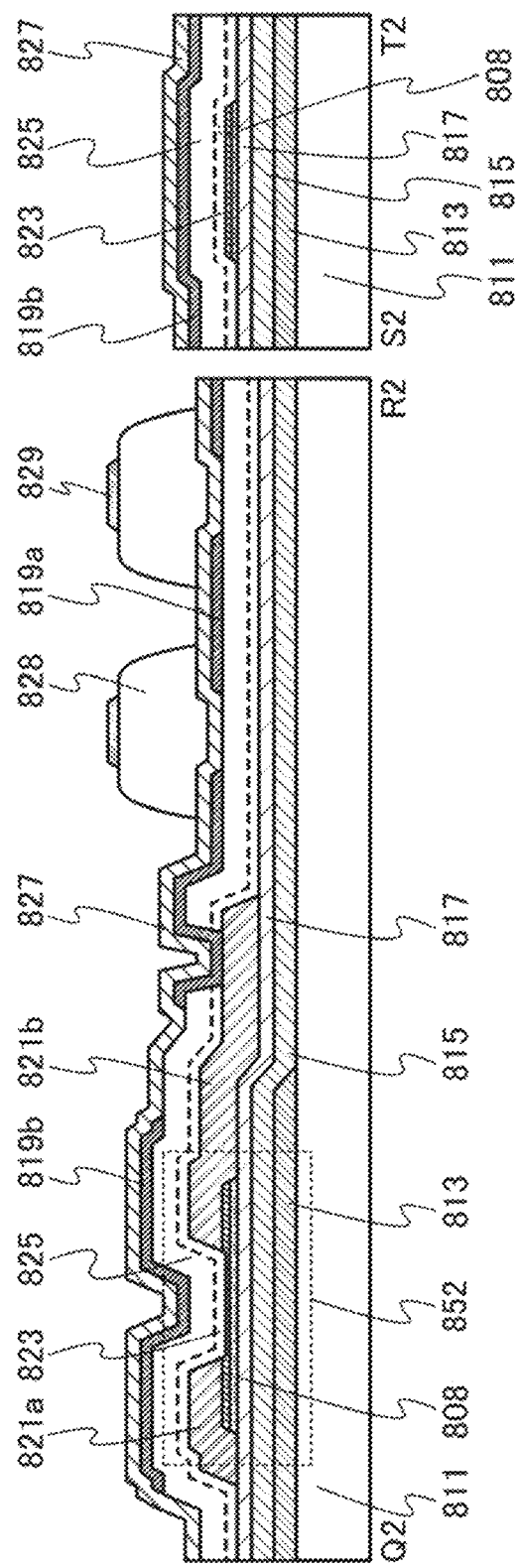
FIG. 45 is a cross-sectional view showing one embodiment of a pixel.

A structure as shown in FIG. 44 may be used in which, in the insulating film 828 over the insulating film 827, only a region overlapping with the common electrode 829 over the insulating film 828 is left and the other region is removed. In this case, the insulating film 828 can be etched using the common electrode 829 as a mask. The unevenness of the common electrode 829 over the insulating film 828 functioning as a planarization film can be suppressed, and the insulating film 828 has a gently-sloping side surface in a region from an end portion of the common electrode 829 toward the insulating film 827. Alternatively, a structure as shown in FIG. 45 may be used in which, in a surface of the insulating film 828, part of a region parallel to the substrate 811 is not covered with the common electrode 829.

Figure 46:
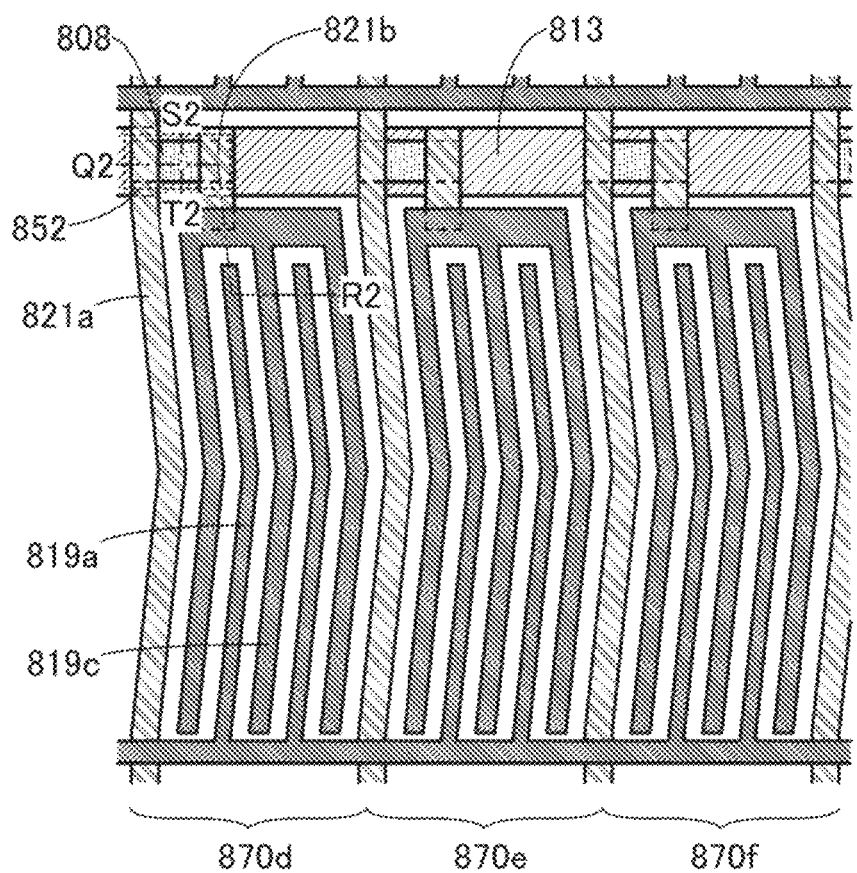
FIG. 46 is a top view showing one embodiment of a pixel.
Figure 47:
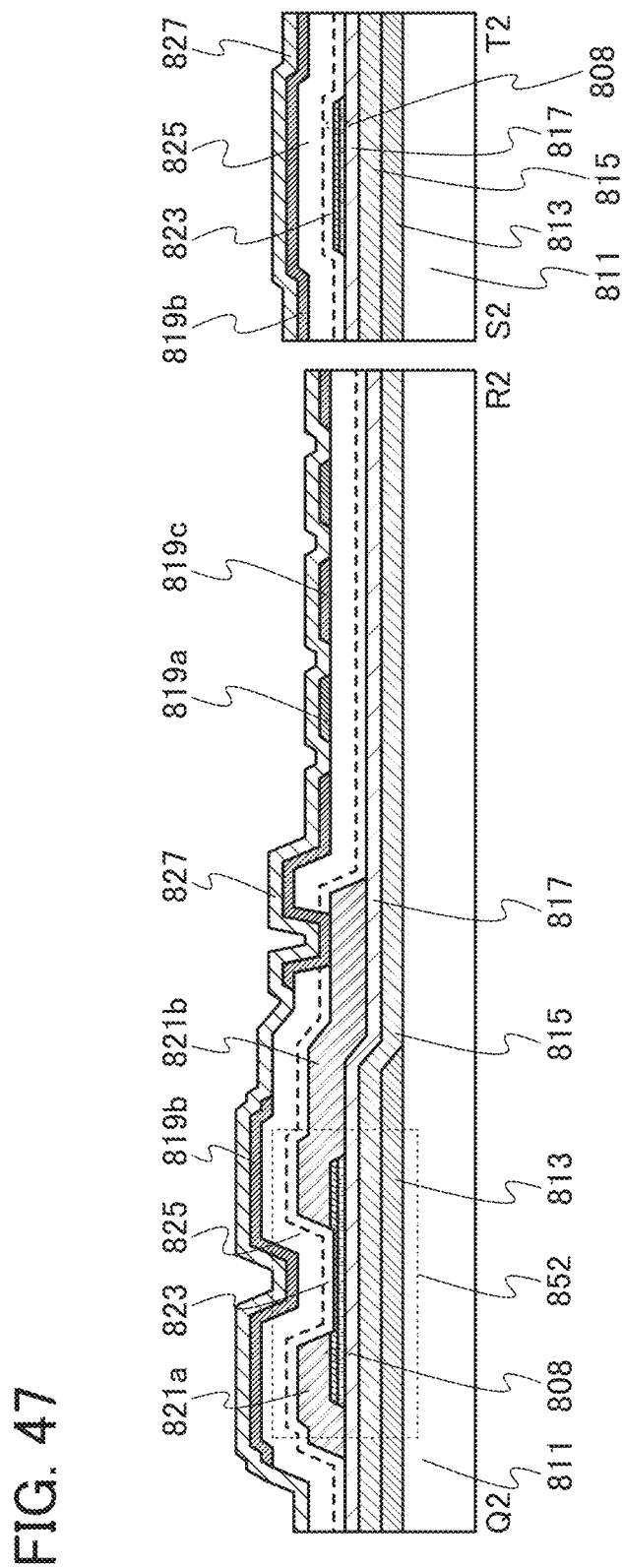
FIG. 47 is a cross-sectional view showing one embodiment of a pixel.

As shown in FIG. 46 and FIG. 47, a common electrode may be provided over a film over which the oxide semiconductor film 819a is formed, i.e., over the insulating film 825. A common electrode 819c shown in FIG. 46 and FIG. 47 can be formed using a material used for forming the oxide semiconductor film 819a and by processing an oxide semiconductor film used for forming the oxide semiconductor film 819a.

<3-5. Vertical Alignment Mode Liquid Crystal Display Device>

Figure 48:
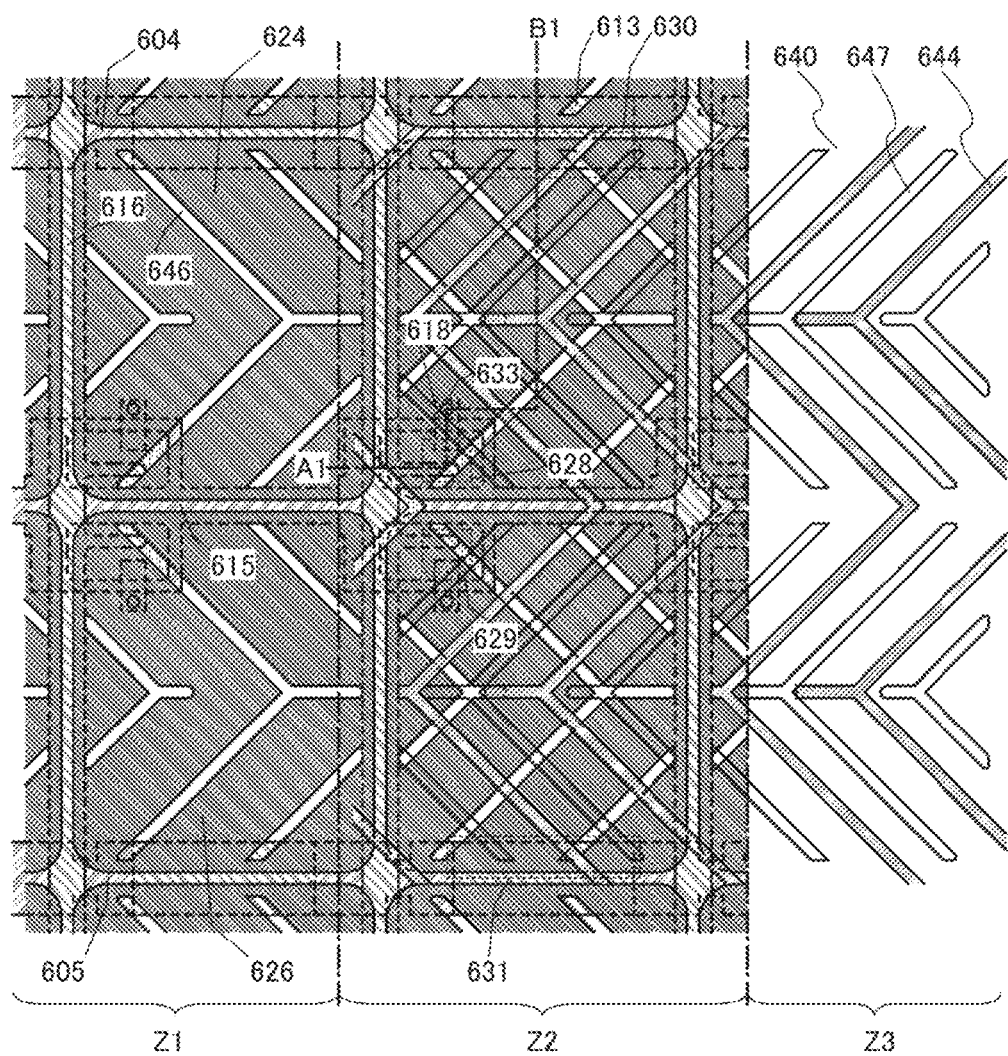
FIG. 48 is a top view showing one embodiment of a pixel.
Figure 49:
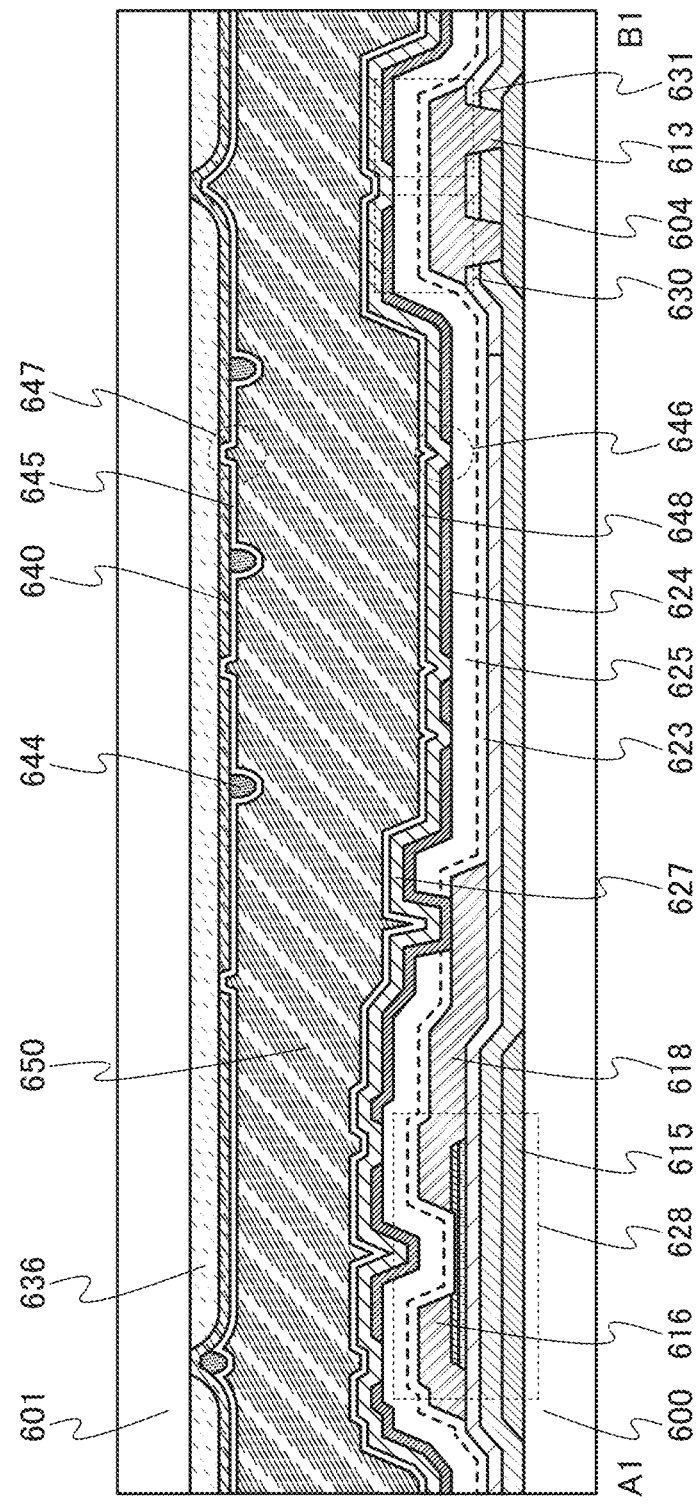
FIG. 49 is a cross-sectional view showing one embodiment of a pixel.
Figure 50:
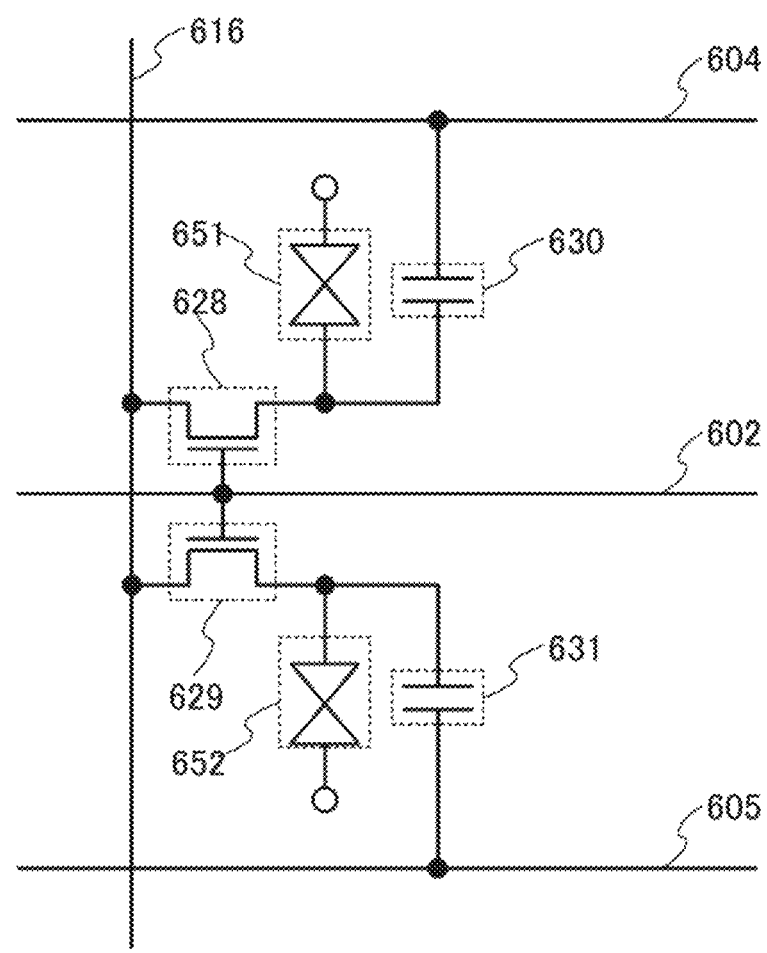
FIG. 50 is a circuit diagram showing one embodiment of a pixel.

A structure of a pixel including a liquid crystal element which operates in a vertical alignment (VA) mode is described with reference to FIG. 48 and FIG. 49. FIG. 48 is a top view of the pixel included in the liquid crystal display device. FIG. 49 is a side view including a cross section taken along the line A1-B1 in FIG. 48. FIG. 50 is an equivalent circuit diagram of the pixel included in the liquid crystal display device.

A vertical alignment (VA) is a mode for controlling alignment of liquid crystal molecules of a liquid crystal display panel. In the VA liquid crystal display device, liquid crystal molecules are aligned in a vertical direction with respect to a panel surface when no voltage is applied.

In the following description, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

In FIG. 48, Z1 is a top view of a substrate 600 provided with a pixel electrode 624. Z3 is a top view of a substrate 601 provided with a common electrode 640. Z2 is a top view illustrating a state where the substrate 601 provided with the common electrode 640 is overlapped with the substrate 600 provided with the pixel electrode 624.

The transistor 628, the pixel electrode 624 connected thereto, and the capacitor 630 are formed over the substrate 600. A drain electrode 618 of the transistor 628 is electrically connected to the pixel electrode 624 through an opening 633 provided in an insulating film 623 and an insulating film 625. An insulating film 627 is provided over the pixel electrode 624.

The transistor described in Embodiment 1 can be used as the transistor 628.

The capacitor 630 includes a wiring 613 over a capacitor wiring 604 as a first capacitor wiring, the insulating film 623, the insulating film 625, and the pixel electrode 624. The capacitor wiring 604 can be formed concurrently with the gate wiring 615 of the transistor 628. The wiring 613, the drain electrode 618, and the wiring 616 can be formed of the same material at the same time.

The oxide semiconductor film with a low sheet resistance described in Embodiment 1 can be used for the pixel electrode 624.

The pixel electrode 624 is provided with a slit 646. The slit 646 is provided for controlling the alignment of the liquid crystals.

A transistor 629, a pixel electrode 626 connected thereto, and a capacitor 631 can be formed in manners similar to those for the transistor 628, the pixel electrode 624, and the capacitor 630, respectively. Both the transistors 628 and 629 are connected to the wiring 616. The wiring 616 functions as a source electrode in each of the transistor 628 and the transistor 629. A pixel of the liquid crystal display panel described in this embodiment includes the pixel electrodes 624 and 626. Each of the pixel electrodes 624 and 626 is a sub-pixel.

The substrate 601 is provided with a coloring film 636 and the common electrode 640, and the common electrode 640 is provided with a structure body 644. The common electrode 640 is provided with a slit 647. An alignment film 648 is formed over the pixel electrode 624. Similarly, an alignment film 645 is formed on the common electrode 640 and the structure body 644. A liquid crystal layer 650 is formed between the substrate 600 and the substrate 601.

The slit 647 formed in the common electrode 640 and the structure body 644 each have a function of controlling the alignment of liquid crystals.

When a voltage is applied to the pixel electrode 624 provided with the slit 646, a distorted electric field (an oblique electric field) is generated in the vicinity of the slit 646. The slit 646 and the structure body 644 on the substrate 601 side and the slit 647 are alternately arranged in an engaging manner, and thus, an oblique electric field is effectively generated to control alignment of the liquid crystal, so that a direction of alignment of the liquid crystal varies depending on location. That is, the viewing angle of a liquid crystal display panel is increased by employing multi-domain. Note that one of the structure body 644 and the slit 647 may be provided for the substrate 601.

FIG. 49 illustrates a state where the substrate 600 and the substrate 601 are overlapped with each other and liquid crystal is injected therebetween. A liquid crystal element is formed by overlapping of the pixel electrode 624, the liquid crystal layer 650, and the common electrode 640.

FIG. 50 illustrates an equivalent circuit of this pixel structure. Both the transistors 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. In other words, each potential of the capacitor wirings 604 and 605 is individually controlled, whereby orientation of liquid crystals is precisely controlled to expand a viewing angle.

Note that this embodiment can be combined with any of the other embodiments in this specification as appropriate.

Embodiment 4

In this embodiment, a semiconductor device of one embodiment of the present invention and a display device that includes a semiconductor device of one embodiment of the present invention are described with reference to FIGS. 51A and 51B, FIGS. 52A to 52C, FIGS. 53A and 53B, and FIGS. 54A and 54B. Note that in this embodiment, a structure in which a light-emitting element (in particular, an electroluminescence (EL) element) is included as a display element of the display device is specifically described.

<4-1. Display Device>

The display device illustrated in FIG. 51A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuit portions for correcting the temperature of transistors or light-emitting elements (hereinafter referred to as temperature sensor circuit portions 508), circuits each having a function of protecting an element (hereinafter the circuits are referred to as protection circuit portions 506), and a terminal portion 507. Note that the sensor circuit portions 508 and the protection circuit portions 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter, such wirings are referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, the gate driver 504*a* can supply another signal. For example, as shown in FIG. 51A, the gate driver 504*a* is electrically connected to wirings for controlling the potential of the light-emitting element (hereinafter such wirings are referred to as ANODE_1 to ANODE_X).

The source driver 504*b* includes a shift register or the like. The source driver 504*b* receives a signal (image signal) from which a data signal is derived, as well as a signal for driving the shift register, through the terminal portion 507. The source driver 504*b* has a function of generating a data signal to be written to the pixel circuit 501 which is based on the image signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches or the like, for example. The source driver 504*b* can output, as the data signals, signals obtained by time-dividing the image signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to 1), a pulse signal is input from the gate driver 504*a* through the scan line GL_m, and a data signal is input from the source driver 504*b* through the data line DL_n in accordance with the potential of the scan line GL_m.

Figure 51A:
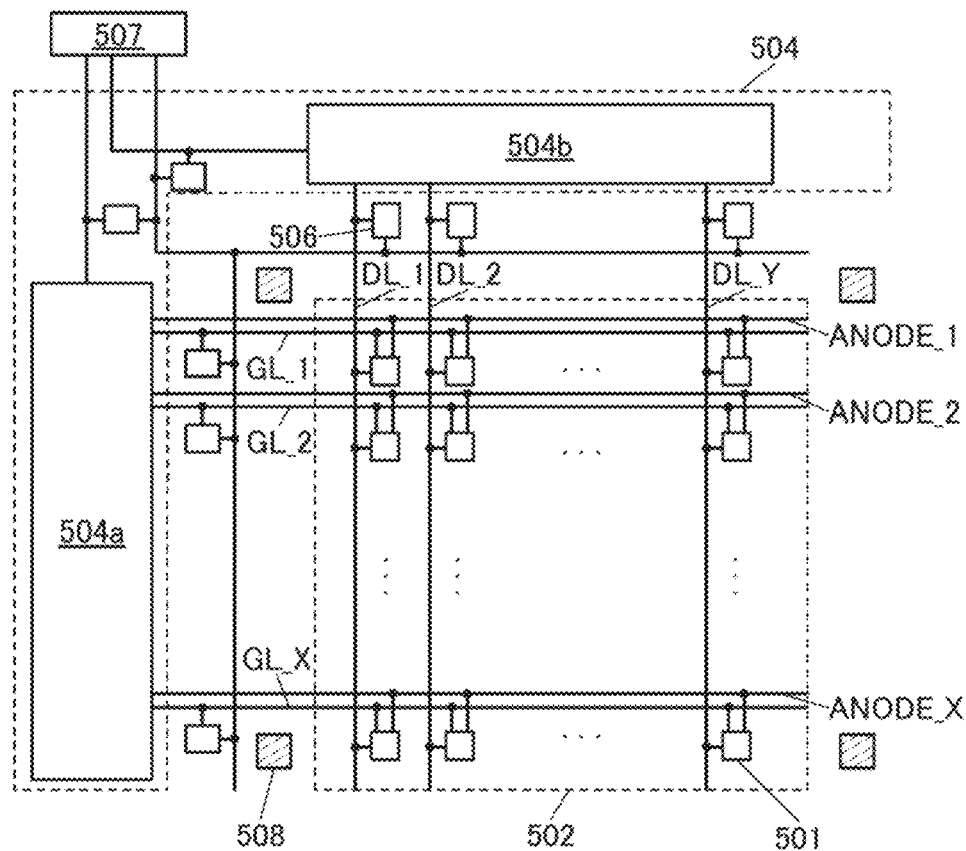
FIGS. 51A and 51B are a block diagram and a circuit diagram illustrating a display device.

The protection circuit portion 506 shown in FIG. 51A is connected to, for example, the scan line GL between the gate driver 504*a* and the pixel circuit 501. Alternatively, the protection circuit portion 506 is connected to the data line DL between the source driver 504*b* and the pixel circuit 501. Alternatively, the protection circuit portion 506 can be connected to a wiring between the gate driver 504*a* and the terminal portion 507. Alternatively, the protection circuit portion 506 can be connected to a wiring between the source driver 504*b* and the terminal portion 507. Note that the terminal portion 507 means a portion having terminals for inputting power, control signals, and image signals to the display device from external circuits.

The protection circuit portion 506 is a circuit that electrically connects a wiring connected to the protection circuit to another wiring when a potential out of a certain range is applied to the wiring connected to the protection circuit.

Figure 52A:
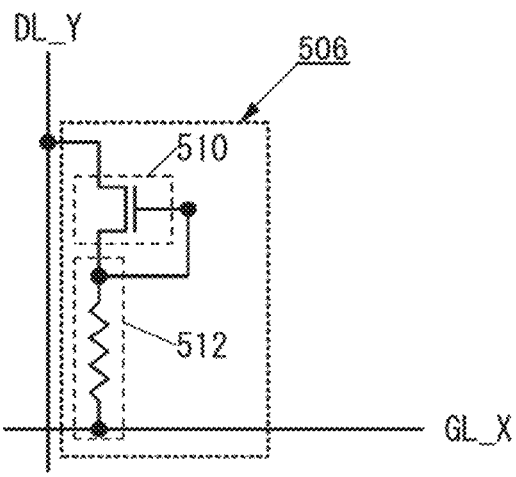
FIGS. 52A to 52C illustrate a circuit configuration of a resistor and a top surface and a cross section of a resistor.

The protection circuit portion 506 can have a configuration shown in FIG. 52A, for example.

FIG. 52A illustrates an example of a circuit configuration that can be used for the protection circuit portion 506. The protection circuit portion 506 includes a transistor 510 and a resistor 512. One of a source electrode and a drain electrode of the transistor 510 is electrically connected to the data line DL, and the other of the source electrode and the drain electrode of the transistor 510 is electrically connected to one electrode of the resistor 512. A gate electrode of the transistor 510 is electrically connected to the other of the source electrode and the drain electrode of the transistor 510. The other electrode of the resistor 512 is electrically connected to the scan line GL. Note that a second gate electrode may be provided for the transistor 510.

As the transistor 510, the transistor 100 described in Embodiment 1 can be used, for example. As the resistor 512, a structure shown in FIGS. 52B and 52C can be used, for example.

Figure 52B:
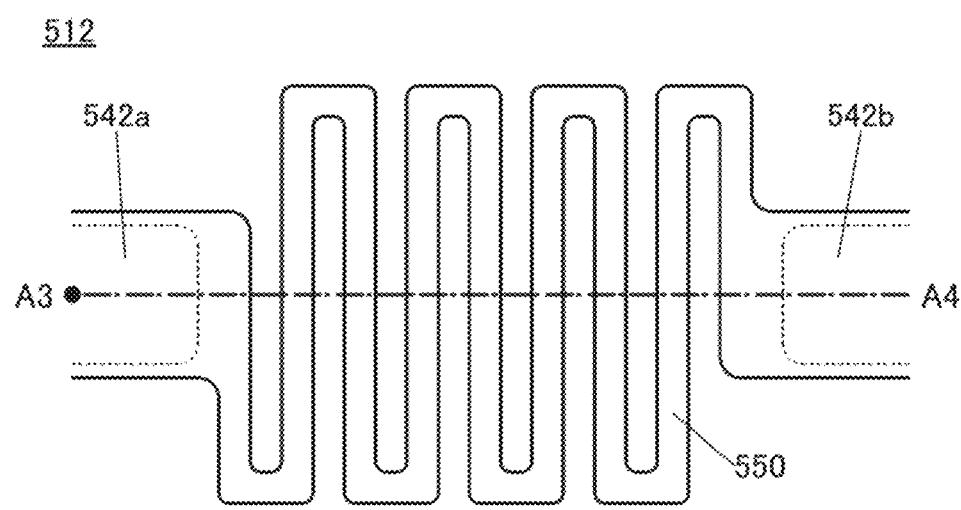
Figure 52C:
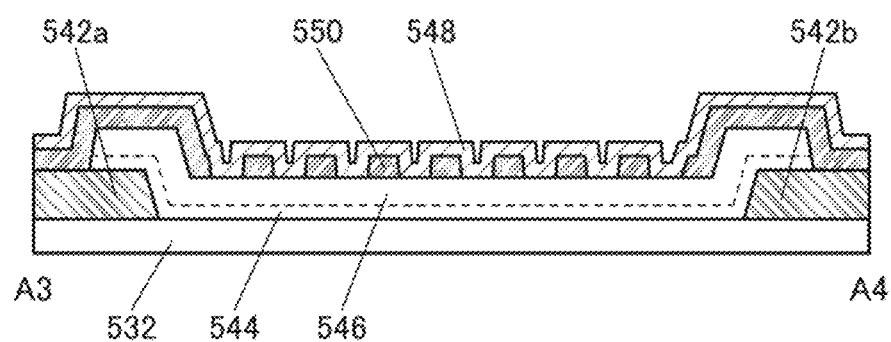

FIG. 52B illustrates an example of a top view of the resistor 512. FIG. 52C corresponds to a cross-sectional view taken along the dashed-dotted line A3-A4 in FIG. 52B.

The resistor 512 includes the following components: electrodes 542*a* and 542*b* over a substrate 532; insulating films 544 and 546 over the substrate 532 and the electrodes 542*a* and 542*b*; an oxide semiconductor film 550 over the electrodes 542*a* and 542*b* and the insulating film 546; and an insulating film 548 over the insulating film 546 and the oxide semiconductor film 550.

The substrate 532, the insulating films 544 and 546, the electrodes 542*a* and 542*b*, the oxide semiconductor film 550, and the insulating film 548 can be formed using materials similar to those of the substrate 102, the insulating films 114 and 116, the conductive films 112*a* and 112*b*, the oxide semiconductor film 120, and the insulating film 118 described in the above, respectively.

The electrodes 542*a* and 542*b* are electrically connected to each other through the oxide semiconductor film 550. The oxide semiconductor film 550 serves as a resistor.

By appropriately adjusting the shape (specifically, the length or the width) of the oxide semiconductor film 550 as shown in FIGS. 52B and 52C or changing the material of the oxide semiconductor film as shown in FIG. 8, a desired resistance value can be obtained.

As shown in FIG. 51A, the protection circuit portions 506 are provided for the pixel portion 502 and the driver circuit portion 504, so that the resistance of the display device to overcurrent generated by electrostatic discharge (ESD) or the like can be improved. Note that the configuration of the protection circuit portions 506 is not limited to that, and for example, the protection circuit portion 506 may be configured to be connected to the gate driver 504*a* or the protection circuit portion 506 may be configured to be connected to the source driver 504*b*. Alternatively, the protection circuit portion 506 may be configured to be connected to the terminal portion 507.

The sensor circuit portion 508 has a function of correcting the temperature of a transistor or a light-emitting element.

Figure 53A:
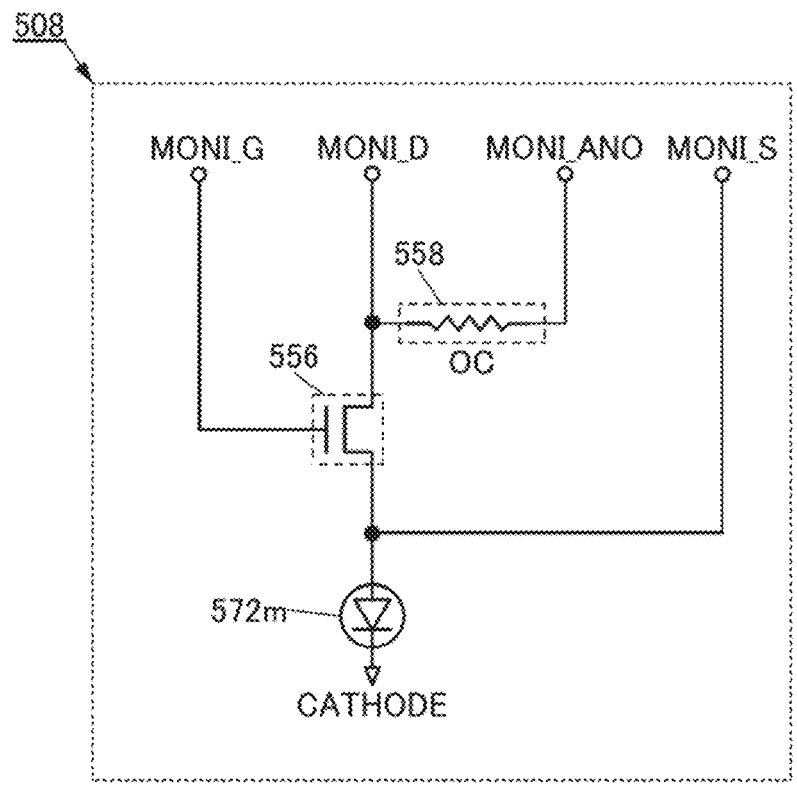
FIGS. 53A and 53B are a circuit diagram and a schematic cross-sectional view illustrating a sensor circuit portion.
Figure 53B:
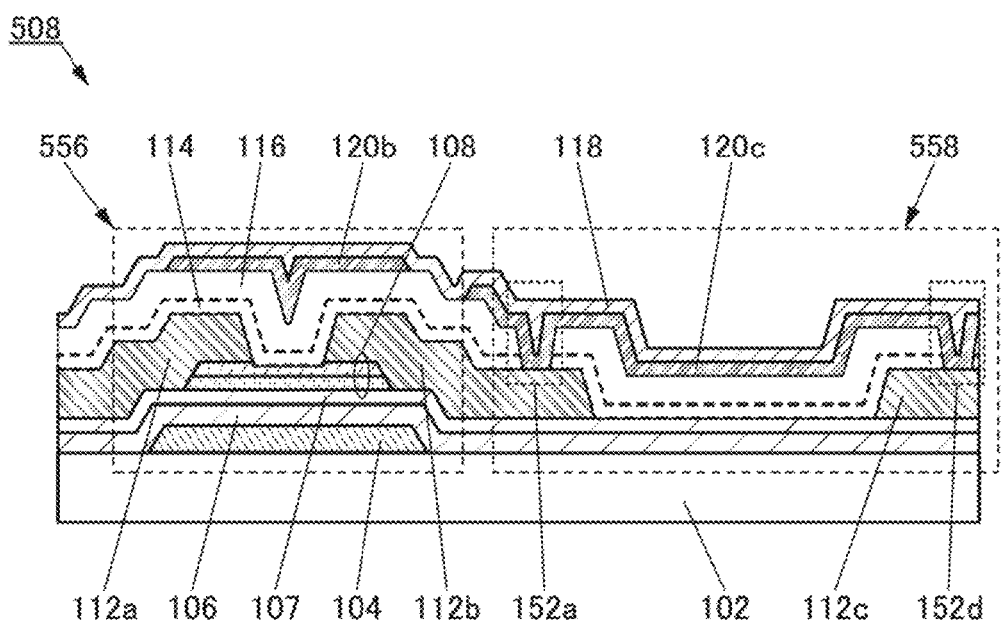

The sensor circuit portion 508 can have configurations shown in FIGS. 53A and 53B, for example.

FIG. 53A illustrates an example of a circuit configuration that can be used as the sensor circuit portion 508. The sensor circuit portion 508 includes a transistor 556, a resistor 558, and a light-emitting element 572*m* for monitor use. A gate electrode of the transistor 556 is electrically connected to a gate line MONI_G for monitor use, one of a source electrode and a drain electrode of the transistor 556 is electrically connected to one electrode of the light-emitting element 572*m*, and the other of the source electrode and the drain electrode of the transistor 556 is electrically connected to a drain line MONI_D for monitor use. One electrode of the resistor 558 is electrically connected to the other of the source electrode and the drain electrode of the transistor 556, and the other electrode of the resistor 558 is electrically connected to an anode line MONI_ANO for monitor use. The one electrode of the light-emitting element 572*m* is electrically connected to a source line MONI_S for monitor use, and the other electrode of the light-emitting element 572*m* is electrically connected to a cathode line.

Note that the transistor 556 has a function similar to that of a driving transistor in the pixel portion 502, such as the transistor 554. For example, the sensor circuit portion 508 has a function of monitoring the voltages and the currents of the gate electrode, the source electrode, and the drain electrode of the transistor 556 and the anode line when a current flows in the light-emitting element 572*m*. Furthermore, the gate line MONI_G for monitor use, the drain line MONI_D for monitor use, the anode line MONI_ANO for monitor use, and the source line MONI_S for monitor use are provided independently as shown in FIG. 53A; thus, each signals can be measured independently.

For example, characteristics of the light-emitting element 572*m* for monitor use can be determined by measuring the potential of the source line for monitor use. Characteristics of the transistor 556 can be determined by measuring the potentials of the gate line MONI_G for monitor use, the drain line MONI_D for monitor use, and the source line MONI_S for monitor use. Characteristics of the resistor 558 can be determined by measuring the potentials of the anode line MONI_ANO for monitor use and the drain line MONI_D for monitor use.

Voltages may be applied to the anode line MONI_ANO for monitor use and the gate line MONI_G for monitor use, and the potentials of the drain line MONI_D for monitor use and the source line for monitor use are measured, so that the temperature can be determined from the potential of the drain line MONI_D for monitor use. Voltages may be applied to the anode line MONI_ANO for monitor use and the gate line MONI_G for monitor use, and the potentials of the drain line MONI_D for monitor use and the source line for monitor use are measured, so that Vgs of the transistor 556 and the voltage applied to the light-emitting element 572*m* can be determined from the potential of the source line MONI_S for monitor use.

The potential of the cathode line electrically connected to the other electrode of the light-emitting element 572*m* or the potential of video data are changed using the above determined values, whereby correction can be performed. In the configuration where the sensor circuit portions 508 are provided near four corners of the pixel portion 502 as shown in FIG. 51A, a correction method can be changed depending on the positions of the pixels.

The sensor circuit portion 508 can have a structure shown in FIG. 53B, for example. FIG. 53B is a schematic cross-sectional view illustrating the sensor circuit portion 508.

The sensor circuit portion 508 shown in FIG. 53B includes the transistor 556 and the resistor 558. The transistor 556 includes the following components: the conductive film 104 over the substrate 102; the insulating films 106 and 107 over the substrate 102 and the conductive film 104; the oxide semiconductor film 108 over the insulating film 107; the conductive film 112*a* electrically connected to the oxide semiconductor film 108; the conductive film 112*b* electrically connected to the oxide semiconductor film 108; the insulating films 114 and 116 over the oxide semiconductor film 108 and the conductive films 112*a* and 112*b*; and the oxide semiconductor film 120*b* over the insulating film 116.

The resistor 558 includes the following components: the insulating films 106 and 107 over the substrate 102; the conductive film 112*b* and a conductive film 112*c* over the insulating film 107; the insulating films 114 and 116 over the insulating film 107 and the conductive films 112*b* and 112*c*; an oxide semiconductor film 120*c* over the insulating film 116; and the insulating film 118 over the oxide semiconductor film 120*c*. The oxide semiconductor film 120*c* is electrically connected to the conductive film 112*b* through the opening 152*a* provided in the insulating films 114 and 116. The oxide semiconductor film 120*c* is electrically connected to the conductive film 112*c* through an opening 152*d* provided in the insulating films 114 and 116. The conductive film 112*b* serves as the other of the source electrode and the drain electrode of the transistor 556 and one of the pair of electrodes of the resistor 558. The conductive film 112*c* serves as the other of the pair of electrodes of the resistor 558. The conductive film 112*c* serves as the anode line MONI_ANO for monitor use.

Note that the transistor 556 has a function similar to that of the transistor 150 in Embodiment 1. Therefore, the components of the transistor 556 are denoted by the same reference numerals and the same hatching patterns as those of the transistor 150. Thus, for the components of the transistor 556, materials and the like that can be used for the transistor 150 in Embodiment 1 can be used.

The other of the pair of electrodes of the resistor 558 is formed by processing the same conductive film as that used for forming the conductive films functioning as the source electrode and the drain electrode of the transistor 556. The oxide semiconductor film 120*c* is formed by processing the same oxide semiconductor film as that used for forming the oxide semiconductor film 120*b*. Note that as described in Embodiment 1, the oxide semiconductor film 120*b* can be used as an oxide conductor (OC). Thus, the oxide semiconductor film 120*c* formed by processing the same oxide semiconductor film as that used for forming the oxide semiconductor film 120*b* can also be used as an oxide conductor (OC). Therefore, in the circuit diagram shown in FIG. 53A, a symbol "OC" is written beside the resistor 558.

The oxide semiconductor film 120*c* included in the resistor 558 is formed using a material and a method similar to those of the oxide semiconductor film 120*b*. For example, indium gallium zinc oxide (IGZO), indium tin oxide (ITO), indium zinc oxide, or indium tin silicon oxide (ITSO) can be used for the oxide semiconductor film 120*c*.

Back to the description of FIG. 51A. In FIG. 51A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

<4-2. Structure Example of Pixel Circuit>

Figure 51B:
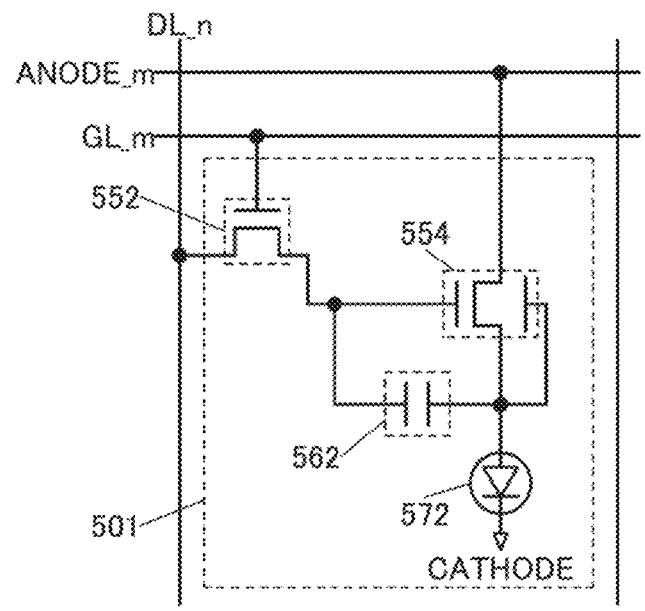

Each of the plurality of pixel circuits 501 in FIG. 51A can have the structure illustrated in FIG. 51B, for example.

The pixel circuit 501 illustrated in FIG. 51B includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to the other of the source electrode and the drain electrode of the transistor 552. The other of the pair of electrodes of the capacitor 562 is electrically connected to a second gate electrode (also referred to as a back gate electrode) of the transistor 554. The capacitor 562 functions as a storage capacitor for storing written data.

One of a source electrode and a drain electrode of the transistor 554 is electrically connected to an anode line (ANODE_m).

One of an anode and a cathode of the light-emitting element 572 is electrically connected to the other of the source electrode and the drain electrode of the transistor 554, and the other of the anode and the cathode of the light-emitting element 572 is electrically connected to a cathode line (CATHODE). Note that the other of the pair of electrodes of the capacitor 562 is electrically connected to the one of the anode and the cathode of the light-emitting element 572.

As the light-emitting element 572, for example, an organic EL element can be used. Note that the light-emitting element 572 is not limited to an organic EL element; an inorganic EL element including an inorganic material may be used.

For example, in the display device including the pixel circuit 501 in FIG. 51B, the pixel circuits 501 are sequentially selected row by row by the gate driver 504*a* illustrated in FIG. 51A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structure including the light-emitting element 572 as a display element of the display device is described in this embodiment, one embodiment of the present invention is not limited to the structure and a variety of elements may be included in the display device.

For example, the display device includes at least one of an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element using a carbon nanotube, and the like. Alternatively, the display device may include a display medium whose contrast, luminance, reflectivity, transmittance, or the like is changed by electrical or magnetic effect. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

<4-3. Structure Example of Pixel of Display Device>

Figure 54A:
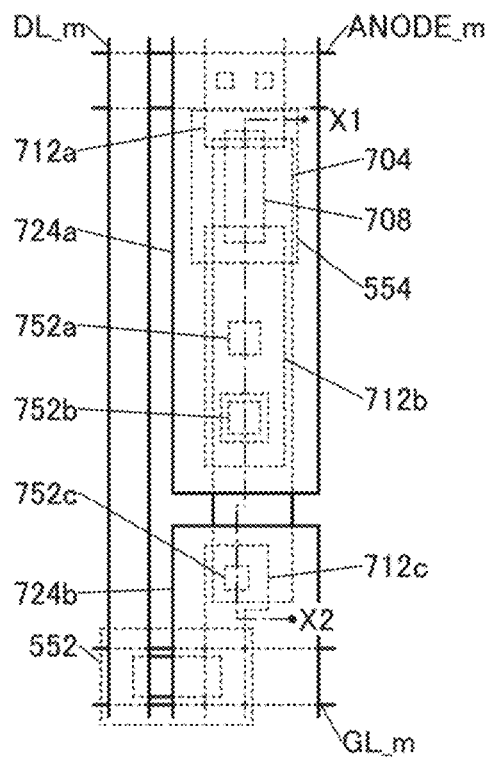
FIGS. 54A and 54B are a top view and a cross-sectional view illustrating a display device.
Figure 54B:
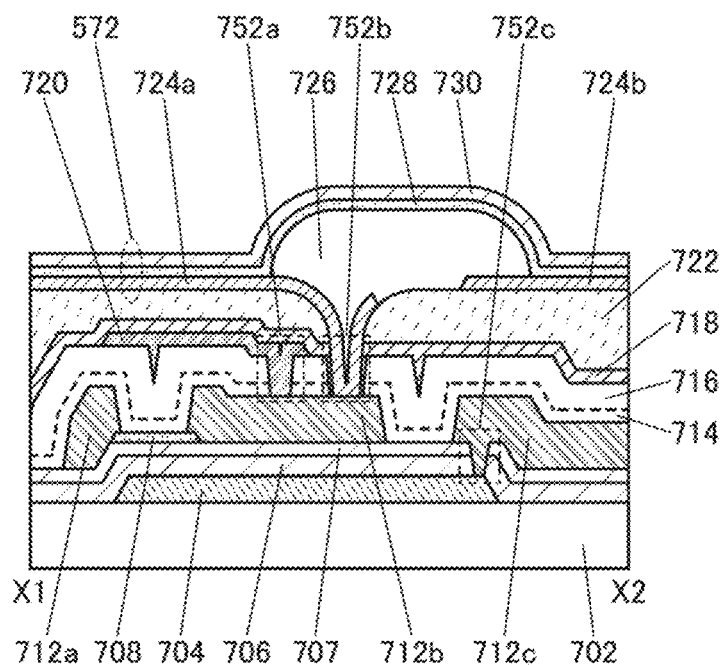

An example of a display device including the pixel circuit shown in FIG. 51B is described with reference to FIGS. 54A and 54B. FIG. 54A is a top view of a pixel portion of the display device, and FIG. 54B is a cross-sectional view taken along the dashed-dotted line X1-X2 in FIG. 54A. Note that in FIG. 54A, some components are not illustrated in order to avoid complexity of the drawing.

The display device shown in FIGS. 54A and 54B includes a conductive film 704 functioning as a first gate electrode over a substrate 702, insulating films 706 and 707 over the conductive film 704, an oxide semiconductor film 708 over the insulating film 707, conductive films 712*a* and 712*b* functioning as a source electrode and a drain electrode over the insulating film 707 and the oxide semiconductor film 708, a conductive film 712*c* over the insulating film 707, insulating films 714 and 716 covering the oxide semiconductor film 708 and the conductive films 712*a*, 712*b*, and 712*c*, an oxide semiconductor film 720 functioning as a second gate electrode over the insulating film 716, an insulating film 718 over the insulating film 716 and the oxide semiconductor film 720, an insulating film 722 functioning as a planarization insulating film over the insulating film 718, conductive films 724*a* and 724*b* functioning as pixel electrodes over the insulating film 722, a structure body 726 having a function of suppressing electrical connection between the conductive film 724*a* and the conductive film 724*b*, an EL layer 728 over the conductive films 724*a* and 724*b* and the structure body 726, and a conductive film 730 over the EL layer 728.

The conductive film 712*c* is electrically connected to the conductive film 704 through an opening 752*c* provided in the insulating films 706 and 707. The oxide semiconductor film 720 functioning as a second gate electrode is electrically connected to the conductive film 712*b* through an opening 752*a* provided in the insulating films 714 and 716. The conductive film 724*a* is electrically connected to the conductive film 712*b* through an opening 752*b* provided in the insulating films 714, 716, 718, and 722.

The conductive film 724*a* functioning as a pixel electrode, the EL layer 728, and the conductive film 730 form the light-emitting element 572. Note that the EL layer 728 can be formed by any of the following methods: a sputtering method, an evaporation method (including a vacuum evaporation method), a printing method (such as relief printing, intaglio printing, gravure printing, planography printing, and stencil printing), an ink jet method, a coating method, and the like.

When a structure including two transistors and one capacitor as shown in FIG. 54B and FIGS. 54A and 54B is used as a structure of a pixel of the display device, the number of wirings can be reduced. For example, the pixel shown in FIG. 54B and FIG. 54A includes three wirings, i.e., a gate line, a data line, and the anode line. A pixel with such a structure in the display device can have a high aperture ratio. Moreover, by reducing the number of wirings, a short circuit between adjacent wirings is unlikely to occur, for example. Thus, display devices can be provided with high yield.

Note that the structure described in this embodiment can be used in appropriate combination with any of the structures described in the other embodiments.

Embodiment 5

In this embodiment, a display device including the semiconductor device of one embodiment of the present invention and an electronic device in which the display device is provided with an input device will be described with reference to FIGS. 55A and 55B, FIGS. 56A and 56B, FIGS. 57A to 57C, FIGS. 58A and 58B, FIG. 59, FIGS. 60A and 60B, FIGS. 61A and 61B, and FIG. 62.

<5-1. Touch Panel>

In this embodiment, a touch panel 2000 including a display device and an input device will be described as an example of an electronic device. In addition, an example in which a touch sensor is used as an input device will be described.

Figure 55A:
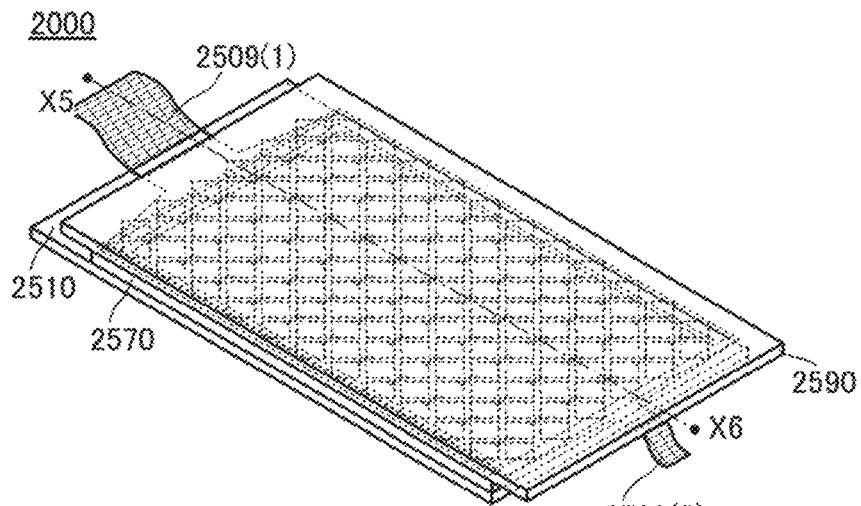
FIGS. 55A and 55B are perspective views illustrating an example of a touch panel.
Figure 55B:
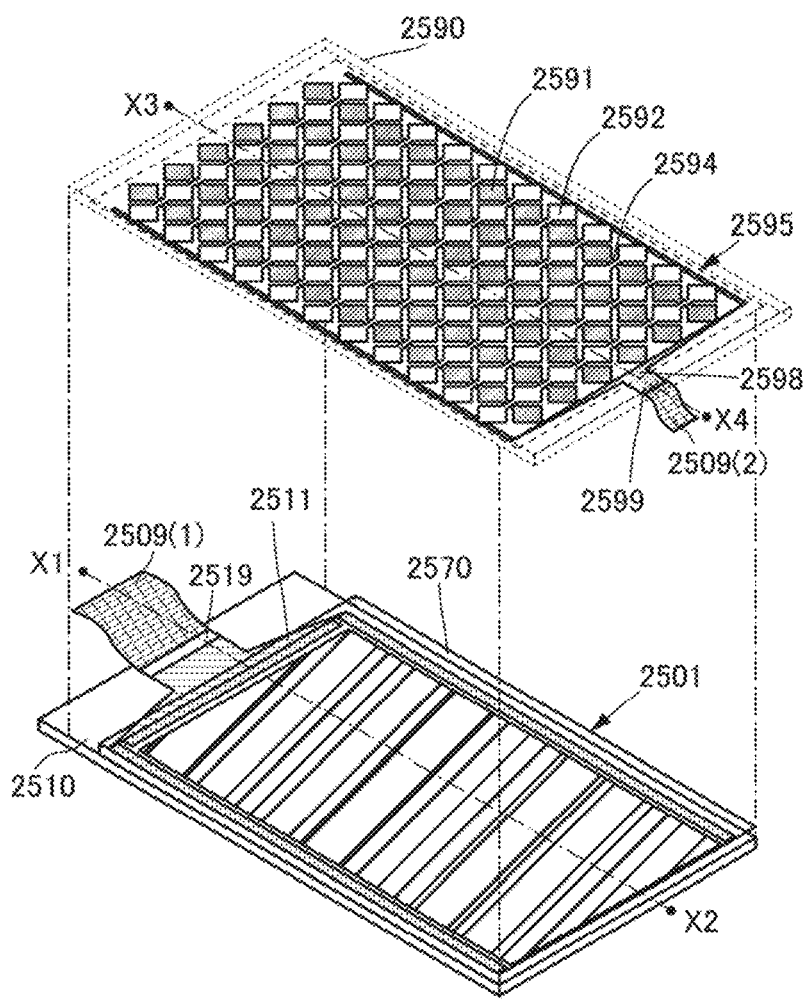

FIGS. 55A and 55B are perspective views of the touch panel 2000. Note that FIGS. 55A and 55B illustrate only main components of the touch panel 2000 for simplicity.

The touch panel 2000 includes a display device 2501 and a touch sensor 2595 (see FIG. 55B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

Figure 56A:
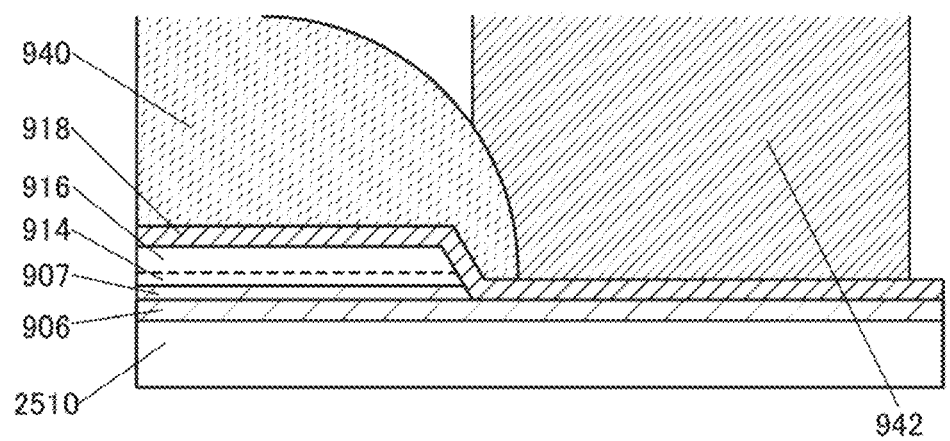
FIGS. 56A and 56B are schematic cross-sectional views illustrating an example of an outer edge and an example of a terminal portion of a display device.
Figure 56B:
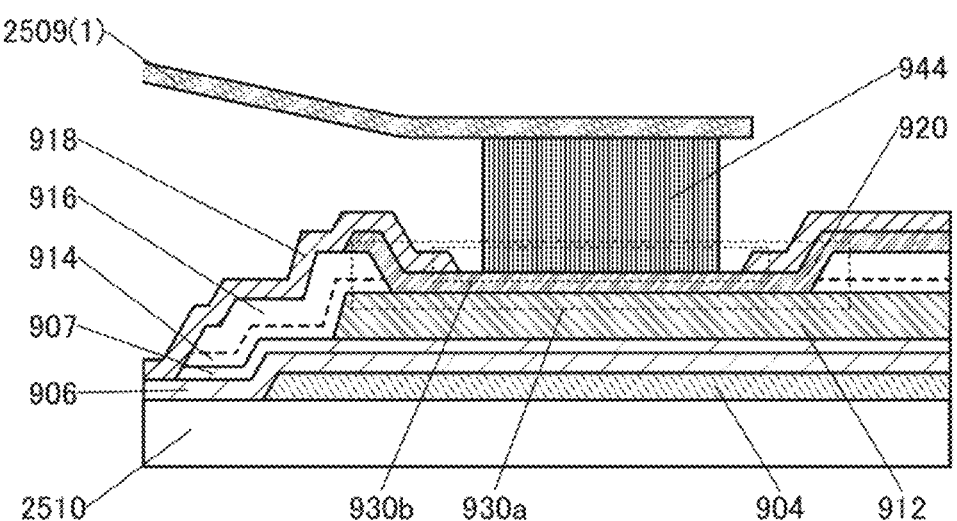
Figure 57A:
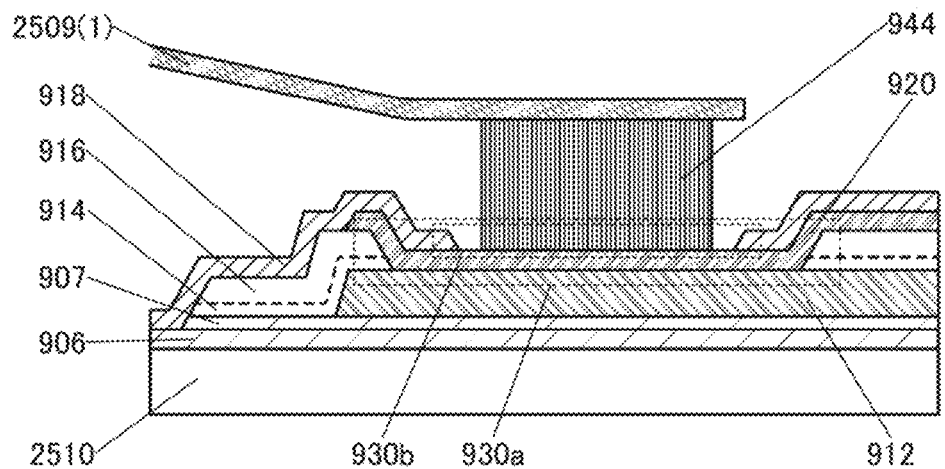
FIGS. 57A to 57C are schematic cross-sectional views illustrating examples of a terminal portion of a display device.
Figure 57B:
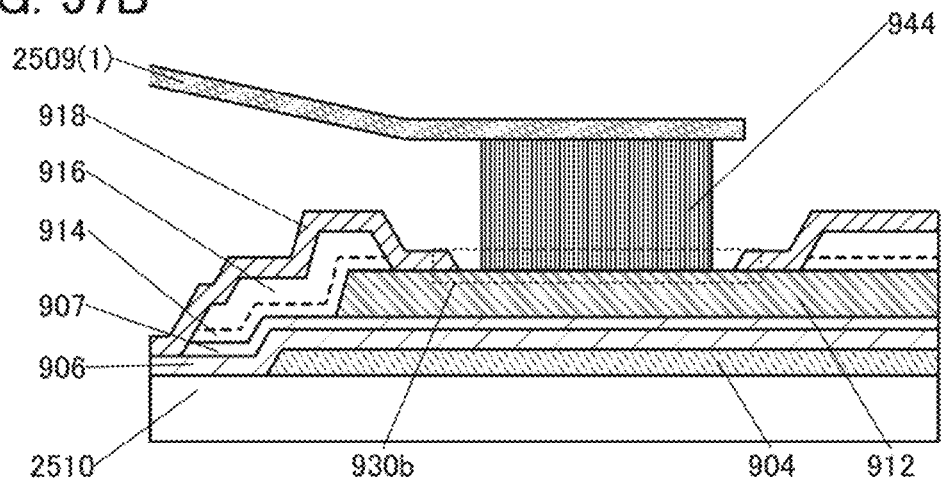
Figure 57C:
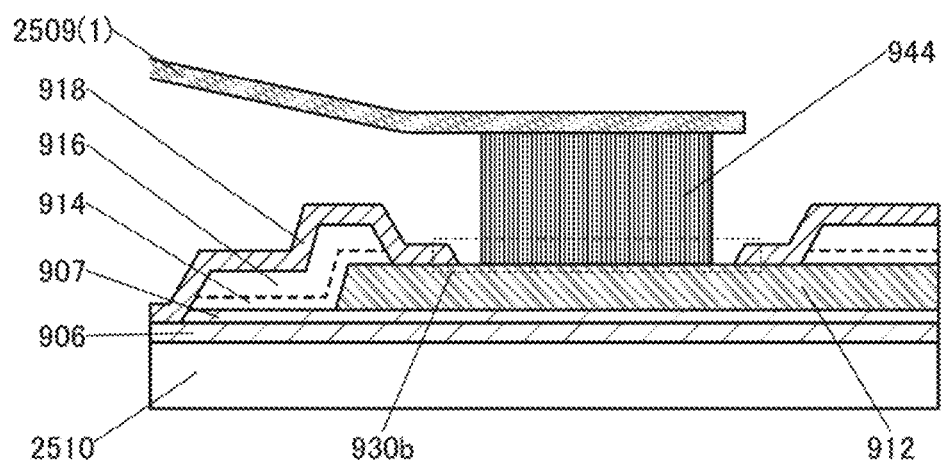

Structure examples of an outer edge of the substrate 2510 and a terminal portion of the display device 2501 are described with reference to FIGS. 56A and 56B and FIGS. 57A to 57C. FIG. 56A is a cross-sectional view illustrating an example of the outer edge of the substrate. FIG. 56B is a cross-sectional view illustrating an example of the terminal portion. FIGS. 57A to 57C are cross-sectional views illustrating examples of the terminal portion.

The structure shown in FIG. 56A includes the following components: an insulating film 906 over the substrate 2510; an insulating film 907 over the insulating film 906; insulating films 914 and 916 over the insulating film 907; an insulating film 918 over the insulating film 906 and the insulating film 916; an insulating film 940 over the insulating film 918; and a sealing material 942 over the insulating film 918 and the insulating film 940.

The insulating films 906, 907, 914, 916, and 918 can be formed using materials and methods similar to those of the insulating films 106, 107, 114, 116, and 118 in Embodiment 1, respectively.

For the insulating film 940, an organic insulating material such as an acrylic resin can be used. Moreover, the insulating film 940 can planarize unevenness and the like due to the transistor and the like. For example, an epoxy-based resin or a glass frit is preferably used as the sealing material 942. As a material used for the sealing material, a material which is impermeable to moisture or oxygen is preferably used.

The structure of the outer edge of the substrate shown in FIG. 56A can suppress entry of impurities such as moisture from outside because the insulating film 906 and the insulating film 918 are in contact with each other.

The structure shown in FIG. 56B includes the following components: a conductive film 904 over the substrate 2510; the insulating film 906 over the substrate 2510 and the conductive film 904; the insulating film 907 over the insulating film 906; a conductive film 912 over the insulating film 907; the insulating films 914 and 916 over the conductive film 912; the oxide semiconductor film 920 over the insulating film 916 and the conductive film 912; and the insulating film 918 over the insulating films 906 and 916 and the oxide semiconductor film 920. An opening 930a to the oxide semiconductor film 920 is formed in the insulating films 914 and 916. An opening 930b to the oxide semiconductor film 920 is formed in the insulating film 918. The oxide semiconductor film 920 is electrically connected to the FPC 2509(1) through an anisotropic conductive film 944.

The conductive films 904 and 912 and the oxide semiconductor film 920 can be formed using materials and methods similar to those of the conductive films 104 and 112 and the oxide semiconductor film 120 in Embodiment 1, respectively.

In the structure shown in FIG. 56B, the conductive film 904 is provided over the substrate 2510, but one embodiment of the present invention is not limited to this example. For example, a structure in which the conductive film 904 is not provided over the substrate 2510 as shown in FIG. 57A may be used. In the structure shown in FIG. 56B, the oxide semiconductor film 920 is provided over the conductive film 912, but one embodiment of the present invention is not limited thereto. For example, a structure in which the oxide semiconductor film 920 is not provided as shown in FIG. 57B may be used. Alternatively, a structure in which the conductive film 904 and the oxide semiconductor film 920 are not provided as shown in FIG. 57C may be used.

Note that the oxide semiconductor film 920 is preferably provided in a region connected to the anisotropic conductive film 944 as shown in FIG. 56B and FIG. 57A. The structure including the oxide semiconductor film 920 can achieve close contact with the anisotropic conductive film 944.

Back to the description of FIG. 55B. The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 55B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 55B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIG. 55B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 Ω/sq. or more and 100 Ω/sq. or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<5-2. Display Device>

Figure 58A:
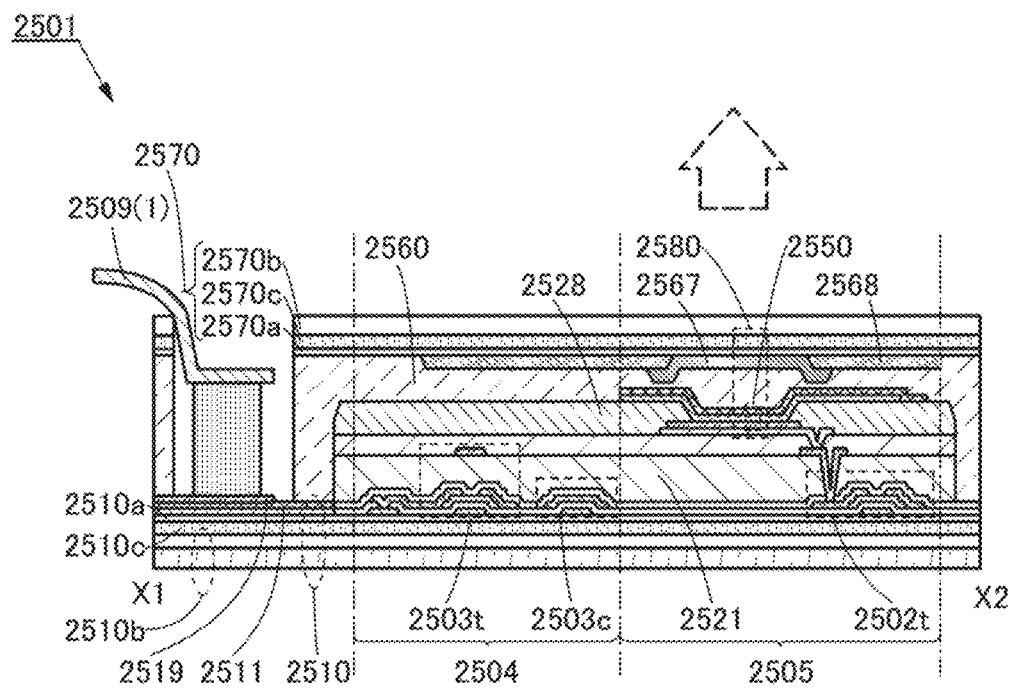
FIGS. 58A and 58B are cross-sectional views showing examples of a display device.
Figure 58B:
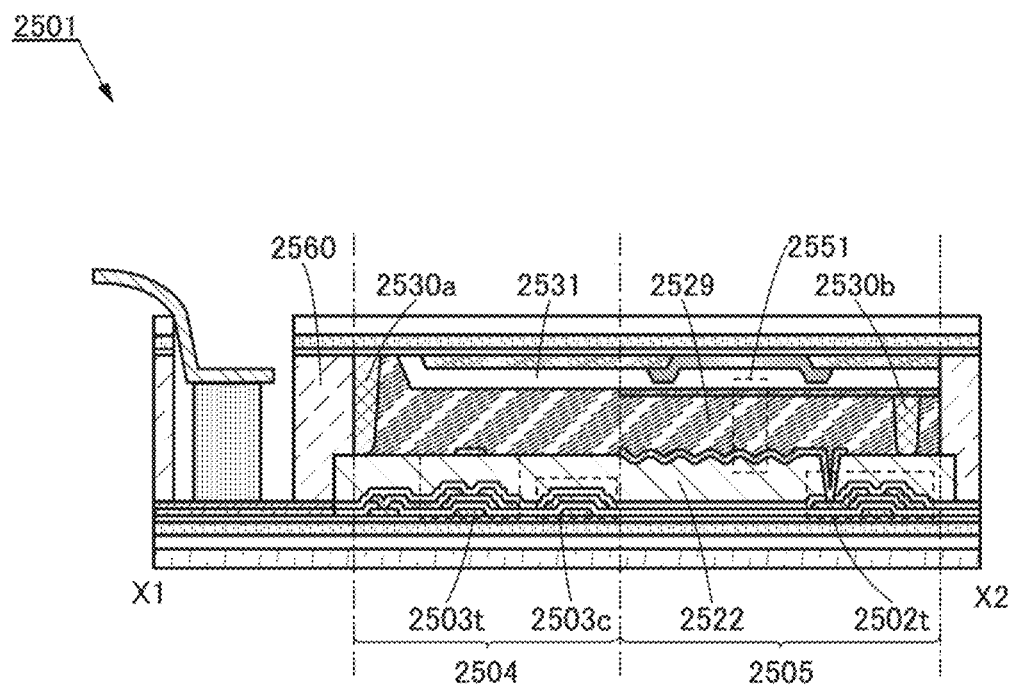

Next, the display device 2501 will be described in detail with reference to FIGS. 58A and 58B. FIGS. 58A and 58B correspond to cross-sectional views taken along dashed-dotted line X1-X2 in FIG. 55B.

The display device 2501 includes a plurality of pixels arranged in a matrix. Each of the pixels includes a display element and a pixel circuit for driving the display element.

[Structure with EL Element as Display Element]

First, a structure that uses an EL element as a display element will be described below with reference to FIG. 58A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, acrylic, polyurethane, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 58A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like.

The display device 2501 illustrated in FIG. 58A includes a pixel 2505. The pixel 2505 includes a light-emitting module 2580, the EL element 2550 and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 58A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502*t* and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502*t* or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503*t* and a capacitor 2503*c*. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502*t* and 2503*t*. The transistors used in this embodiment each include an oxide semiconductor film which is highly purified and has high crystallinity. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. Note that the detail of the refresh operation will be described later.

In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

[Structure with Liquid Crystal Element as Display Element]

Next, a structure including a liquid crystal element as a display element is described below with reference to FIG. 58B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 58B has the same structure as the display device 2501 illustrated in FIG. 58A except for the following points.

The pixel 2505 in the display device 2501 illustrated in FIG. 58B includes a liquid crystal element 2551 and the transistor 2502*t* that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530*a* and a spacer 2530*b* are provided. Although not illustrated in FIG. 58B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530*a* and 2530*b* are formed by selectively etching an insulating film. The spacers 2530*a* and 2530*b* are provided in order to control the distance between the substrate 2510 and the substrate 2570 (the cell gap). Note that the spacers 2530*a* and 2530*b* may have different sizes from each other and are preferably have a columnar or spherical shape. Although the spacers 2530*a* and 2530*b* are provided on the substrate 2570 side in the non-limiting structure in FIG. 58B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 has a function of a reflective electrode. The display device 2501 illustrated in FIG. 58B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 58B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<5-3. Touch Sensor>

Figure 59:
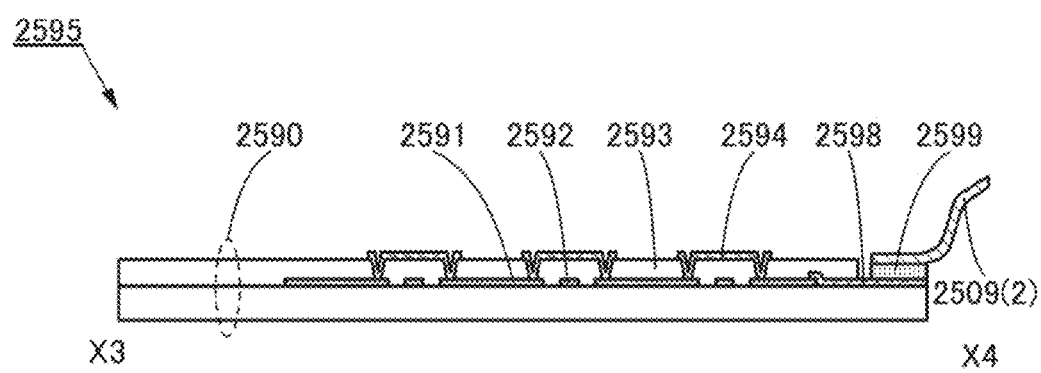
FIG. 59 is a cross-sectional view illustrating an example of a touch sensor.

Next, the touch sensor 2595 will be described in detail with reference to FIG. 59. FIG. 59 corresponds to a cross-sectional view taken along dashed-dotted line X3-X4 in FIG. 55B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<5-4. Touch Panel>

Figure 60A:
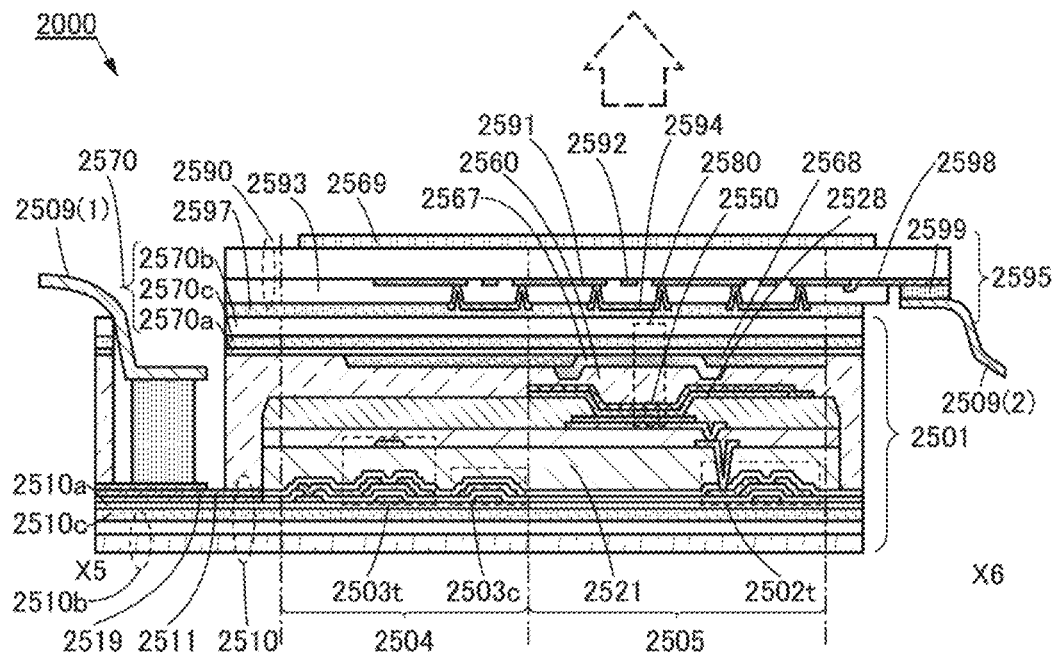
FIGS. 60A and 60B are cross-sectional views showing examples of a touch panel.

Next, the touch panel 2000 will be described in detail with reference to FIG. 60A. FIG. 60A corresponds to a cross-sectional view taken along dashed-dotted line X5-X6 in FIG. 55A.

In the touch panel 2000 illustrated in FIG. 60A, the display device 2501 described with reference to FIG. 55A and the touch sensor 2595 described with reference to FIG. 59 are attached to each other.

The touch panel 2000 illustrated in FIG. 60A includes an adhesive layer 2597 and an anti-reflective layer 2569 in addition to the components described with reference to FIG. 58A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 60A will be described with reference to FIG. 60B.

Figure 60B:
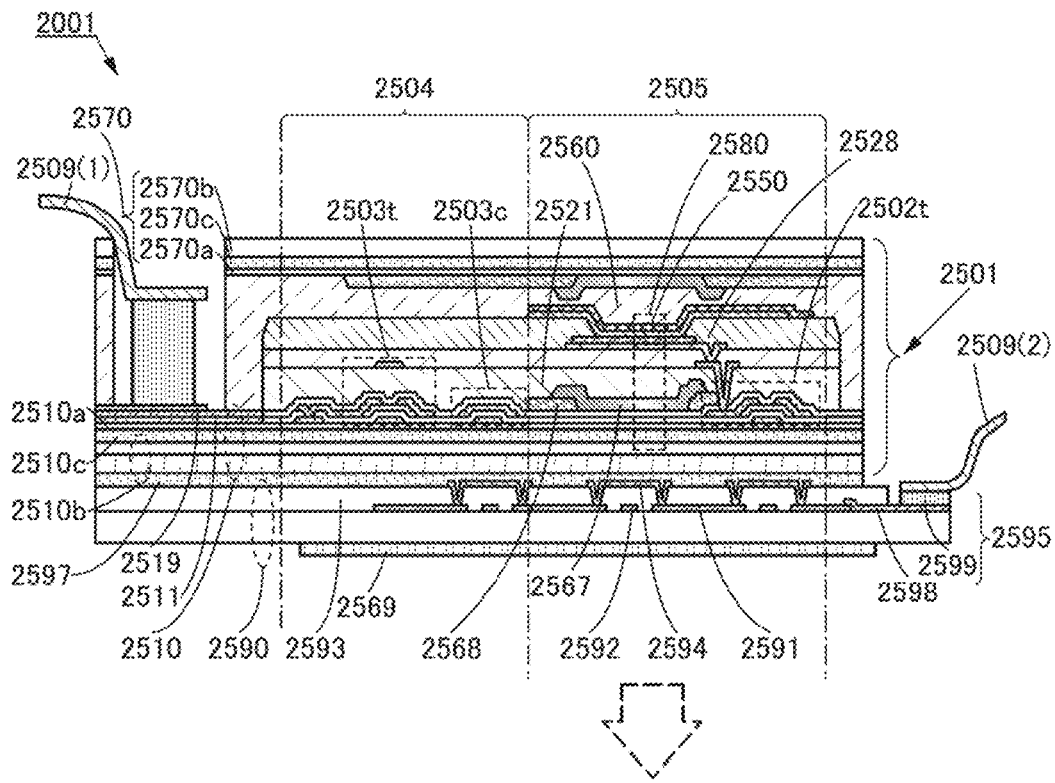

FIG. 60B is a cross-sectional view of a touch panel 2001. The touch panel 2001 illustrated in FIG. 60B differs from the touch panel 2000 illustrated in FIG. 60A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 60B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 60B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 60A or FIG. 60B, light may be emitted from the light-emitting element through one or both of the substrate 2510 and the substrate 2570.

<5-5. Driving Method of Touch Panel>

Next, an example of a method for driving a touch panel will be described with reference to FIGS. 61A and 61B.

Figure 61A:
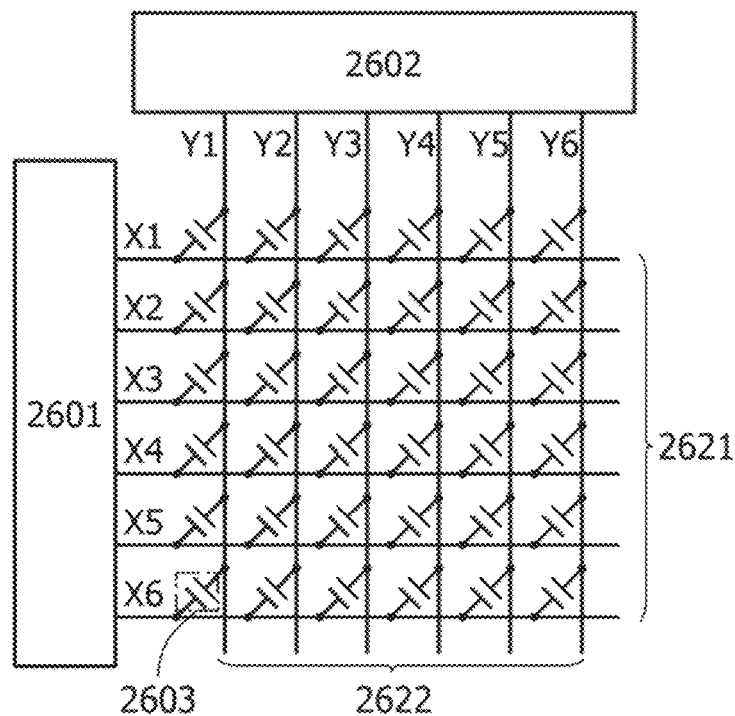
FIGS. 61A and 61B are a block diagram and a timing chart of a touch sensor.

FIG. 61A is a block diagram illustrating the structure of a mutual capacitive touch sensor. FIG. 61A illustrates a pulse voltage output circuit 2601 and a current sensing circuit 2602. Note that in FIG. 61A, six wirings X1 to X6 represent the electrodes 2621 to which a pulse voltage is applied, and six wirings Y1 to Y6 represent the electrodes 2622 that detect changes in current. FIG. 61A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 61B:
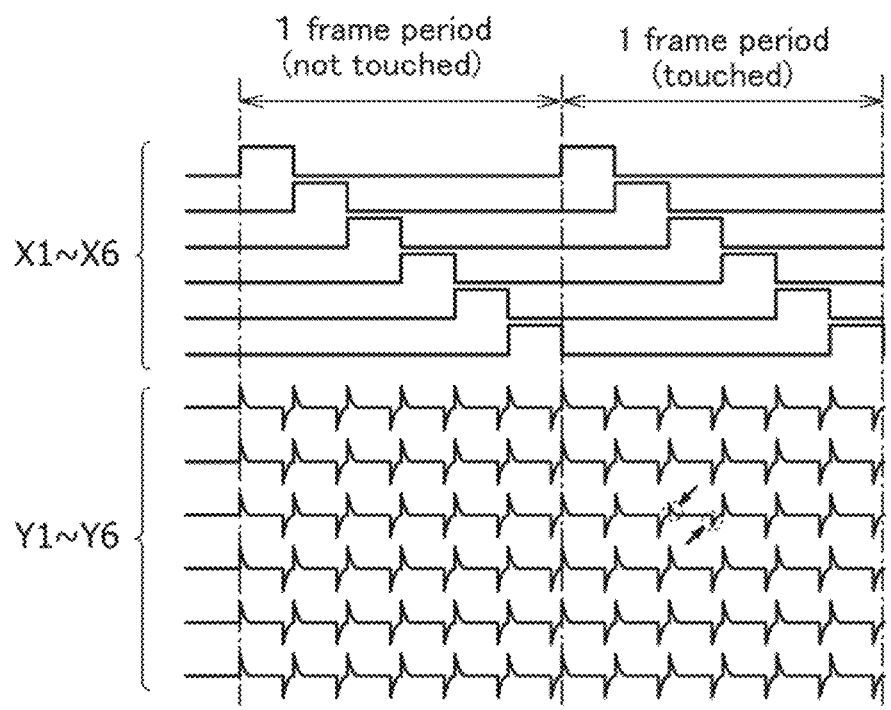

FIG. 61B is a timing chart showing input and output waveforms in the mutual capacitive touch sensor illustrated in FIG. 61A. In FIG. 61B, sensing of a sensing target is performed in all the rows and columns in one frame period. FIG. 61B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<5-6. Sensor Circuit>

Figure 62:
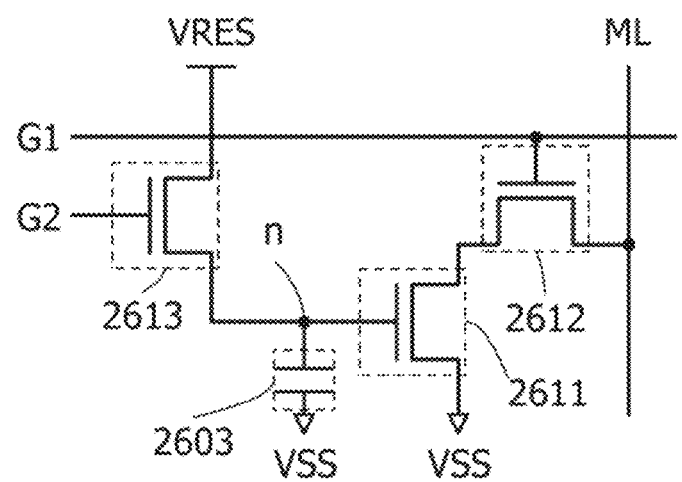
FIG. 62 is a circuit diagram of a touch sensor.

Although FIG. 61A illustrates a passive type touch sensor in which only the capacitor 2603 is provided at the intersection of wirings as a touch sensor, an active type touch sensor including a transistor and a capacitor may be used. FIG. 62 illustrates an example of a sensor circuit included in an active type touch sensor.

The sensor circuit in FIG. 62 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIGS. 60A and 60B will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

Note that the structure described in this embodiment can be used in appropriate combination with any of the structures described in the other embodiments.

Embodiment 6

In this embodiment, a display device using a horizontal electric field mode liquid crystal element as a display element is described with reference to FIG. 63.

FIG. 63 shows flow charts illustrating manufacturing processes of display devices using horizontal electric field mode liquid crystal elements. In FIG. 63, examples of manufacturing processes in the cases of using an oxide semiconductor (in particular, CAAC-OS), using low-temperature poly-silicon (LTPS), and using hydrogenated amorphous silicon (a-Si:H) as active layers of transistors are shown.

<6-1. CAAC-OS>

The case of using CAAC-OS in the transistor is described. First, a gate electrode (GE: gate electrode) is formed with a sputtering apparatus (SP). Note that one mask is used when the gate electrode is processed.

Then, a gate insulating film (GI: gate insulator) is formed over the gate electrode with a PECVD apparatus. After that, an oxide semiconductor (OS) film to be an active layer is formed over the gate insulating film with a sputtering apparatus. Note that one mask is used when the oxide semiconductor film is processed into an island shape.

Then, parts of the gate insulating film are processed to form openings to the gate electrode. Note that one mask is used when the openings are formed.

Then, a conductive film is formed over the gate insulating film and the oxide semiconductor film with a sputtering apparatus, and the conductive film is processed to form a source electrode and a drain electrode (S/D electrodes). Note that one mask is used when the source electrode and the drain electrode are formed.

After that, a passivation film is formed over the oxide semiconductor film, the source electrode, and the drain electrode with a PECVD apparatus.

Then, a part of the passivation film is processed to form an opening to the source electrode or the drain electrode. Note that one mask is used when the opening is formed.

Then, a conductive film is formed over the passivation film with a sputtering apparatus to cover the opening formed in the passivation film, and the conductive film is processed to form a common electrode. Note that one mask is used when the common electrode is formed.

Then, an insulating film is formed over the passivation film and the common electrode with a PECVD apparatus. After that, an opening to the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using CAAC-OS, a total of eight masks are used for manufacturing the horizontal electric field mode liquid crystal display device.

<6-2. LTPS>

The case of using LTPS in the transistor is described. First, a light-blocking film is formed with a sputtering apparatus. Note that one mask is used when the light-blocking film is processed.

Then, a base insulating film is formed over the light-blocking film with a PECVD apparatus. After that, a Si film to be an active layer is formed over the base insulating film with a PECVD apparatus, followed by excimer laser annealing (ELA) for crystallization of the Si film. Owing to the ELA process, the Si film for the active layer becomes a poly-silicon (p-Si) film. Note that large equipment is required to perform ELA on a large area. Linear irregularities and the like peculiar to ELA occur in some cases.

Then, the p-Si film is processed into an island shape. Note that one mask is used when the p-Si film is processed into an island shape.

Then, a gate insulating film (GI) is formed over the p-Si film with a PECVD apparatus, followed by the formation of a gate electrode (GE) over the gate insulating film with a sputtering apparatus. Note that one mask is used when the gate electrode is formed. A part of the gate insulating film is removed when the gate electrode is formed.

After that, impurity implantation is performed with an ion doping (ID) apparatus to form $n^+$ regions in the p-Si film. Note that one mask is used when the $n^+$ regions are formed. Then, impurity implantation is performed with an ion doping apparatus to form $n^-$ regions in the p-Si film. Note that when the $n^-$ regions are formed, a mask is not used and doping is performed on an entire surface. Then, impurity implantation is performed with an ion doping apparatus to form $p^+$ regions in the p-Si film. Note that one mask is used to form the $p^+$ regions.

After that, thermal activation is performed. An annealing furnace, an RTA apparatus, or the like may be used for the thermal activation.

Then, an interlayer insulating film is formed over the p-Si and the gate electrode with a PECVD apparatus. After that, parts of the interlayer insulating film and parts of the gate insulating film are processed to form openings to the $n^+$ regions and the $p^+$ regions. Note that one mask is used when the openings are formed.

Then, a conductive film is formed with a sputtering apparatus over the interlayer insulating film in which the openings are formed, and the conductive film is processed to form a source electrode and a drain electrode (S/D electrodes). Note that one mask is used when the source electrode and the drain electrode are formed.

After that, a planarization insulating film is formed over the source electrode and the drain electrode with a coater apparatus. As the planarization insulating film, an organic resin film may be used, for example. Note that one mask is used when the planarization insulating film is formed.

Then, a conductive film is formed over the planarization insulating film with a sputtering apparatus, followed by the formation of a common electrode over the conductive film. Note that one mask is used when the common electrode is formed.

Then, an insulating film is formed over the common electrode with a PECVD apparatus. After that, an opening to the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using LTPS, a total of eleven masks are used for manufacturing the horizontal electric field mode liquid crystal display device.

<6-3. a-Si:H>

The case of using a-Si:H in the transistor is described. First, a gate electrode (GE) is formed with a sputtering apparatus. Note that one mask is used when the gate electrode is processed.

Then, a gate insulating film (GI) is formed over the gate electrode with a PECVD apparatus. After that, a silicon film to be an active layer is formed over the gate insulating film with a PECVD apparatus. Note that one mask is used when the silicon film is processed into an island shape.

Then, a part of the gate insulating film is processed to form an opening to the gate electrode. Note that one mask is used when the opening is formed.

Then, a conductive film is formed over the gate insulating film with a sputtering apparatus, and the conductive film is processed to form a capacitor electrode. Note that one mask is used when the capacitor electrode is processed.

Then, a conductive film is formed over the gate insulating film and the silicon film with a sputtering apparatus, and the conductive film is processed to form a source electrode and a drain electrode (S/D electrodes). Note that one mask is used when the source electrode and the drain electrode are formed.

Then, a conductive film is formed over the source electrode and the drain electrode with a sputtering apparatus, and the conductive film is processed to form a common electrode. Note that one mask is used when the common electrode is formed.

Then, an insulating film is formed over the common electrode with a PECVD apparatus. After that, an opening to the source electrode or the drain electrode is formed in a part of the insulating film. Note that one mask is used when the insulating film is formed (when the opening is formed in the part of the insulating film).

Then, a conductive film is formed over the insulating film with a sputtering apparatus, and the conductive film is processed to form a pixel electrode. Note that one mask is used when the pixel electrode is formed.

Through the above-described process, a horizontal electric field mode liquid crystal display device can be manufactured. Note that in the case of using a-Si:H, a total of eight masks are used for manufacturing the horizontal electric field mode liquid crystal display device.

Note that in each of the flow charts of the CAAC-OS, the LTPS, and the a-Si:H, steps of forming the common electrode, forming the insulating film over the common electrode, and forming the pixel electrode are peculiar to the manufacturing process of the horizontal electric field mode liquid crystal display device. Therefore, a process different from that of the horizontal electric field mode liquid crystal display device is used in the case of manufacturing a liquid crystal display device using a vertical electric field mode (e.g., VA mode) liquid crystal element or in the case of using an organic EL element as a display element.

As shown in FIG. 63, in the case of using CAAC-OS in the transistor for the horizontal electric field mode liquid crystal element, the transistor can be manufactured by a simpler process than in the case of using LTPS. Moreover, the transistor using CAAC-OS is manufactured with the same number of masks as those used for manufacturing the transistor using a-Si:H and has high mobility. Therefore, when the transistor using CAAC-OS is employed, a part or whole of a driver circuit (a gate driver or a source driver) can be provided in a display device.

Characteristics of each of the processes are summarized in Table 3.

TABLE 3

| | CAAC-OS | | LTPS | | a-Si:H | |
|---|---|---|---|---|---|---|
| | TN, VA | Horizontal electric field | TN, VA | Horizontal electric field | TN, VA | Horizontal electric field |
| The number of masks for forming LCD | 6-7 | 6-8 | 9 | 11 | 4-5 | 8 or less |
| The number of masks for forming FET | (5) | | (6) | | (4) | |
| Maximum process temperature | 350° C. or less | | 400° C. or more | | 350° C. or less | |
| Gate driver | Possible | | Possible | | Possible | |
| Mobility [cm²/Vs] | 40 or less | | 100 or less | | 1 or less | |
| on/off ratio | 20 or less | | 9 or less | | 7 or less | |
| Device cost | Low | | High | | Low | |
| Plant cost | Low | | High | | Low | |

As shown in Table 3, in the case of using CAAC-OS, the number of masks is almost equivalent to that in the case of using a-Si:H, and the electrical characteristics such as the field-effect mobility (or simply referred to as mobility) and the on/off ratio are superior to those in the case of using a-Si:H. Thus, using CAAC-OS achieves a display device having high display quality. Moreover, as shown in Table 3, the maximum process temperature, the device cost, and the plant cost for CAAC-OS are lower than those of LTPS. Accordingly, the manufacturing cost for the display device can be saved.

Note that as compared to a transistor using silicon, a transistor using an oxide semiconductor typified by CAAC-OS achieves advantageous effects such as a low off-state current, no or very few short-channel effects, a high withstand voltage, and a small change in temperature characteristics. In addition, a transistor using an oxide semiconductor can operate at a high speed because of having a switching speed or frequency characteristics comparable to those of a transistor using silicon. Thus, a display device including a transistor using an oxide semiconductor can have high display quality and high reliability.

Note that the structure described in this embodiment can be used in appropriate combination with any of the other embodiments.

Embodiment 7

In this embodiment, a display device including a semiconductor device of one embodiment of the present invention and a method for driving the display device are described with reference to FIGS. 64A and 64B, FIGS. 65A and 65B, FIGS. 66A to 66E, and FIGS. 67A to 67E.

Note that the display device of one embodiment of the present invention may include an information processing unit, an arithmetic unit, a memory unit, a display unit, an input unit, and the like.

In the case where the display device of one embodiment of the present invention continuously displays the same image (still image), power consumption can be reduced by reducing the frequency of writing signals (also referred to as "refresh") for the same image. Note that the rate at which the refresh is performed is referred to as refresh rate (also referred to as scan frequency or vertical synchronization frequency). The display device that reduces eye strain by reducing the refresh rate is described below.

The eye strain is divided into two categories: nerve strain and muscle strain. The nerve strain is caused by prolonged looking at light emitted from a display device or blinking images. This is because the brightness stimulates and fatigues a retina, optic nerves, and a brain. The muscle strain is caused by overuse of a ciliary muscle which works for adjusting the focus.

Figure 64A:
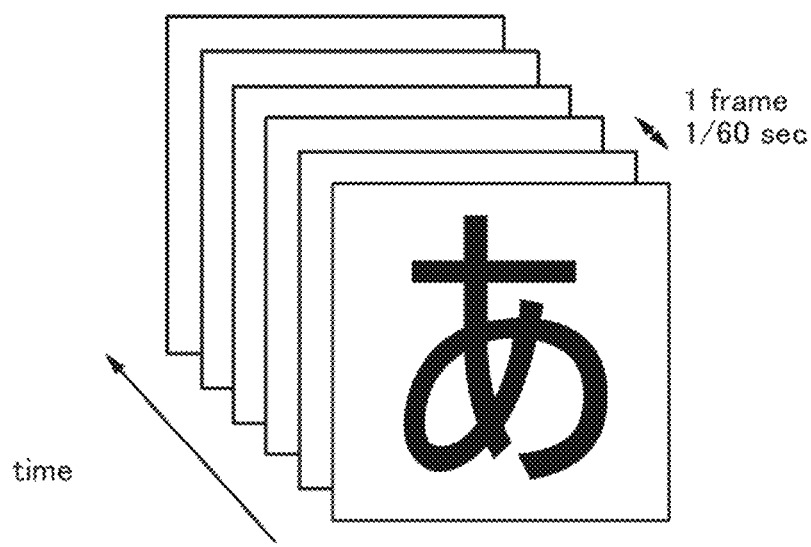
FIGS. 64A and 64B illustrate display of an image on a display device of one embodiment of the present invention.

FIG. 64A is a schematic diagram showing display on a conventional display device. As illustrated in FIG. 64A, for the display of the conventional display device, image rewriting is performed 60 times every second. A prolonged looking at such a screen might stimulate a retina, optic nerves, and a brain of a user and lead to eye strain.

In a display device of one embodiment of the present invention, a transistor using an oxide semiconductor, for example, a transistor using CAAC-OS is used in a pixel portion of the display device. The off-state current of the transistor is extremely low. Therefore, the luminance of the display device can be kept even when the refresh rate of the display device is lowered.

Figure 64B:
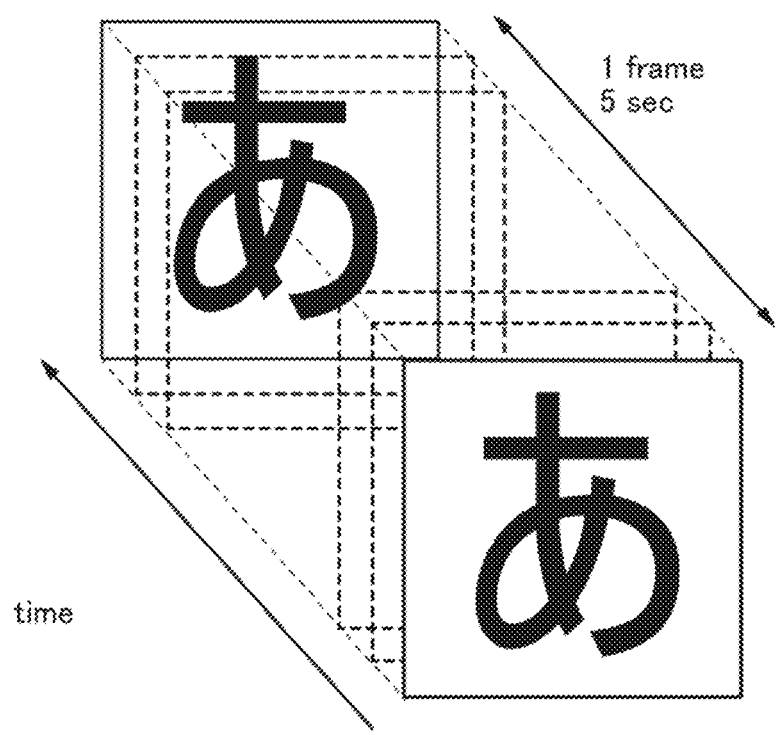

Thus, for example, the number of times of image writing can be reduced to once every five seconds as illustrated in FIG. 64B. The same image can be displayed for as long as possible and flickers on a screen perceived by a user can be reduced. Consequently, a stimulus to the retina or the nerve of an eye or the brain of the user is relieved, resulting in less nervous fatigue.

Figure 65A:
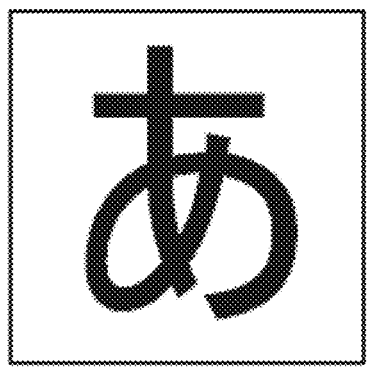
FIGS. 65A and 65B illustrate display of an image on a display device of one embodiment of the present invention.

In the case where the size of one pixel is large (e.g., the resolution is less than 150 ppi), a blurred character is displayed by a display device as shown in FIG. 65A. When users look at the blurred character displayed on the display device for a long time, their ciliary muscles keep working to adjust the focus in a state where adjusting the focus is difficult, which might lead to eye strain.

Figure 65B:
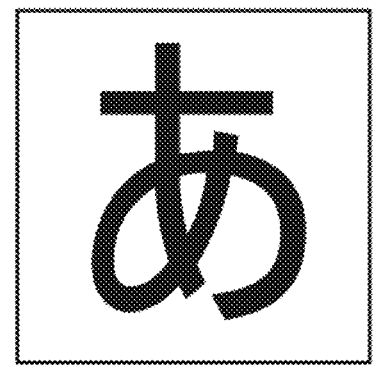

In contrast, the display device of one embodiment of the present invention has a small-size pixel and thus can display high-resolution images, so that a precise and smooth image can be displayed as shown in FIG. 65B. In this case, the ciliary muscle can easily focus the eye on the character, so that the user's muscular fatigue is reduced. When the resolution of the display device is 150 ppi or more, preferably 200 ppi or more, more preferably 300 ppi or more, the user's muscular fatigue can be effectively reduced.

Methods for quantifying eye fatigue have been studied. For example, critical flicker (fusion) frequency (CFF) is known as an indicator for evaluating nervous fatigue. Further, focus adjustment time, near point distance, and the like are known as indicators for evaluating muscular fatigue.

Others methods for evaluating eye fatigue include electroencephalography, thermography, counting the number of times of blinking, measuring the amount of tears, measuring the speed of contractile response of the pupil, and questionnaires for surveying subjective symptoms.

The method for driving the display device of one embodiment of the present invention can be evaluated by any of the variety of methods above, for example.

<7. Method for Driving Display Device>

Now, a method for driving the display device of one embodiment of the present invention is described with reference to FIGS. 66A to 66E.

[Display Example of Image Information]

An example of displaying two images including different image data by being transferred is described below.

Figure 66A:
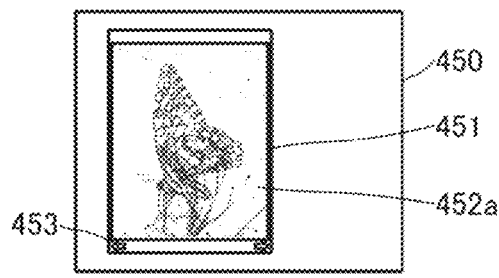
FIGS. 66A to 66E illustrate an example of a method for displaying images on a display device according to Embodiment.

FIG. 66A illustrates an example in which a window 451 and a first image 452a which is a still image displayed in the window 451 are displayed on a display portion 450.

At this time, display is preferably performed at a first refresh rate. Note that the first refresh rate can be higher than or equal to $1.16 \times 10^{-5}$ Hz (about once per day) and lower than or equal to 1 Hz, higher than or equal to $2.78 \times 10^{-4}$ Hz (about once per hour) and lower than or equal to 0.5 Hz, or higher than or equal to $1.67 \times 10^{-2}$ Hz (about once per hour) and lower than or equal to 0.1 Hz.

When frequency of rewriting an image is reduced by setting the first refresh rate to an extremely low value, display substantially without flicker can be achieved, and eye fatigue of a user can be effectively reduced.

The window 451 is displayed by, for example, executing application software for image display and includes a display region where an image is displayed.

Further, in a lower part of the window 451, a button 453 for switching a displayed image data to a different image data is provided. When a user performs operation in which the button 453 is selected, an instruction of transferring an image can be supplied to the information processing unit of the display device.

Note that the operation method performed by the user may be set in accordance with the input unit. For example, in the case where a touch panel provided to overlap with the display portion 450 is used as the input unit, input operation can be performed by touching the button 453 with a finger or a stylus or performing gesture operation where an image is made to slide. In the case where the input operation is performed with gesture or sound, the button 453 is not necessarily displayed.

Figure 66B:
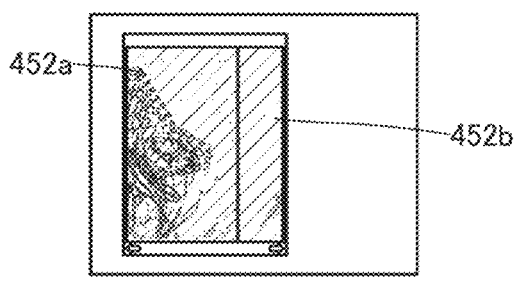

When the information processing unit of the display device receives the instruction of transferring an image, transfer of the image displayed in the window 451 starts (see FIG. 66B).

Note that in the case where display is performed at the first refresh rate in the state of FIG. 66A, the refresh rate is preferably changed to a second refresh rate before transfer of the image starts. The second refresh rate is a value necessary for displaying a moving image. For example, the second refresh rate can be higher than or equal to 30 Hz and lower than or equal to 960 Hz, preferably higher than or equal to 60 Hz and lower than or equal to 960 Hz, further preferably higher than or equal to 75 Hz and lower than or equal to 960 Hz, still further preferably higher than or equal to 120 Hz and lower than or equal to 960 Hz, still further preferably higher than or equal to 240 Hz and lower than or equal to 960 Hz.

When the second refresh rate is set to a higher value than the first refresh rate, a moving image can be displayed further smoothly and naturally. In addition, flicker which accompanies rewriting of data is less likely to be recognized by a user, whereby eye fatigue of a user can be reduced.

At this time, an image where the first image 452a and a second image 452b that is to be displayed next are combined is displayed in the window 451. The combined image is transferred unidirectionally (leftward in this case), and part of a region is displayed in the window 451.

Further, when the combined image transfers, luminance of the image displayed in the window 451 is gradually lowered from the initial luminance at the time of the state in FIG. 66A.

Figure 66C:
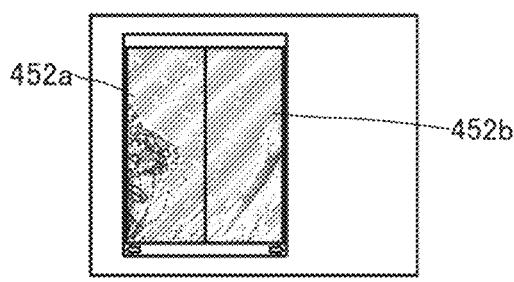

FIG. 66C illustrates a state where the image displayed in the window 451 reaches a position of the predetermined coordinates. Thus, the luminance of the image displayed in the window 451 at this time is lowest.

Note that the predetermined coordinates in FIG. 66C is set so that half of the first image 452a and half of the second image 452b are displayed; however, the coordinates are not limited to the above, and it is preferable that the coordinates be set freely by a user.

For example, the predetermined coordinates may be set so that the ratio of the distance between the initial coordinates and the predetermined coordinates to the distance between the initial coordinates and the final coordinates is higher than 0 and lower than 1.

In addition, it is also preferable that luminance when the image reaches the position of the predetermined coordinates be set freely by a user. For example, the ratio of the luminance when the image reaches the position of the predetermined coordinates to the initial luminance may be higher than 0 and lower than 1, preferably higher than or equal to 0 and lower than or equal to 0.8, further preferably higher than or equal to 0 and lower than or equal to 0.5.

Figure 66D:
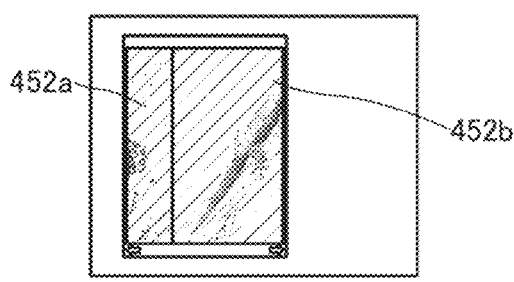

Next, in the window 451, the combined image transfers with the luminance increasing gradually (FIG. 66D)

Figure 66E:
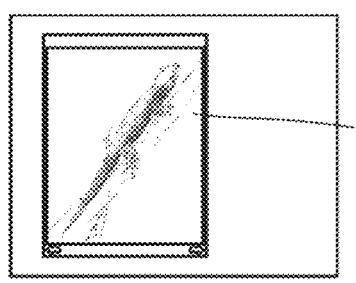

FIG. 66E illustrates a state when the combined image reaches the position of the final coordinates. In the window 451, only the second image 452b is displayed with luminance equal to the initial luminance.

Note that after the transfer of the image is completed, the refresh rate is preferably changed from the second refresh rate to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

[Display Example of Document Information]

Next, an example in which document information whose dimension is larger than a display window is displayed by scrolling is described below.

Figure 67A:
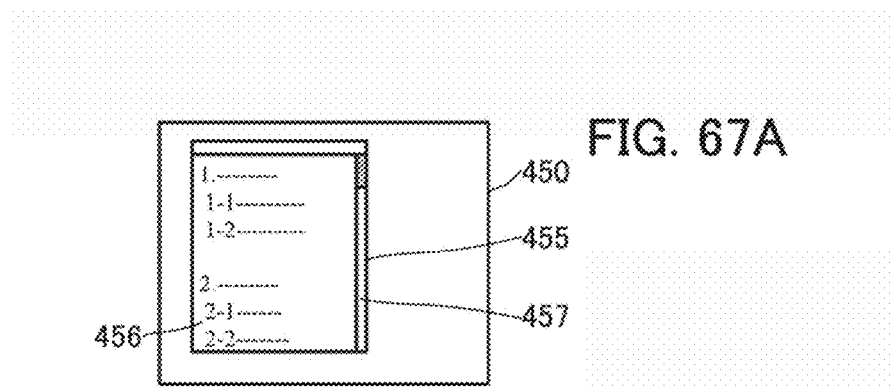
FIGS. 67A to 67E illustrate an example of a method for displaying images on a display device according to Embodiment.

FIG. 67A illustrates an example in which a window 455 and part of document information 456 which is a still image displayed in the window 455 are displayed on the display portion 450.

At this time, display is preferably performed at the first refresh rate.

The window 455 is displayed by, for example, executing application software for document display, application software for document preparation, or the like and includes a display region where document information is displayed.

The dimension of an image of the document information 456 is larger than the display region of the window 455 in the longitudinal direction. That is, part of the document information 456 is displayed in the window 455. Further, as illustrated in FIG. 67A, the window 455 may be provided with a scroll bar 457 which indicates which part in the whole of the document information 456 is displayed.

Figure 67B:
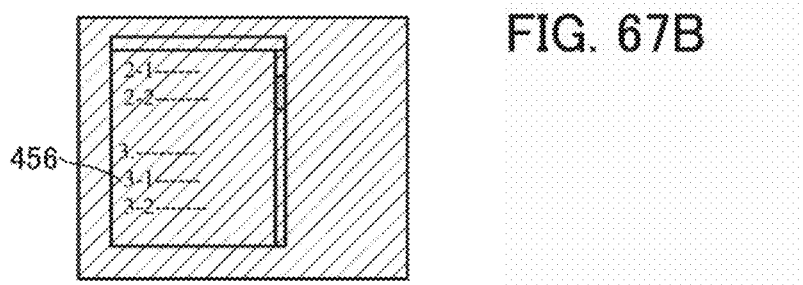

When an instruction of transferring an image (here, also referred to as scroll instruction) is supplied to the display device by the input unit, transfer of the document information 456 starts (FIG. 67B). In addition, luminance of the displayed image is gradually lowered.

Note that in the case where display is performed at the first refresh rate in the state of FIG. 67A, the refresh rate is preferably changed to the second refresh rate before transfer of the document information 456.

In this state, not only the luminance of the image displayed in the window 455 but the luminance of the whole image displayed on the display portion 450 is lowered.

Figure 67C:
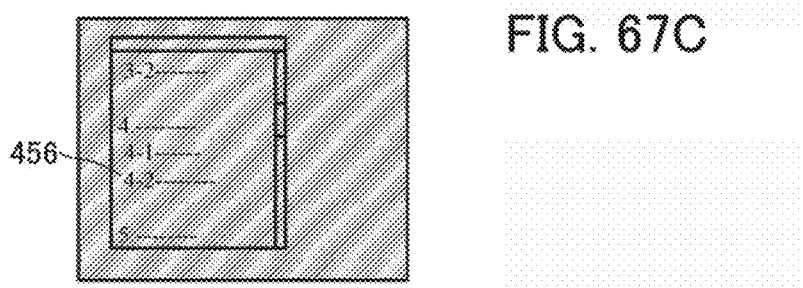

FIG. 67C illustrates a state when the document information 456 reaches a position of the predetermined coordinates. At this time, the luminance of the whole image displayed on the display portion 450 is the lowest.

Figure 67D:
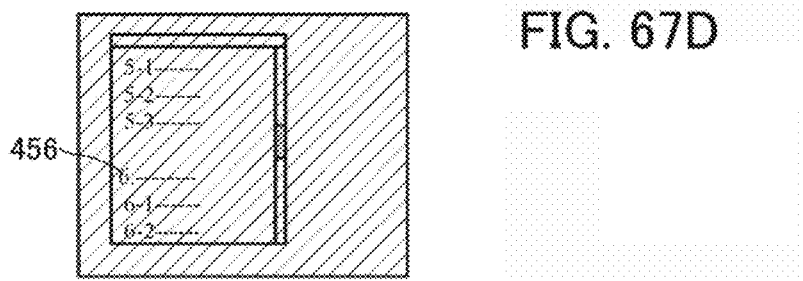

Then, the document information 456 is displayed in the window 455 while being transferred (FIG. 67D). Under this condition, the luminance of the whole image displayed on the display portion 450 is gradually increased.

Figure 67E:
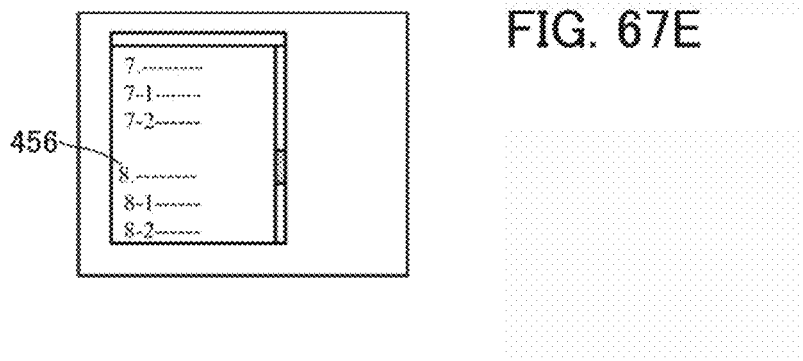

FIG. 67E illustrates a state where the document information 456 reaches a position of the final coordinates. In the window 455, a region of the document information 456, which is different from the region displayed in an initial state, is displayed with luminance equal to the initial luminance.

Note that after transfer of the document information 456 is completed, the refresh rate is preferably changed to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

In particular, display of document information or the like, which has relatively high contrast ratio, gives a user eye fatigue significantly; thus, it is preferable to apply such a driving method to the display of document information.

Note that this embodiment can be implemented in appropriate combination with any of the other embodiments disclosed in this specification.

Embodiment 8

In this embodiment, a display module, electronic devices, and a display device which include a semiconductor device of one embodiment of the present invention will be described with reference to FIG. 68, FIGS. 69A to 69G, and FIGS. 70A and 70B.

<8-1. Display Module>

Figure 68:
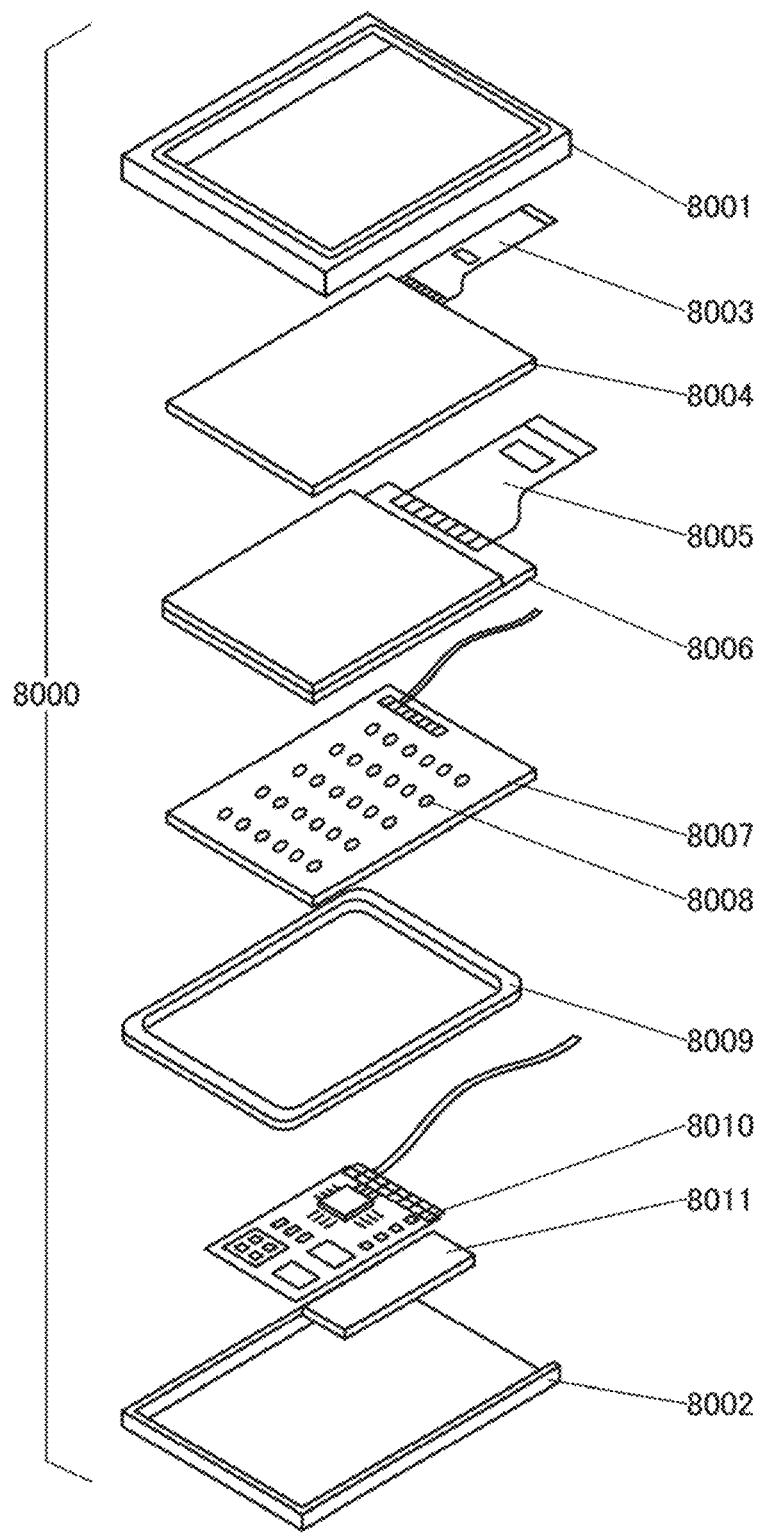
FIG. 68 is a view illustrating a display module.

In a display module 8000 illustrated in FIG. 68, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The oxide semiconductor film or the semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 68, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective display device or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<8-2. Electronic Device>

FIGS. 69A to 69G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 69A to 69G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 69A to 69G are not limited thereto, and the electronic devices can have a variety of functions. Although not illustrated in FIGS. 69A to 69G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 69A to 69G will be described in detail below.

Figure 69A:
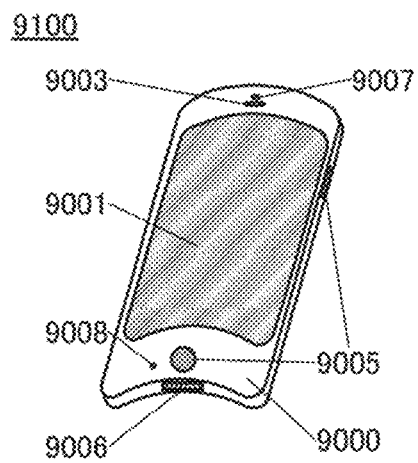
FIGS. 69A to 69G illustrate electronic devices.

FIG. 69A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 69D:
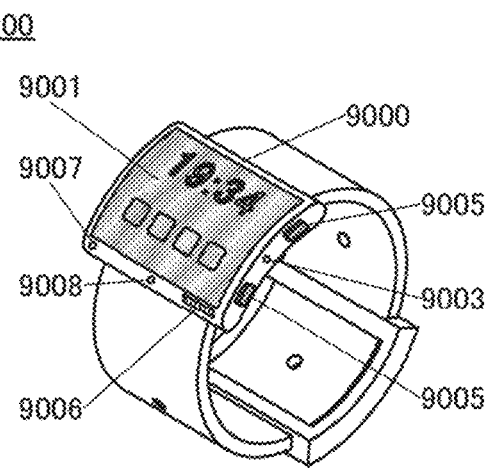
Figure 69B:
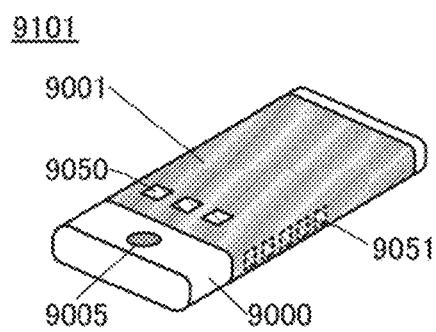

FIG. 69B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 69B, can be positioned in the portable information terminal 9101 as in the portable information terminal 9100 illustrated in FIG. 69A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, or the like; the title and sender of an e-mail, SNS message, or the like; the date; the time; remaining battery; the strength of an antenna; and the like. Instead of the information 9051, the operation buttons 9050 or the like may be displayed in the position where the information 9051 is displayed.

Figure 69E:
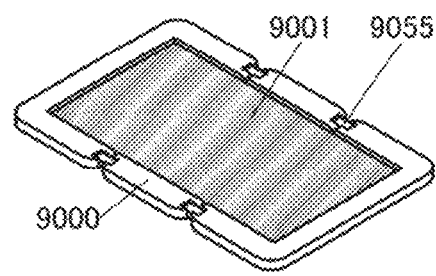
Figure 69C:
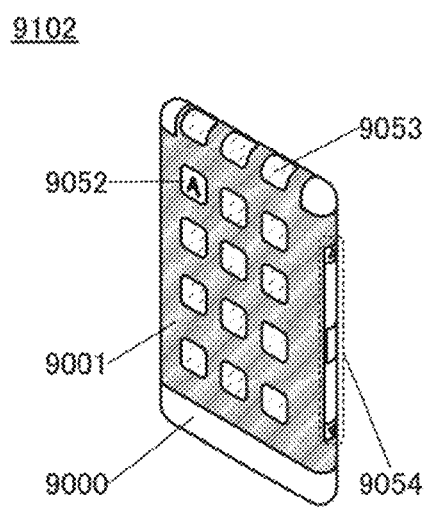

FIG. 69C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 69D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 69F:
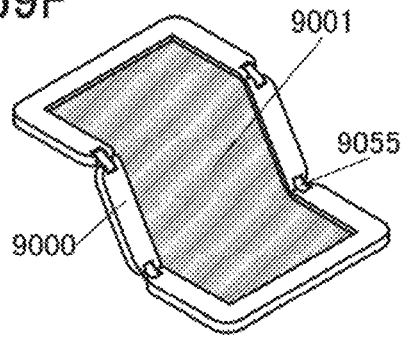
Figure 69G:
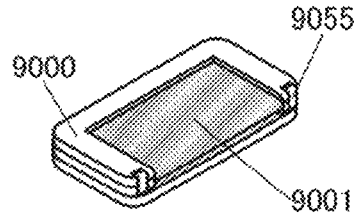

FIGS. 69E, 69F, and 69G are perspective views of a foldable portable information terminal 9201. FIG. 67E is a perspective view of the foldable portable information terminal 9201 that is opened. FIG. 69F is a perspective view of the foldable portable information terminal 9201 that is being opened or being folded. FIG. 69G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 70A:
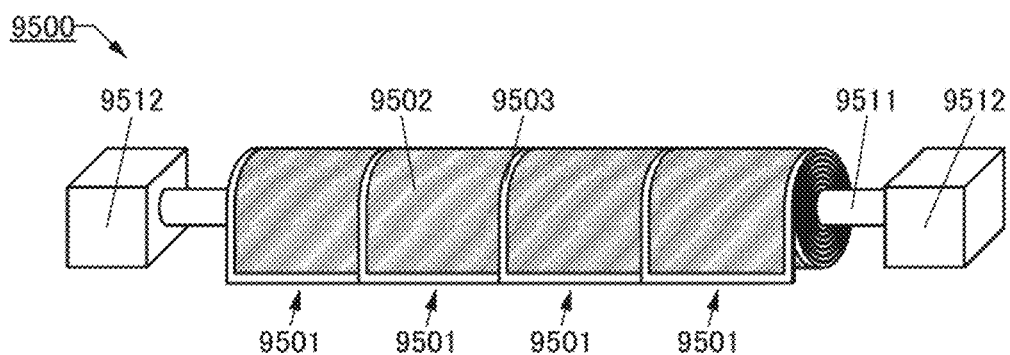
FIGS. 70A and 70B are perspective views showing a display device.
Figure 70B:
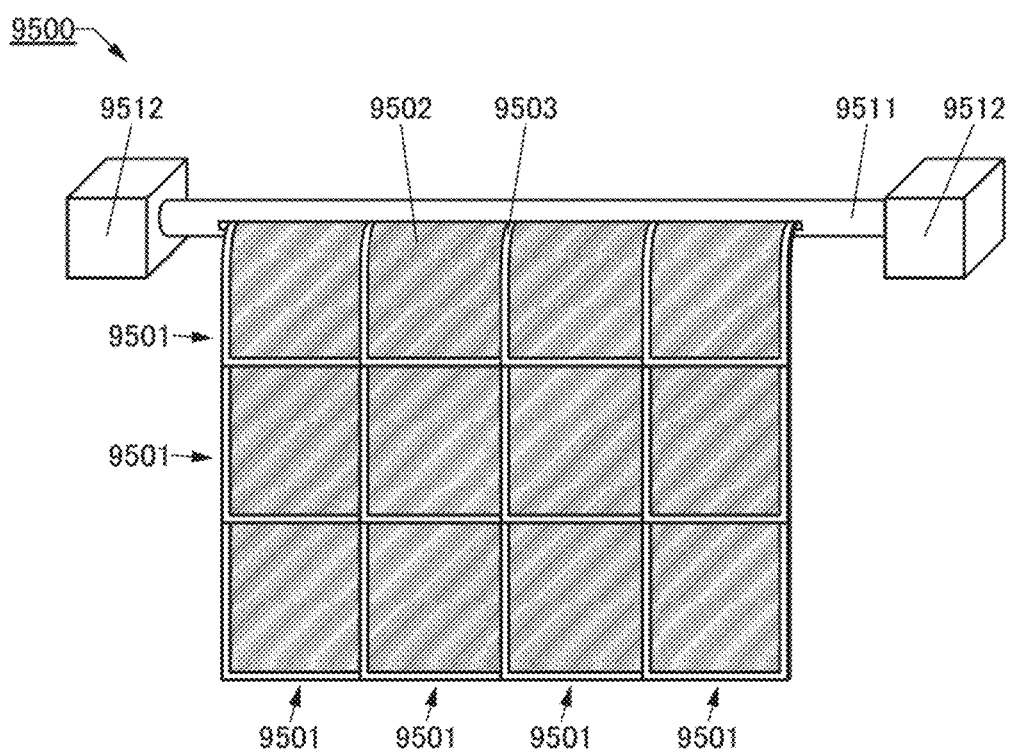

FIGS. 70A and 70B are perspective views of a display device including a plurality of display panels. Note that the plurality of display panels are wound in the perspective view in FIG. 70A, and are unwound in the perspective view in FIG. 70B.

A display device 9500 illustrated in FIGS. 70A and 70B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 70A and 70B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto, and a structure in which the display portion of the electronic device is not flexible and display is performed on a plane portion may be employed.

Note that the structure described in this embodiment can be used in appropriate combination with any of the structures described in the other embodiments.

Embodiment 9

In this embodiment, a deposition apparatus which can be used for manufacturing the display module of one embodiment of the present invention will be described with reference to FIG. 71.

FIG. 71 illustrates a deposition apparatus 3000 which can be used for manufacturing the display module of one embodiment of the present invention. Note that the deposition apparatus 3000 is an example of a batch-type ALD apparatus.

<9-1. Structural Example of Deposition Apparatus>

The deposition apparatus 3000 described in this embodiment includes a deposition chamber 3180 and a control portion 3182 connected to the deposition chamber 3180 (see FIG. 71).

The control portion 3182 includes a control unit (not illustrated) which supplies control signals and flow rate controllers 3182a, 3182b, and 3182c to which the control signals are supplied. For example, high-speed valves can be used as the flow rate controllers. Specifically, flow rates can be precisely controlled by using ALD valves or the like. The control portion 3182 also includes a heating mechanism 3182h which controls the temperatures of the flow rate controllers and pipes.

The flow rate controller 3182a is supplied with a control signal, a first source material, and an inert gas and has a function of supplying the first source material or the inert gas in accordance with the control signal.

The flow rate controller 3182b is supplied with a control signal, a second source material, and an inert gas and has a function of supplying the second source material or the inert gas in accordance with the control signal.

The flow rate controller 3182c is supplied with a control signal and has a function of connecting to an evacuation unit 3185 in accordance with the control signal.

[Source Material Supply Portion]

A source material supply portion 3181a has a function of supplying the first source material and is connected to the first flow rate controller 3182a.

A source material supply portion 3181b has a function of supplying the second source material and is connected to the second flow rate controller 3182b.

A vaporizer, a heating unit, or the like can be used as each of the source material supply portions. Thus, a gaseous source material can be generated from a solid or liquid source material.

Note that the number of source material supply portions is not limited to two and may be three or more.

[Source Material]

Any of a variety of substances can be used as the first source material. For example, a volatile organometallic compound, a metal alkoxide, or the like can be used as the first source material. Any of a variety of substances which react with the first source material can be used as the second source material. For example, a substance which contributes to an oxidation reaction, a substance which contributes to a reduction reaction, a substance which contributes to an addition reaction, a substance which contributes to a decomposition reaction, a substance which contributes to a hydrolysis reaction, or the like can be used as the second source material.

Furthermore, a radical or the like can be used. For example, plasma obtained by supplying a source material to a plasma source or the like can be used. Specifically, an oxygen radical, a nitrogen radical, or the like can be used.

The second source material combined with the first source material is preferably a source material which reacts at a temperature close to room temperature. For example, a source material which reacts at a temperature higher than or equal to room temperature and lower than or equal to 200° C., preferably higher than or equal to 50° C. and lower than or equal to 150° C., is preferable.

[Evacuation Unit]

The evacuation unit 3185 has an evacuating function and is connected to the third flow rate controller 3182c. Note that a trap for capturing the source material to be evacuated may be provided between an outlet port 3184 and the third flow rate controller 3182c. The evacuated gas is removed by using a removal unit.

[Control Portion]

The control portion 3182 supplies the control signal which controls the flow rate controllers, a control signal which controls the heating mechanism, or the like. For example, in a first step, the first source material is supplied to a surface of a process member. Then, in a second step, the second source material which reacts with the first source material is supplied. Accordingly, a reaction product of the first source material and the second source material can be deposited onto a surface of a process member 3010.

Note that the amount of the reaction product to be deposited onto the surface of the process member 3010 can be controlled by repetition of the first step and the second step.

Note that the amount of the first source material to be supplied to the process member 3010 is limited by the maximum possible amount of adsorption on the surface of the process member 3010. For example, conditions are selected so that a monomolecular layer of the first source material is formed on the surface of the process member 3010, and the formed monomolecular layer of the first source material is reacted with the second source material, whereby a significantly uniform layer containing the reaction product of the first source material and the second source material can be formed.

Accordingly, a variety of materials can be deposited on a surface of the process member 3010 even when the surface has a complicated structure. For example, a film having a thickness greater than or equal to 3 nm and less than or equal to 200 nm can be formed on the process member 3010.

In the case where, for example, a small hole called a pinhole or the like is formed in the surface of the process member 3010, the pinhole can be filled by depositing a material into the pinhole.

The remainder of the first source material or the second source material is evacuated from the deposition chamber 3180 with use of the evacuation unit 3185. For example, the evacuation may be performed while an inert gas such as argon or nitrogen is introduced.

[Deposition Chamber]

The deposition chamber 3180 includes an inlet port 3183 from which the first source material, the second source material, and the inert gas are supplied and the outlet port 3184 from which the first source material, the second source material, and the inert gas are evacuated.

The deposition chamber 3180 includes a support portion 3186 which has a function of supporting one or a plurality of process members 3010, a heating mechanism 3187 which has a function of heating the one or plurality of process members 3010, and a door 3188 which has a function of opening or closing to load and unload the one or plurality of process members 3010.

For example, a resistive heater, an infrared lamp, or the like can be used as the heating mechanism 3187. The heating mechanism 3187 has a function of heating up, for example, to 80° C. or higher, 100° C. or higher, or 150° C. or higher. The heating mechanism 3187 heats the one or plurality of process members 3010 to a temperature higher than or equal to room temperature and lower than or equal to 200° C., preferably higher than or equal to 50° C. and lower than or equal to 150° C.

The deposition chamber 3180 may also include a pressure regulator and a pressure detector.

[Support Portion]

The support portion 3186 supports the one or plurality of process members 3010. Accordingly, an insulating film, for example, can be formed over the one or plurality of process members 3010 in each treatment.

<9-2. Example of Film>

An example of a film which can be formed with the deposition apparatus 3000 described in this embodiment will be described.

For example, a film including an oxide, a nitride, a fluoride, a sulfide, a ternary compound, a metal, or a polymer can be formed.

For example, the film can be formed with a material including aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like.

For example, the film can be formed with a material including aluminum nitride, hafnium nitride, silicon nitride, tantalum nitride, titanium nitride, niobium nitride, molybdenum nitride, zirconium nitride, gallium nitride, or the like.

For example, the film can be formed with a material including copper, platinum, ruthenium, tungsten, iridium, palladium, iron, cobalt, nickel, or the like.

For example, the film can be formed with a material including zinc sulfide, strontium sulfide, calcium sulfide, lead sulfide, calcium fluoride, strontium fluoride, zinc fluoride, or the like.

For example, the film can be formed with a material which includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

Note that this embodiment can be combined with any of the other embodiments in this specification as appropriate.

[Example]

In this example, a transistor corresponding to the transistor 150B shown in FIGS. 21C and 21D was manufactured, and the drain current-gate voltage characteristics ($I_d$-$V_g$ characteristics) of the transistor were evaluated and reliability tests were performed on the transistor. Samples D1 to D3, Samples E1 to E3, Samples F1 to F3, and Samples G1 to G3 described below was manufactured for the evaluation in this example. Each of Samples D1, E1, F1, and G1 uses a transistor having a channel length L of 2 μm and a channel width W of 50 μm. Each of Samples D2, E2, F2, and G2 uses a transistor having a channel length L of 3 μm and a channel width W of 50 μm. Each of Samples D3, E3, F3, and G3 uses a transistor having a channel length L of 6 μm and a channel width W of 50 μm. In each of Samples D1 to D3, Samples E1 to E3, Samples F1 to F3, and Samples G1 to G3, the transistors were fabricated 10 for each kind.

Samples D1 to D3 and Samples E1 to E3 are samples for comparison, which do not include the oxide semiconductor films 120a and 120b. Samples F1 to F3 and Samples G1 to G3 are samples of one embodiment of the present invention, which each include the oxide semiconductor films 120a and 120b. That is, Samples D1 to D3 and Samples E1 to E3 have a single-gate transistor structure, and Samples F1 to F3 and Samples G1 to G3 have a dual-gate transistor structure.

The samples formed in this example are described below. Note that the reference numerals used for the transistor 150B in FIGS. 21C and 21D are used in the following description.

<1-1. Manufacturing Method of Samples D1 to D3>

Samples D1 to D3 were manufactured by the same manufacturing method and were different from each other in the channel length L of the transistor. First, the conductive film 104 was formed over the substrate 102. As the substrate 102, a glass substrate was used. Furthermore, as the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

The insulating film 106 was deposited as follows. First, a 50-nm-thick silicon nitride film was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus. Then, the flow rate of an ammonia gas was changed to 2000 sccm to deposit a 300-nm-thick silicon nitride film. Finally, the flow rate of an ammonia gas was changed to 100 sccm to deposit a 50-nm-thick silicon nitride film.

The insulating film 107 was deposited under the conditions where the substrate temperature was 350° C., a silane gas at a flow rate of 20 sccm and a dinitrogen monoxide gas at a flow rate of 3000 sccm were introduced into a chamber, the pressure was 40 Pa, and an RF power of 100 W was supplied between parallel-plate electrodes provided in a PECVD apparatus.

Then, the oxide semiconductor film 108 was formed over the insulating film 107. As the oxide semiconductor film 108, the oxide semiconductor film 108b and the oxide semiconductor film 108c were successively formed in a vacuum with a sputtering apparatus.

As the oxide semiconductor film 108b, a 10-nm-thick IGZO film was formed under the conditions where the substrate temperature was 170° C., an argon gas at a flow rate of 140 sccm and an oxygen gas at a flow rate of 60 sccm were introduced into a chamber, the pressure was 0.6 Pa, and an AC power of 2500 W was applied to a polycrystalline metal oxide sputtering target (having an atomic ratio of In:Ga:Zn=4:2:4.1).

As the oxide semiconductor film 108c, a 15-nm-thick IGZO film was formed under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Next, the conductive films 112a and 112b were formed over the insulating film 107 and the oxide semiconductor film 108. As the conductive films 112a and 112b, a 50-nm-thick tungsten film, a 400-nm-thick aluminum film, and a 100-nm-thick titanium film were successively formed in vacuum with a sputtering apparatus.

Next, a surface of the oxide semiconductor film 108 (on the back-channel side) was cleaned. As the cleaning method, a phosphoric acid solution obtained by diluting phosphoric acid (concentration of 85 vol %) 100 times with water was applied to the oxide semiconductor film 108 and the conductive films 112a and 112b with a spin cleaning apparatus. Note that the cleaning was performed for 15 seconds.

After that, the insulating film 114 and the insulating film 116 were formed over the insulating film 107, the oxide semiconductor film 108, and the conductive films 112a and 112b. As the insulating film 114, a 50-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in vacuum with a PECVD apparatus.

The insulating film 114 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, first heat treatment was performed. The first heat treatment was performed at 350° C. for 1 hour in a nitrogen gas atmosphere.

Then, a 5-nm-thick ITSO film was formed over the insulating film 116 with a sputtering apparatus. The ITSO film was formed under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in a sputtering apparatus.

Then, oxygen addition treatment was performed on the oxide semiconductor film 108 and the insulating films 114 and 116 through the ITSO film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias would be applied to the substrate side.

Then, the ITSO film was removed to expose the insulating film 116. The ITSO film was removed using a wet-etching apparatus in such a manner that etching was performed using an oxalic acid solution at a concentration of 5% for 300 seconds and then etching was performed using hydrofluoric acid at a concentration of 0.5% for 15 seconds.

Next, the insulating film 118 was formed over the insulating film 116. As the insulating film 118, a 100-nm-thick silicon nitride film was formed with a PECVD apparatus. The insulating film 118 was formed under the conditions where the substrate temperature was 350° C., a silane gas at a flow rate of 50 sccm, a nitrogen gas at a flow rate of 5000 sccm, and an ammonia gas at a flow rate of 100 sccm were introduced into a chamber, the pressure was 100 Pa, and high-frequency power of 1000 W was supplied between parallel-plate electrodes provided in a PECVD apparatus with the use of a 27.12 MHz high-frequency power source.

Next, the opening 152a to the conductive film 112b and the openings 152b and 152c to the conductive film 104 were formed. The openings 152a, 152b, and 152c were formed with a dry etching apparatus.

Then, second heat treatment was performed. The second heat treatment was performed at 250° C. for 1 hour under a nitrogen atmosphere.

Through the above process, Samples D1 to D3 of this example were fabricated.

<1-2. Manufacturing Method of Samples E1 to E3>

Samples E1 to E3 were manufactured by the same manufacturing method and were different from each other in the channel length L of the transistor. The manufacturing method of Samples E1 to E3 is different from that of Samples D1 to D3 in the following step.

In Samples E1 to E3, the surface of the oxide semiconductor film 108 (on the back-channel side) was not cleaned after the formation of the conductive films 112a and 112b.

Except the above-described step, Samples E1 to E3 were manufactured by the method similar to the method for manufacturing Samples D1 to D3.

<1-3. Manufacturing Method of Samples F1 to F3>

Samples F1 to F3 were manufactured by the same manufacturing method and were different from each other in the channel length L of the transistor. The manufacturing method of Samples F1 to F3 is different from that of Samples D1 to D3 in the following step.

After the openings 152a, 152b, and 152c were formed, an oxide semiconductor film was formed over the insulating film 118 to cover the openings 152a, 152b, and 152c, and processed to form the oxide semiconductor films 120a and 120b. As the oxide semiconductor films 120a and 120b, a 100-nm-thick ITSO film was formed with a sputtering apparatus. The composition of a target used for forming the ITSO film was the same as that used for forming the ITSO film described above.

Except the above-described step, Samples F1 to F3 were manufactured by the method similar to the method for manufacturing Samples D1 to D3.

<1-4. Manufacturing Method of Samples G1 to G3>

Samples G1 to G3 were manufactured by the same manufacturing method and were different from each other in the channel length L of the transistor. The manufacturing method of Samples G1 to G3 is different from that of Samples F1 to F3 in the following step.

In Samples G1 to G3, the surface of the oxide semiconductor film 108 (on the back-channel side) was not cleaned after the formation of the conductive films 112a and 112b.

Except the above-described step, Samples G1 to G3 were manufactured by the method similar to the method for manufacturing Samples F1 to F3.

<1-5. $I_d$-$V_g$ Characteristics>

Next, the $I_d$-$V_g$ characteristics of Samples D1 to D3, Samples E1 to E3, Samples F1 to F3, and Samples G1 to G3 were measured. In measuring the $I_d$-$V_g$ characteristics, a voltage ($V_g$, $V_{bg}$) applied to the conductive film 104 and the oxide semiconductor film 120b that respectively function as the first gate electrode and the second gate electrode of the transistor 150B was changed from −15 V to +20 V in increments of 0.25 V. A voltage ($V_s$) applied to the conductive film 112a functioning as a source electrode was 0 V (comm), and a voltage ($V_d$) applied to the conductive film 112b functioning as a drain electrode was 0.1 V and 20 V.

Figure 72A:
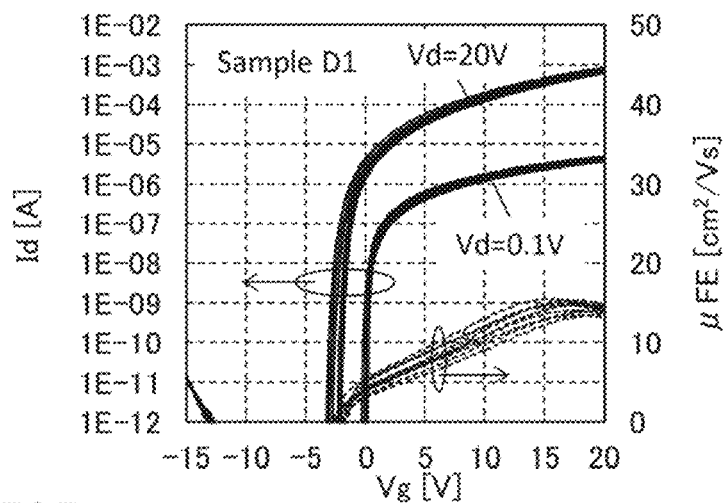
FIGS. 72A to 72C each illustrate $I_d$-$V_g$ characteristics of a transistor.
Figure 72B:
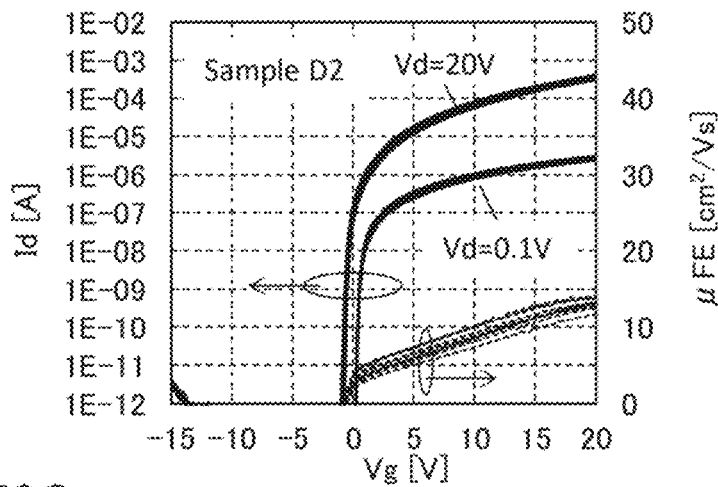
Figure 72C:
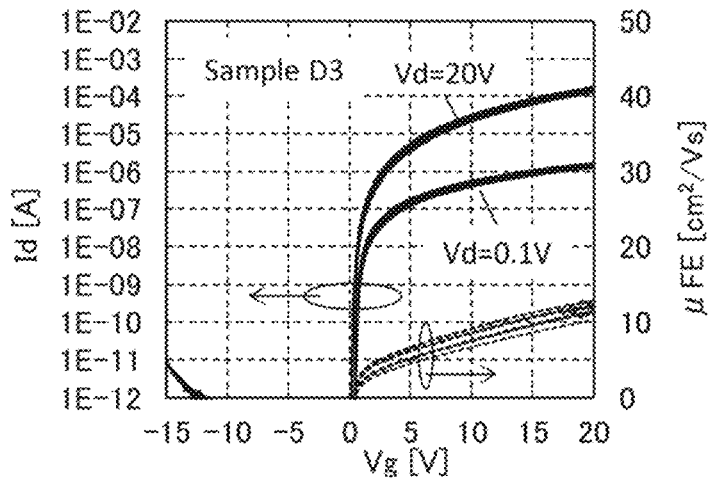
Figure 73A:
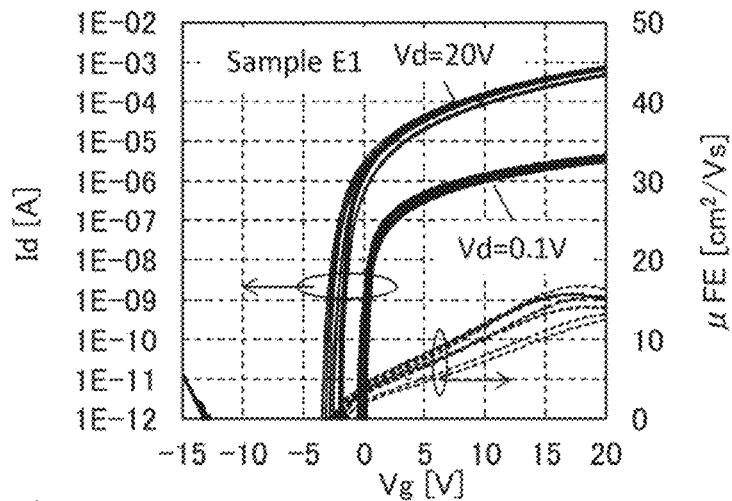
FIGS. 73A to 73C each illustrate $I_d$-$V_g$ characteristics of a transistor.
Figure 73B:
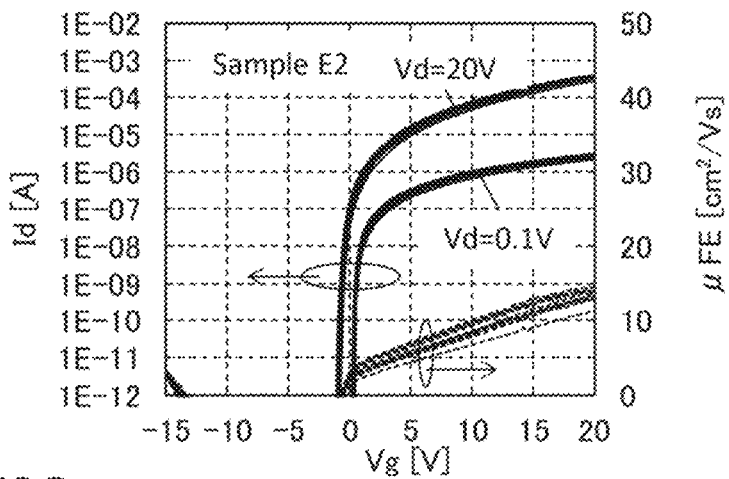
Figure 73C:
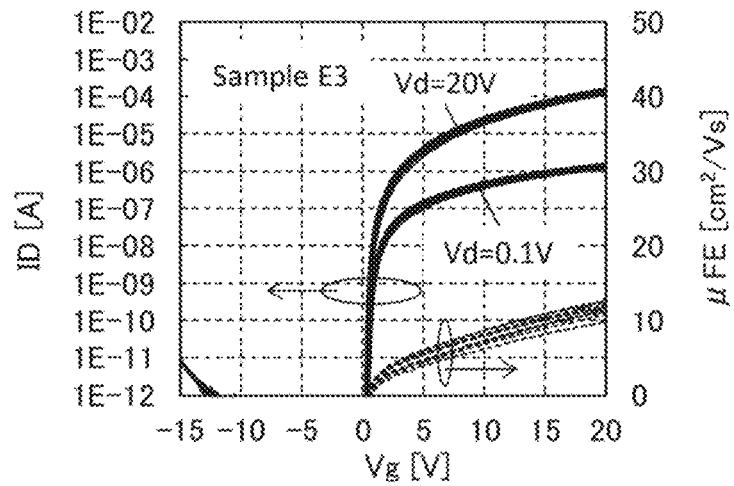
Figure 74A:
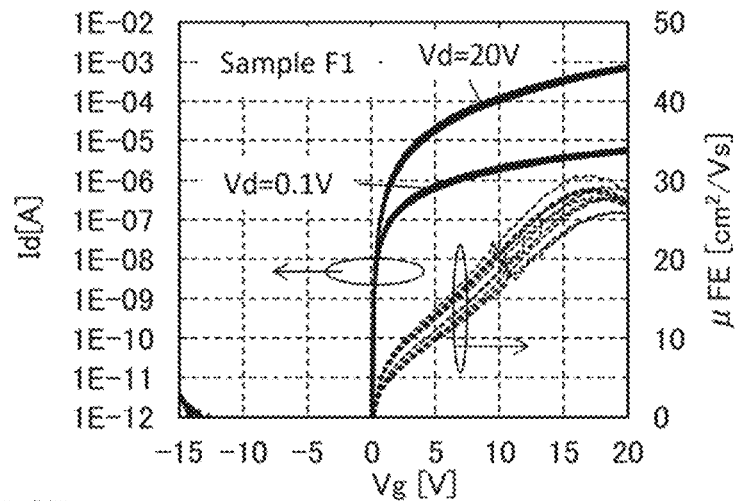
FIGS. 74A to 74C each illustrate $I_d$-$V_g$ characteristics of a transistor.
Figure 74B:
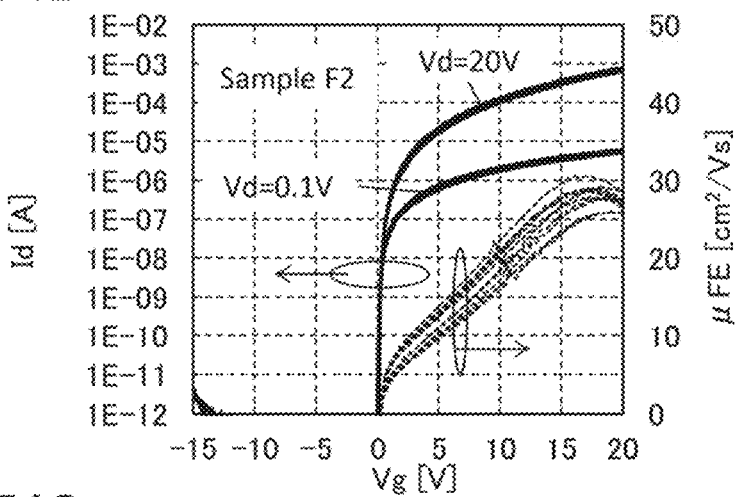
Figure 74C:
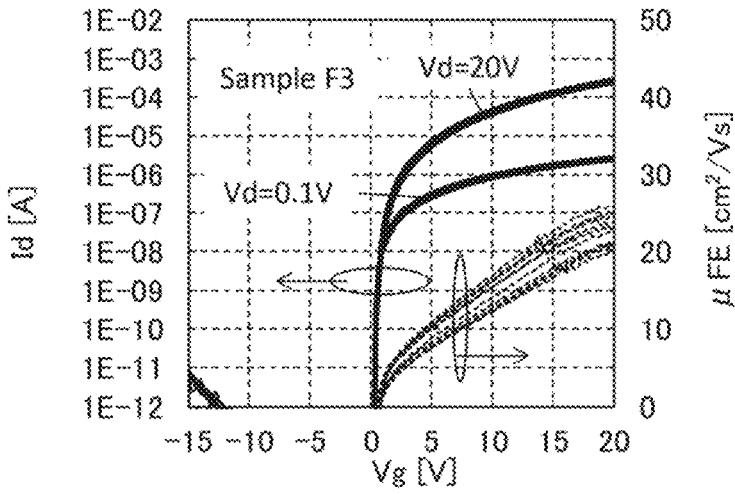
Figure 75A:
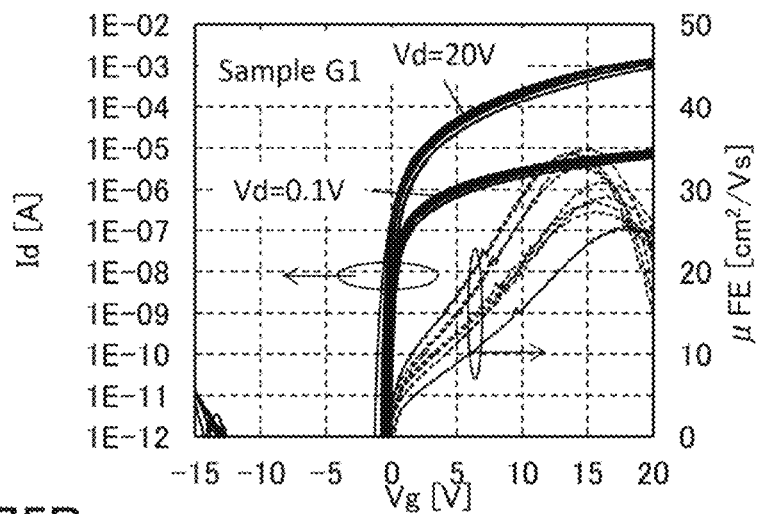
FIGS. 75A to 75C each illustrate $I_d$-$V_g$ characteristics of a transistor.
Figure 75B:
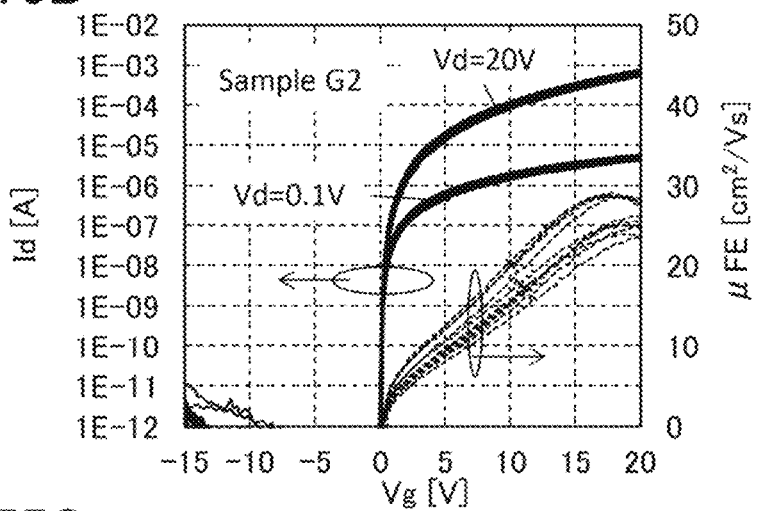
Figure 75C:
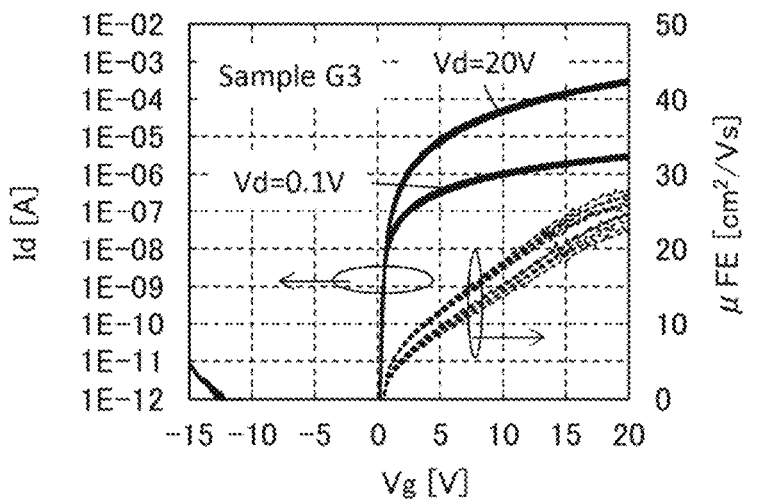

FIG. 72A, FIG. 72B, and FIG. 72C show the $I_d$-$V_g$ characteristics of Sample D1, Sample D2, and Sample D3, respectively. FIG. 73A, FIG. 73B, and FIG. 73C show the $I_d$-$V_g$ characteristics of Sample E1, Sample E2, and Sample E3, respectively. FIG. 74A, FIG. 74B, and FIG. 74C show the $I_d$-$V_g$ characteristics of Sample F1, Sample F2, and Sample F3, respectively. FIG. 75A, FIG. 75B, and FIG. 75C show the $I_d$-$V_g$ characteristics of Sample G1, Sample G2, and Sample G3, respectively.

The results in FIGS. 72A to 72C, FIGS. 73A to 73C, FIGS. 74A to 74C, and FIGS. 75A to 75C show that Samples F1 to F3 and Samples G1 to G3 of one embodiment of the present invention are transistors exhibiting smaller variations in electrical characteristics than Samples D1 to D3 and Samples E1 to E3 for comparison. In particular, the transistors with a channel length L of 2 μm exhibit considerably small variations. Furthermore, no significant difference is observed between the sample with the back-channel portion subjected to cleaning and the sample with the back-channel portion not subjected to cleaning, as shown in FIGS. 72A to 72C, FIGS. 73A to 73C, FIGS. 74A to 74C, and FIGS. 75A to 75C.

<1-6. Bias-Temperature Stress Test (GBT Test)>

Next, the reliability of Samples D3, E3, F3, and G3 was evaluated. As the reliability evaluation, GBT tests were used.

The GBT tests in this example were performed under the conditions where the gate voltage ($V_g$) was ±30 V; the drain voltage ($V_d$) and the source voltage ($V_s$) were 0 V (COMMON); the stress temperature was 60° C.; the time for stress application was 1 hour; and two kinds of measurement environments, a dark environment and a photo environment (irradiation with light having approximately 10000 1x with a white LED), were employed. In other words, the source electrode and the drain electrode of the transistor were set at the same potential, and a potential different from that of the source and drain electrodes was applied to the gate electrode for a certain time (1 hour, here).

A case where the potential applied to the gate electrode is higher than that of the source and drain electrodes is called positive stress, and a case where the potential applied to the gate electrode is lower than that of the source and drain electrodes is called negative stress. Thus, the reliability evaluation was performed under four conditions in total, i.e., positive GBT (Dark), negative GBT (Dark), positive GBT (Light irradiation), and negative GBT (Light irradiation).

Note that positive GBT (Dark) can be referred to as PBTS (Positive Bias Temperature Stress), negative GBT (Dark) as NBTS (Negative Bias Temperature Stress), positive GBT (Light irradiation) as PBITS (Positive Bias Illuminations Temperature Stress), negative GBT (Light irradiation) as NBITS (Negative Bias Illuminations Temperature Stress).

Figure 76:
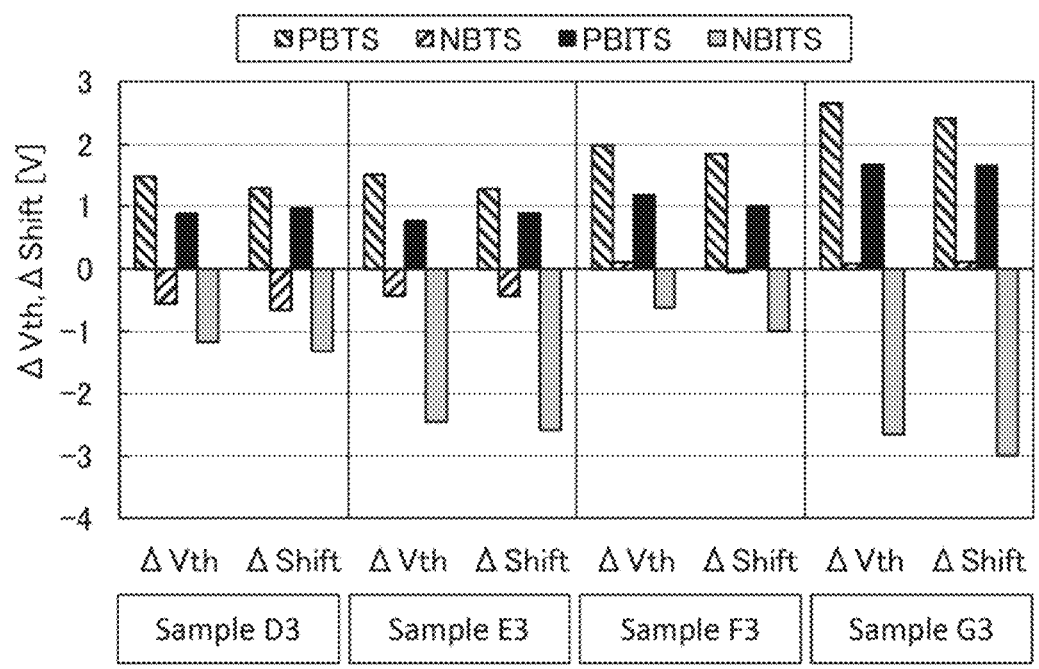
FIG. 76 illustrates GBT test results of transistors.

FIG. 76 shows GBT test results of Samples D3, E3, F3, and G3. The vertical axis in FIG. 76 indicates the amount of the change in threshold voltage (ΔVth) of the transistor and the amount of the change in shift value (ΔShift). The horizontal axis in FIG. 76 indicates the name of samples, process conditions, and the like. Note that the shift value means, in the drain current ($I_d$)-gate voltage ($V_g$) characteristics of the transistor, the gate voltage ($V_g$) at a point of intersection of an axis of $1 \times 10^{-12}$ A and a tangent line of the logarithm of a drain current ($I_d$) having the highest gradient. ΔShift means the amount of the change in shift value.

From the results in FIG. 76, the amount of change in threshold voltage (ΔVth) and the amount of change in shift value (ΔShift) were within ±4 V in GBT tests for Samples F3 and G3 of one embodiment of the present invention. In addition, when Samples D3 and E3 are compared, the amounts of the changes of the transistor of Sample D3 due to the GBT tests are smaller than those of Sample E3. When Samples F3 and G3 are compared, the amounts of the changes of the transistor of Sample F3 due to the GBT tests are smaller than those of Sample G3. That is, cleaning of the back-channel side of the oxide semiconductor film 108 reduces the amounts of the changes of the transistor due to the GBT tests.

Note that the structure described in this example can be combined with any of the structures described in the other embodiments as appropriate.

This application is based on Japanese Patent Application serial no. 2015-052912 filed with Japan Patent Office on Mar. 17, 2015 and Japanese Patent Application serial no. 2015-065103 filed with Japan Patent Office on Mar. 26, 2015, the entire contents of which are hereby incorporated by reference.

What is claimed is:
1. A semiconductor device comprising:
a transistor including:
   a first gate electrode;
   a first insulating film over the first gate electrode;
   a first oxide semiconductor film over the first insulating film;
   a source electrode electrically connected to the first oxide semiconductor film;
   a drain electrode electrically connected to the first oxide semiconductor film;
   a second insulating film over the first oxide semiconductor film;
   a second oxide semiconductor film as a second gate electrode over the second insulating film; and
   a third insulating film over the second oxide semiconductor film,
   wherein the second insulating film includes an excess oxygen region having a concentration gradient.
2. The semiconductor device according to claim 1, wherein the third insulating film includes one of or both nitrogen and hydrogen.
3. The semiconductor device according to claim 1, wherein the first oxide semiconductor film includes In, M and Zn, and
wherein M is Al, Ga, Y, or Sn.

4. The semiconductor device according to claim 1,
wherein the second oxide semiconductor film includes In and M, and
wherein M is Al, Ga, Y, or Sn.

5. The semiconductor device according to claim 1,
wherein the first oxide semiconductor film has a multi-layer structure.

6. The semiconductor device according to claim 1,
wherein the first oxide semiconductor film includes a crystal part, and
wherein the crystal part has c-axis alignment.

7. The semiconductor device according to claim 1,
wherein the first gate electrode and the second gate electrode are electrically connected to each other.

8. A display device comprising:
the semiconductor device according to claim 1; and
a display element.

9. A display module comprising:
the display device according to claim 8; and
a touch sensor.

10. An electronic device comprising:
the semiconductor device according to claim 1;
at least one of the display device according to claim 8 and the display module according to claim 9; and
at least one of an operation key and a battery.

11. A semiconductor device comprising:
a transistor including:
  a first gate electrode;
  a first insulating film over the first gate electrode;
  a first oxide semiconductor film over the first insulating film;
  a source electrode electrically connected to the first oxide semiconductor film;
  a drain electrode electrically connected to the first oxide semiconductor film;
  a second insulating film over the first oxide semiconductor film;
  a second oxide semiconductor film as a second gate electrode over the second insulating film; and
  a third insulating film over the second oxide semiconductor film,
wherein the second insulating film includes an excess oxygen region having a concentration gradient, and
wherein the excess oxygen region has a region in which an oxygen concentration increases toward an upper surface of the second insulating film.

12. The semiconductor device according to claim 11,
wherein the third insulating film includes one of or both nitrogen and hydrogen.

13. The semiconductor device according to claim 11,
wherein the first oxide semiconductor film includes In, M and Zn, and
wherein M is Al, Ga, Y, or Sn.

14. The semiconductor device according to claim 11,
wherein the second oxide semiconductor film includes In and M, and
wherein M is Al, Ga, Y, or Sn.

15. The semiconductor device according to claim 11,
wherein the first oxide semiconductor film has a multi-layer structure.

16. The semiconductor device according to claim 11,
wherein the first oxide semiconductor film includes a crystal part, and
wherein the crystal part has c-axis alignment.

17. The semiconductor device according to claim 11,
wherein the first gate electrode and the second gate electrode are electrically connected to each other.

18. A display device comprising:
the semiconductor device according to claim 11; and
a display element.

19. A display module comprising:
the display device according to claim 18; and
a touch sensor.

20. An electronic device comprising:
the semiconductor device according to claim 11;
at least one of the display device according to claim 18 and the display module according to claim 19; and
at least one of an operation key and a battery.

* * * * *